United States Patent [19]
Shirani et al.

[11] Patent Number: 6,148,025
[45] Date of Patent: Nov. 14, 2000

[54] SYSTEM AND METHOD FOR COMPENSATING FOR BASELINE WANDER

[75] Inventors: Ramin Shirani, Morgan Hill; Saied Benyamin; Michael A. Brown, both of San Jose, all of Calif.

[73] Assignee: Lucent Technologies, Inc., Murray Hill, N.J.

[21] Appl. No.: 09/062,342

[22] Filed: Apr. 17, 1998

[51] Int. Cl.[7] ................................................. H03K 7/08
[52] U.S. Cl. ...................... 375/238; 375/232; 375/317; 327/307
[58] Field of Search ................................ 375/238, 317, 375/232, 229; 327/307

[56] References Cited

U.S. PATENT DOCUMENTS

| | | | |
|---|---|---|---|
| 3,641,444 | 2/1972 | Watts | 328/127 |
| 3,660,769 | 5/1972 | Jordan et al. | 328/127 |
| 3,714,591 | 1/1973 | Allington | 328/162 |
| 3,754,232 | 8/1973 | Gut et al. | 340/347 |
| 3,800,236 | 3/1974 | Riethmuller et al. | 328/162 |
| 3,824,481 | 7/1974 | Sponholz et al. | 328/162 |
| 3,838,448 | 9/1974 | Garde et al. | 360/45 |
| 4,229,703 | 10/1980 | Bustin | 328/162 |
| 4,237,424 | 12/1980 | Weiner | 328/175 |
| 4,458,322 | 7/1984 | Veale | 364/571 |
| 4,553,102 | 11/1985 | Yoshida | 329/133 |
| 4,625,320 | 11/1986 | Butcher | 375/70 |
| 4,641,324 | 2/1987 | Karsh et al. | 3765/70 |
| 4,896,285 | 1/1990 | Ishikawa et al. | 364/724.01 |
| 5,269,313 | 12/1993 | DePinto | 128/696 |
| 5,318,036 | 6/1994 | Arand et al. | 128/696 |
| 5,337,025 | 8/1994 | Polhemus | 333/28 |
| 5,357,969 | 10/1994 | Herleikson | 128/696 |
| 5,433,208 | 7/1995 | Lundstrom et al. | 128/696 |
| 5,465,272 | 11/1995 | Smith | 375/295 |
| 5,585,756 | 12/1996 | Wang | 327/341 |
| 5,880,615 | 3/1999 | Bazes | 327/307 |
| 5,991,339 | 11/1999 | Bazes et al. | 375/232 |
| 6,043,766 | 3/2000 | Hee et al. | 341/94 |
| 6,044,489 | 3/2000 | Hee et al. | 714/815 |

OTHER PUBLICATIONS

ComCore Semiconductor, "Frequently Asked Questions: ComCore's Fast Ethernet Technology," pp. 1–12, Feb. 24, 1998, http://www.comcore.com/products/FAQ_fast_ethernet.htm#Baseline Wander.

Drobman, Jeff, "ComCore Semiconductor FAQ (Frequently Asked Questions) about ComCore's Fast Ethernet Technology," p. 1–6, Sep. 1997, ComCore Semiconductor FAQ–100.

*Primary Examiner*—Stephen Chin
*Assistant Examiner*—Mohammad Ghayour
*Attorney, Agent, or Firm*—Patrick T. King

[57] ABSTRACT

An improved invention providing a solution to a problem endemic to conventional adaptive equalizer systems, a problem known as baseline wander. The invention brings the baseline back down when it has drifted up due to baseline wander. The invention brings the baseline back up when it has drifted down due to baseline wander. The end result is that the invention keeps the data centered about the common mode, thus helping to ensure that the data is equalized properly without distortion.

3 Claims, 29 Drawing Sheets

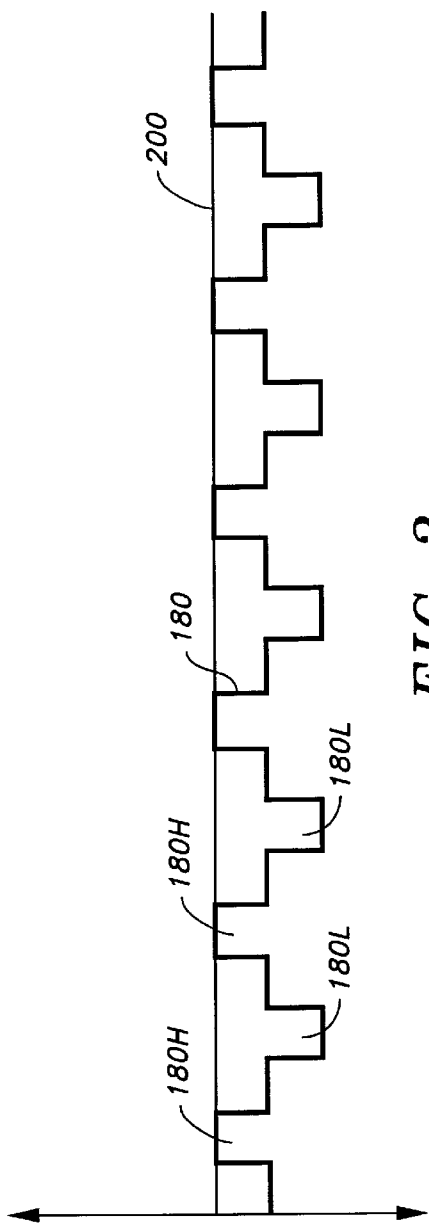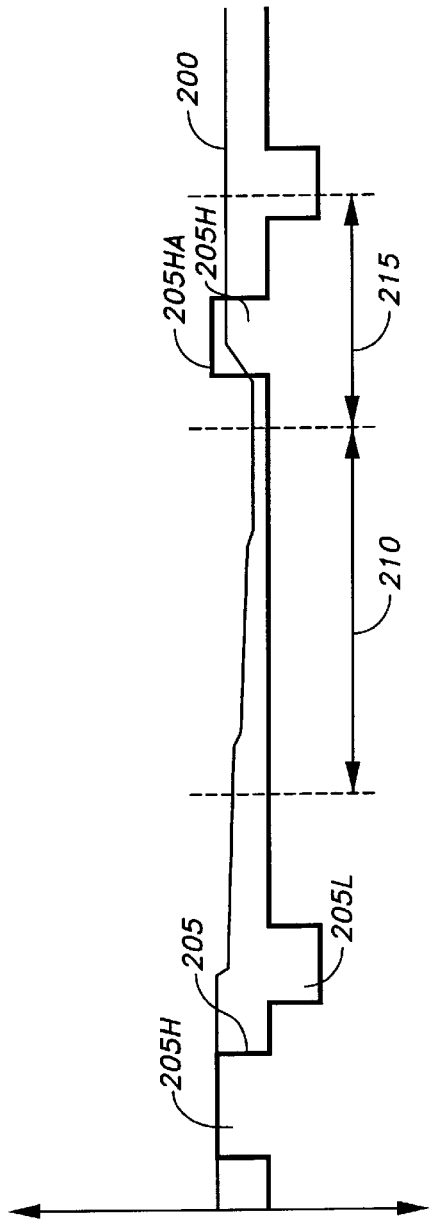

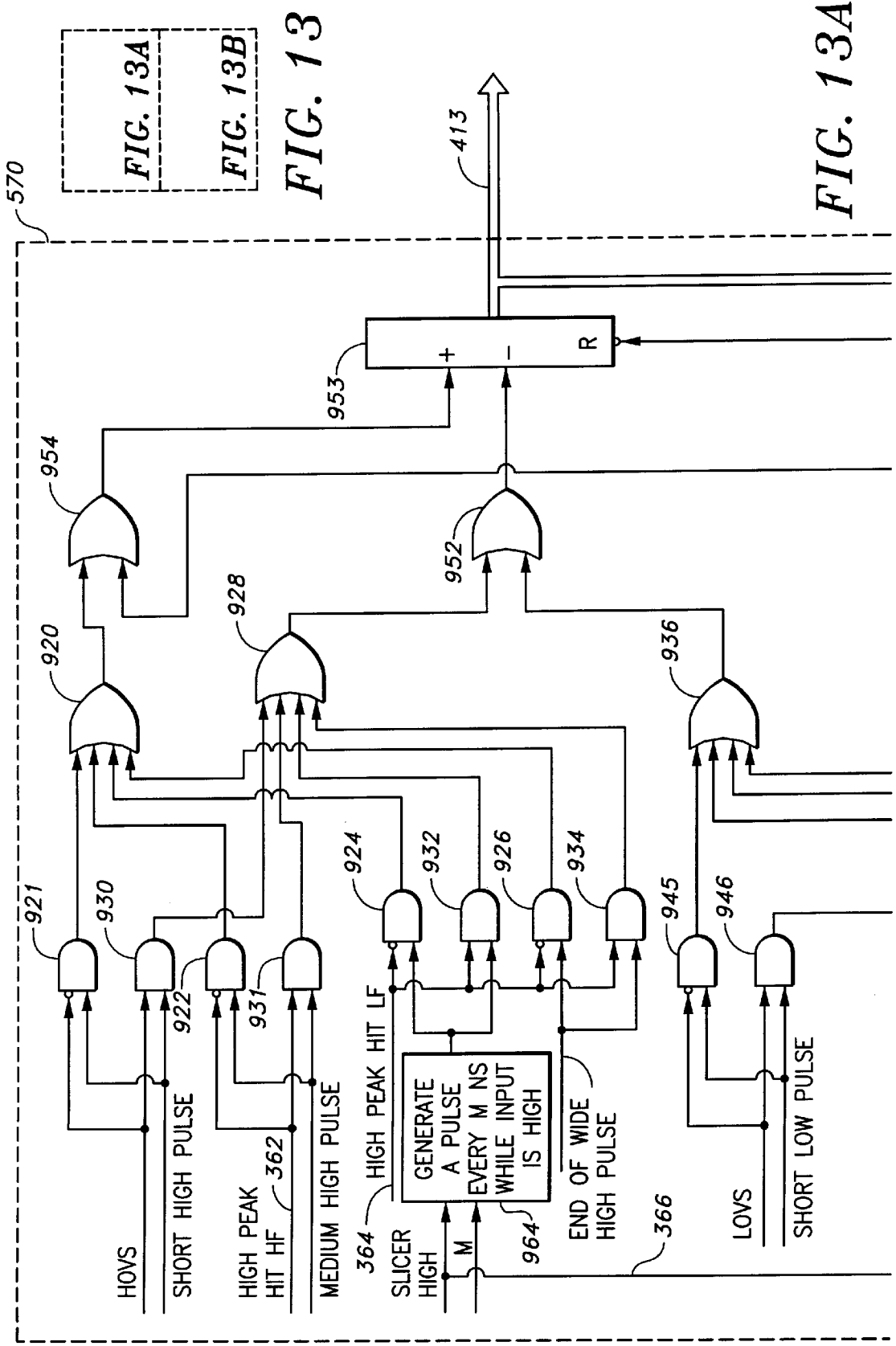

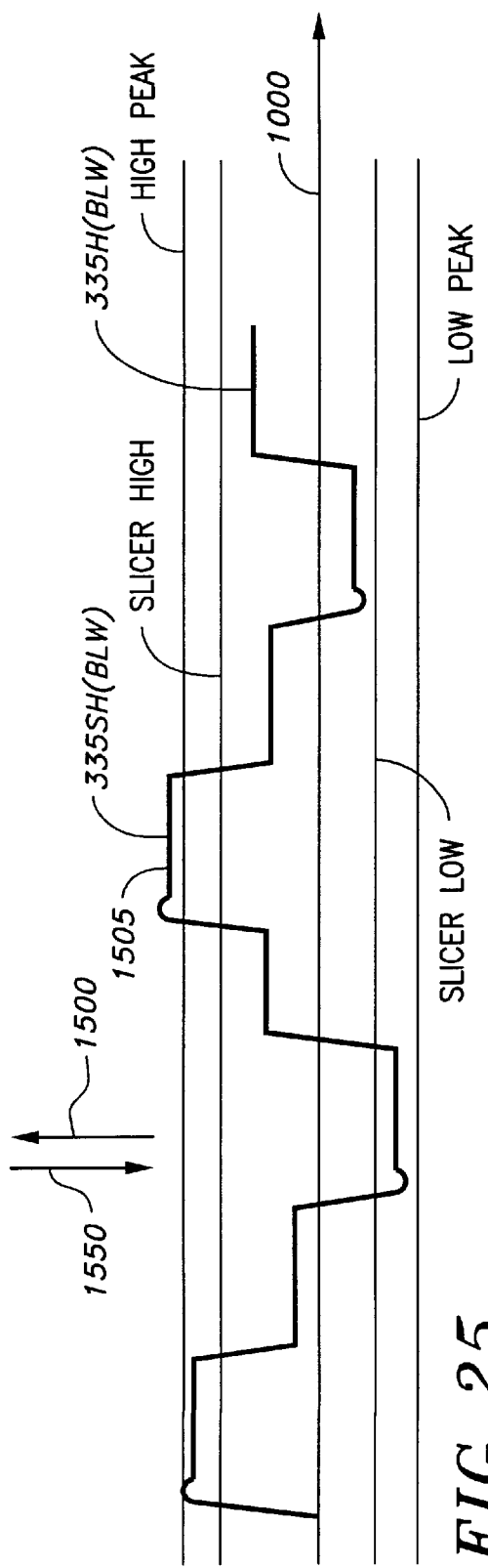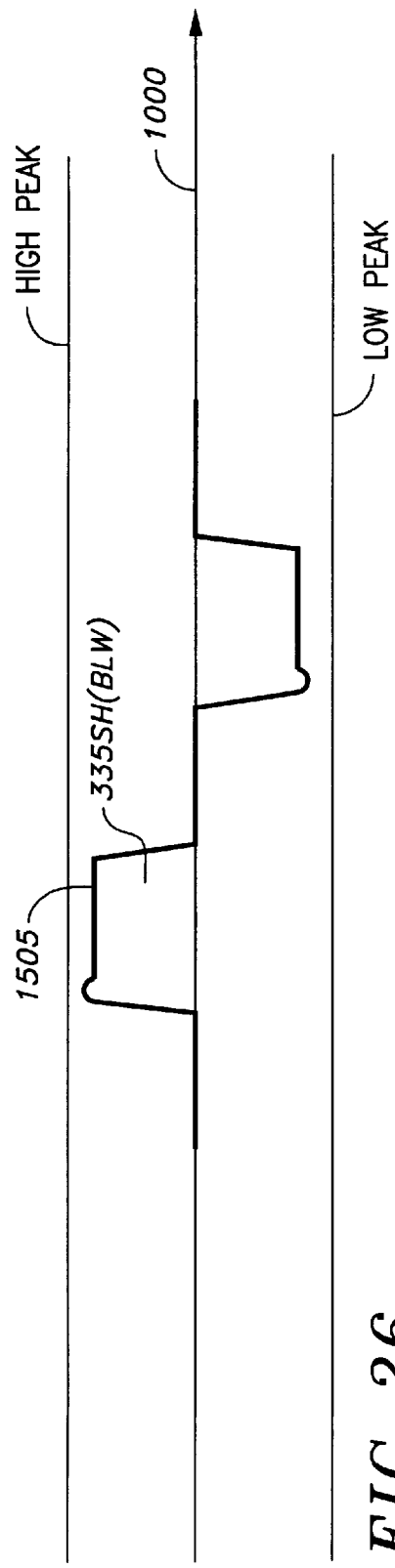

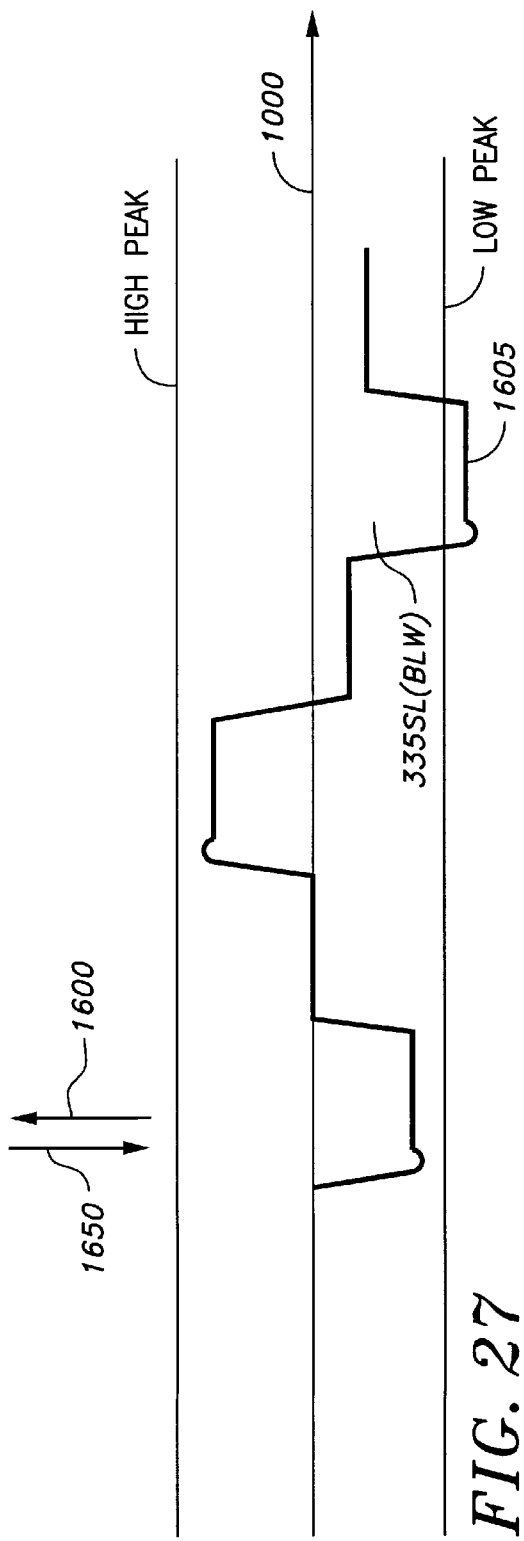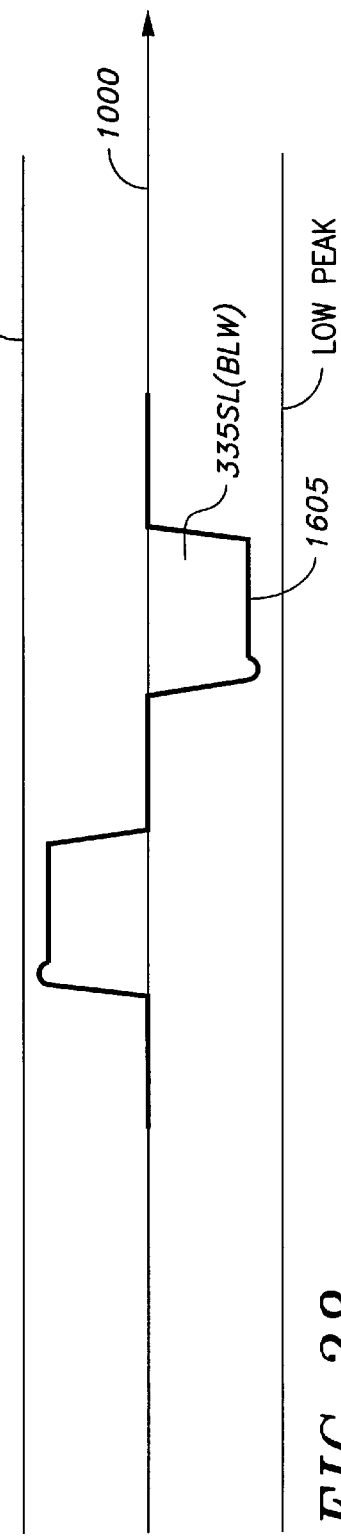
FIG. 27
FIG. 28

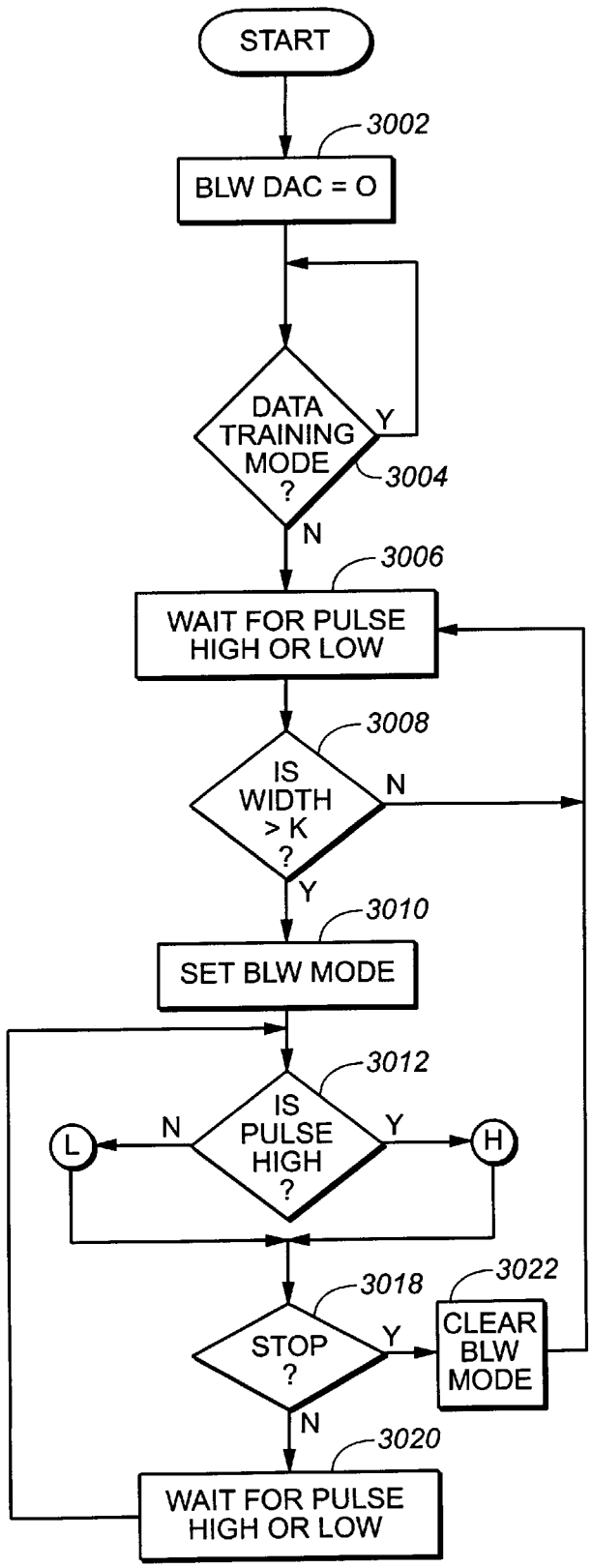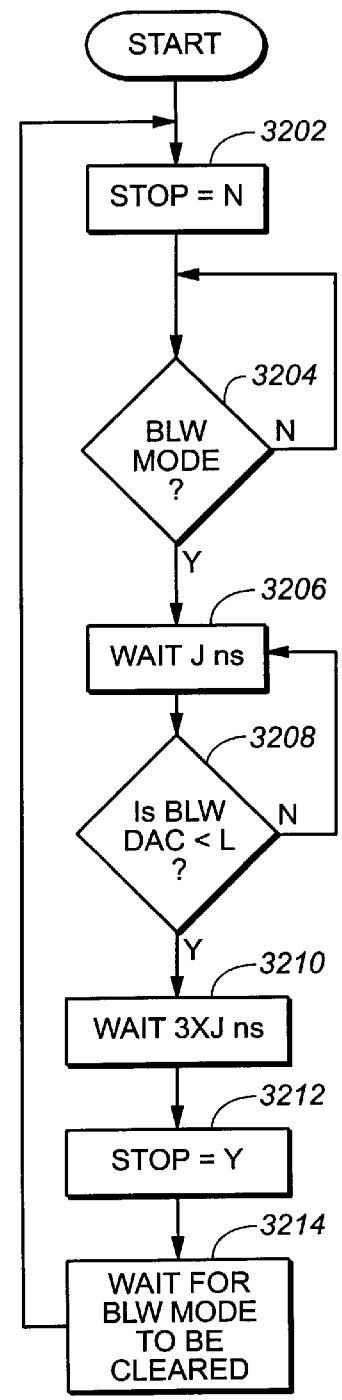
*FIG. 30A*
*FIG. 30B*

SYSTEM AND METHOD FOR COMPENSATING FOR BASELINE WANDER

CROSS-REFERENCES TO RELATED APPLICATIONS

This application incorporates by reference co-pending U.S. application Ser. No. 09/061,937, filed Apr. 17, 1998, entitled "System and Method for Adaptive Equalization of a Waveform Independent of Absolute Waveform Peak Value," by inventors Ramin Shirani et al., assigned to Enable Semiconductor, Inc., a California corporation.

BACKGROUND OF THE INVENTION

1. Field of the Invention

The present invention relates generally to compensating for baseline wander in adaptive equalizer systems, and more specifically, to compensating for baseline wander in a high-speed, digitally-controlled adaptive equalizer system to facilitate computer communications in a local area network.

2. Background Art

Equalization restores a data waveform's frequency components which are lost when the waveform propagates through data transmission channels such as cables. Thus, equalization permits the received waveform to closely resemble the originally transmitted waveform. A typical application of an equalization scheme in the data communications art is to facilitate digital computer communication among workstations in a local area network (LAN).

The magnitude of frequency loss in a received waveform depends upon the length of the data transmission channel. Longer transmission channels cause losses across all frequencies but with greater losses in high frequency signals. Thus, the farther apart two workstations are in a LAN, the more likely the received data will be attenuated by frequency, shifted in phase (frequency dispersion), and attenuated with less Signal-to-Noise (S/N) due to crosstalk.

Adaptive equalizer systems determine and provide equalizations required for a received waveform to ultimately resemble the originally transmitted waveform. FIG. 1 shows a conventional adaptive equalizer system 100 in which workstation 102 transmits waveform 105 via transmission line 110 to workstation 115. Waveform 105 is typically the MLT3 three-level code signal.

MLT-3 is the IEEE standard line coding for 100BASE-TX. MLT-3 is classified as a tri-state, differential code. MLT-3 has three levels: +1 volt, 0 volt, and −1 volt, where the differential is measured relative to a common mode voltage, set by the transceiver's receive section. The common mode is a reference voltage level above ground, selected at the voltage level designated as "0 volt" on the MLT-3 waveform. The MLT-3 waveform transition occurs as follows: from 0V to +1V, from +1V to 0V, from 0V to −1V, and from −1V to 0V. For MLT-3, a transition occurs for each bit value of 1, and no transition occurs for each bit value of 0. MLT-3 was chosen by IEEE standards committee 802.3u for 100BASE-TX to meet FCC emissions requirements for frequencies above 30 MHz.

Transmission line 110 is typically unshielded twisted pair wiring. However, transmission line 110 may also include shielded twisted pairs, attachment unit interface (AUI) cables, copper distributed data interface (CDDI), coaxial transmission lines, or other types of wiring. Workstations 102 and 115 may also include other types of transmitters/receivers. Additional details on CDDI (FDDI) are discussed in *Fibre Distributed Data Interface (FDDI)-Part: Token Ring Twisted Pair Physical Layer Medium Dependent (TP-PMD)*, American National Standard for Information Systems (Mar. 1, 1995) and in U.S. Pat. No. 5,305,350, both of which are fully incorporated herein by reference thereto as if repeated verbatim immediately hereinafter. The receiving end of transmission line 110 is connected through a data jack 120, such as an RJ45 jack, to the primary winding of a decoupling transformer 125 which decouples the received waveform 105'. The secondary winding of decoupling transformer 125 is connected to a transceiver chip 130 which includes an equalizer (gain stage) 135, a peak detector and comparator 140 and slicers 145 and 150.

A peak reference source 155 generates a "PEAK-REFERENCE" signal having a specific amplitude equal to the pre-propagation amplitude of waveform 105 at some frequency. Peak detector 140 compares the absolute amplitude value of received waveform 105' (at a specific frequency) with the amplitude value of the PEAK-REFERENCE signal and generates an "ERROR" signal based on the difference in amplitudes of both signals. The ERROR signal propagates, via feedback loop 142 with gain stage 144, to equalizer 135, which equalizes received waveform 105' to resemble originally-transmitted waveform 105.

Slicer 145 outputs via line 160 an output signal "SLICER1", while slicer 150 outputs via line 165 an output signal "SLICER2". The SLICER1 and SLICER2 signals slice equalized waveform 105' at predetermined voltage levels and are also driven into OR gate 167 which outputs a non-return-to-zero-inverted (NRZI) signal. (FIG. 2 shows the slicing levels of the SLICER1 and SLICER2 signals in received waveform 105'.)

In a conventional adaptive equalizer system 100 with a peak detector 140, peak reference source 155 generates the appropriate ERROR signal based on the following reference ratio: the received waveform 105' will have an amplitude value of 2±5% volts for a transmission line 110 of zero-meter length.

Conventional adaptive equalizer system 100 has a problem with a phenomenon known as "baseline wander." Baseline wander occurs with a conventional 100BASE-TX adaptive equalizer system 100 using differential signal transmission (i.e., MLT-3 coding) over a twisted pair medium 110. For 100BASE-TX systems using MLT-3 coding, three voltage levels are used (i.e., +1V, 0V, and −1V) relative to a return voltage. This return voltage is typically set to ground and is referred to as the baseline or baseline reference. In practice, the baseline does not remain at ground, but, rather, wanders up and down. This wandering of the baseline is referred to as "baseline wander."

Baseline wander is a problem that occurs when a very long pulse propagates through an isolation transformer. Decoupling transformer 125 is a standard component on a card receiving waveform 105. Decoupling transformer 125 acts as a high-pass filter which typically prevents most frequencies less than four kilohertz from passing through to adaptive equalizer system 100. Decoupling transformer 125, acting as a high-pass filter, eliminates the DC component of the incoming waveform 105' and causes a long pulse to drift towards the common mode. This is known in the art as "DC droop."

When the secondary winding of decoupling transformer 125 decouples the received waveform 105' and sends the signal to the transceiver chip 130, the DC component of the original waveform 105 does not pass through. When an MLT-3 coded signal remains constant (i.e., there are no transitions), for periods longer than the cut-off frequency of decoupling transformer 125, the output of decoupling transformer 125 begins to decay to common mode. This phenomenon is caused by the inductive exponential decay of decoupling transformer 125. The wander of the baseline from ground affects all three MLT-3 signal levels equally and, for convenience, is tracked by the 0V signal. As explained above, the 0V signal is also designated as the common mode.

Because MLT-3 code has a transition for every 1 bit and no transition for every 0 bit, only constant 0 bits (not constant 1 bits) converted into MLT-3 code produce a baseline wander condition. Multiple baseline wander events result in an accumulation of offset which manifests itself either more at +1V or more at −1V, depending on the which direction the wander goes over time. Although certain data patterns can cause significant baseline wander, statistically random data has very little probability of baseline wander.

Before a data pattern enters an isolation transformer, the data undergoes 4B/5B encoding and scrambling. To spread the transmitted energy of the signal evenly, the FDDI TP-PMD (ANSI X3.263:1995) standard was adopted establishing 4B/5B coding of the data. The use of 4B/5B coding ensures that 1 bits and 0 bits are spread for each symbol. However, 4B/5B encoding tends to concentrate energy at the high end of the spectrum (31.25 MHz) because of the predominance of 1 bits. Although this situation is good for ameliorating baseline wander, the trade-off is that emissions are not evenly distributed. To further spread energy, scrambling of data is used as well. For Fast Ethernet, the ANSI X3T12-PMD standard was adopted which includes a method of scrambling the 4B/5B symbol codes.

After 4B/SB coding and scrambling, baseline wander for 100BASE-TX can occur because numerous runs of 0 bits can be generated by the scrambler. The scrambler generates numerous 0 bits when certain packets, known as "killer packets," enter the scrambler. The probability of a killer packet entering a scrambler is a small number out of all the possible data packet permutations ($2^{12,000}$). Further, even if a killer packet enters the scrambler, a problem will arise only if the data pattern aligns with the scrambler seed. The probability of this happening is once out of 2,047 tries (1:2,047). Although statistically a rare occurrence in the real world, killer packets can be created in the laboratory to demonstrate the baseline wander problem.

What is needed is a system and method which can compensate for the problems associated with conventional adaptive equalizer systems experiencing a wandering baseline.

SUMMARY

The present invention improves computer communications between workstations connected in a local area network. Electrical signals traveling through communication wire become degraded by the interface connections at the workstations as well as by the wire itself. The process for restoring the frequency components to the electrical signal is known as equalization. When equalization is done so that the equalization parameters automatically vary to optimize the result according to changing conditions, this process is known as adaptive equalization.

The present invention provides a solution to a problem endemic to conventional adaptive equalizer systems, a problem known as baseline wander. An object of this invention is to bring the baseline back down when it has drifted up due to baseline wander. Another object of this invention is to bring the baseline back up when it has drifted down due to baseline wander. The end result is that the invention keeps the data centered about the common mode, thus helping to ensure that the data is equalized properly without distortion.

BRIEF DESCRIPTION OF THE DRAWINGS

FIG. 3 shows the flow of signals in the peak detector of FIG. 1 when the received waveform to be equalized has a dense data pattern;

FIG. 4 shows the flow of signals in the peak detector of FIG. 1 when the received waveform to be equalized has a sparse data pattern;

FIG. 25 is a data waveform with a short high pulse which has shifted upward from the common mode level due to baseline wander;

FIG. 26 is a data waveform with a short high pulse after undergoing baseline wander compensation;

FIG. 27 is a data waveform with a short low pulse which has shifted downward from the common mode level due to baseline wander;

FIG. 28 is a data waveform with a short low pulse after undergoing baseline wander compensation;

FIGS. 30A, 30B, 30C, and 30D are flowcharts illustrating steps in a method for implementing a Baseline Wander Mode according to a preferred embodiment.

DETAILED DESCRIPTION OF THE INVENTION

Those of ordinary skill in the art will realize that the following description of the present invention is illustrative only and not in any way limiting. Other embodiments of the invention will readily suggest themselves to those skilled in the art.

Glossary of Terms baseline wander—a phenomenon that occurs when a waveform is passed through a decoupling transformer, also known as "DC droop," which results in a large drift of the waveform above or below the return voltage, measured in hundreds of millivolts;
bit time—one bit time equals eight (8) nanoseconds;
clock—each clock equals eight (8) nanoseconds;
common mode—a reference voltage level for a waveform that splits high pulses from low pulses and is ideally sits at a value above ground and defined as zero volts on an MLT-3 coded signal;
incoming leading-rising-edge pulse—a pulse of a waveform at a voltage greater than the common mode;
high pulse—a pulse of a waveform at a voltage greater than the common mode; incoming leading-falling-edge pulse—a pulse of a waveform at a voltage less than the common mode;
low pulse—a pulse of a waveform at a voltage less than the common mode;
negative pulse—a pulse of a waveform at a voltage less than the common mode;
positive pulse—a pulse of a waveform at a voltage greater than the common mode;
wobble—a small drift of the waveform above or below the common mode measured in tens of millivolts;
region A—the region of a pulse between zero and eight nanoseconds typically containing most of the high frequency components of the pulse;
region B—the region of a pulse between eight and sixteen nanoseconds;
region C—the region of a pulse between sixteen and thirty-two nanoseconds typically containing most of the low frequency components of the pulse; and
waveform—a train of pulses.

Adaptive Equalizer System Overview

Figure 5:
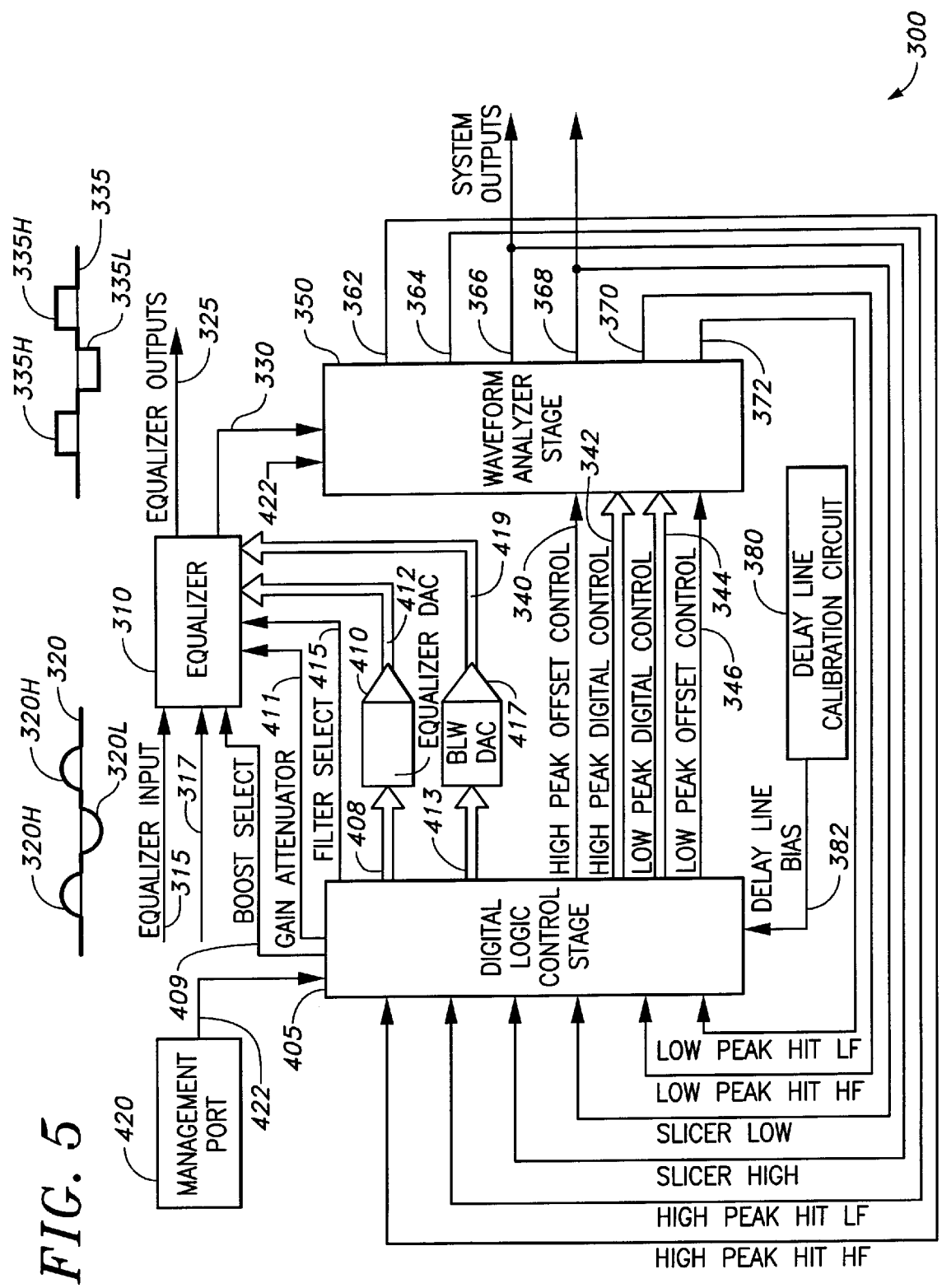
FIG. 5 is a block diagram of an adaptive equalizer system according to a preferred embodiment of the invention.

FIG. 5 shows an Adaptive Equalizer System 300 according to a preferred embodiment of the present invention. Adaptive Equalizer System 300 is implemented in various components, such as the "ESI Line Interface Chip" which will be commercially available from Enable Semiconductor, Inc. of San Jose, Calif. Adaptive Equalizer System 300 is comprised of three major components: "Equalizer 310," "Digital Logic Control Stage 405," and "Waveform Analyzer Stage 350." These three components form a closed loop for implementing adaptive equalization of computer data. Further, Digital Logic Control Stage 405 and Waveform Analyzer Stage 350 forms a feedback loop for setting the peaks of the data.

Equalizer 310 has a differential pair of data input lines, line 315 and line 317, which are the data inputs to system 300. This pair receives an MLT-3, three-level, input waveform 320. Waveform 320 has propagated through a data transmission channel and become attenuated by frequency, shifted in phase (frequency dispersion), and attenuated with less Signal-to-Noise (S/N) due to crosstalk. A differential pair has the same analog waveform on each line, but one line is a complement of the other line.

Equalizer 310 has a differential pair of data output lines, line 325 and line 330, which carries an output waveform 335. Output waveform 335 is produced by Adaptive Equalizer System 300. Waveform 335 is specified to approximate waveform 320 prior to 320's degradation by the data transmission channel. One line of the output differential pair, line 330, is connected to an input of a Waveform Analyzer Stage 350. One line of a differential pair carries a single-ended signal. Therefore, line 330 carries a single-ended digital signal ranging from +0.5V to −0.5V around a common mode. Line 325 is not used by system 300.

In addition to the two data input lines (discussed supra), Equalizer 310 uses five signal input lines: input line 409, which carries boost select information; input line 411, which carries gain attenuator information; input line 415, which carries filter select information; input bus 412, which carries equalization information; and the input bus 419, which is used to compensate for baseline wander.

In short, equalization is performed on waveform 335 by Equalizer 310 based on information from the loop consisting of Waveform Analyzer Stage 350 and Digital Logic Control Stage 405. Feedback from Equalizer 310 is sent to this loop on line 330. Summarizing, the information on the five input signal lines going into Equalizer 310 come after system 300 processes waveform 335.

Digital Logic Control Stage 405 has two output bus terminals and two output signal terminals connected to appropriate input terminals of Waveform Analyzer Stage 350. The digital signals connecting stage 405 and stage 350 are, respectively, a "HIGH PEAK OFFSET CONTROL" signal on line 340, a "HIGH PEAK DIGITAL CONTROL" signal on bus 342, a "LOW PEAK DIGITAL CONTROL" signal on bus 344, and a "LOW PEAK OFFSET CONTROL" signal on line 346.

The HIGH PEAK DIGITAL CONTROL signal on bus 342 contains digital information which is sent to a digital-to-analog converting (DAC), HIGH PEAK DAC 450, in Waveform Analyzer Stage 350. HIGH PEAK DIGITAL CONTROL provides 128 possible voltage settings for tracking the high pulses 335H in output waveform 335. The LOW PEAK DIGITAL CONTROL signal on bus 344 contains digital information which is sent to LOW PEAK DAC 470 in Waveform Analyzer Stage 350. LOW PEAK DIGITAL CONTROL provides 128 possible voltage settings for tracking the low pulses 335L in output waveform 335.

Figure 18:
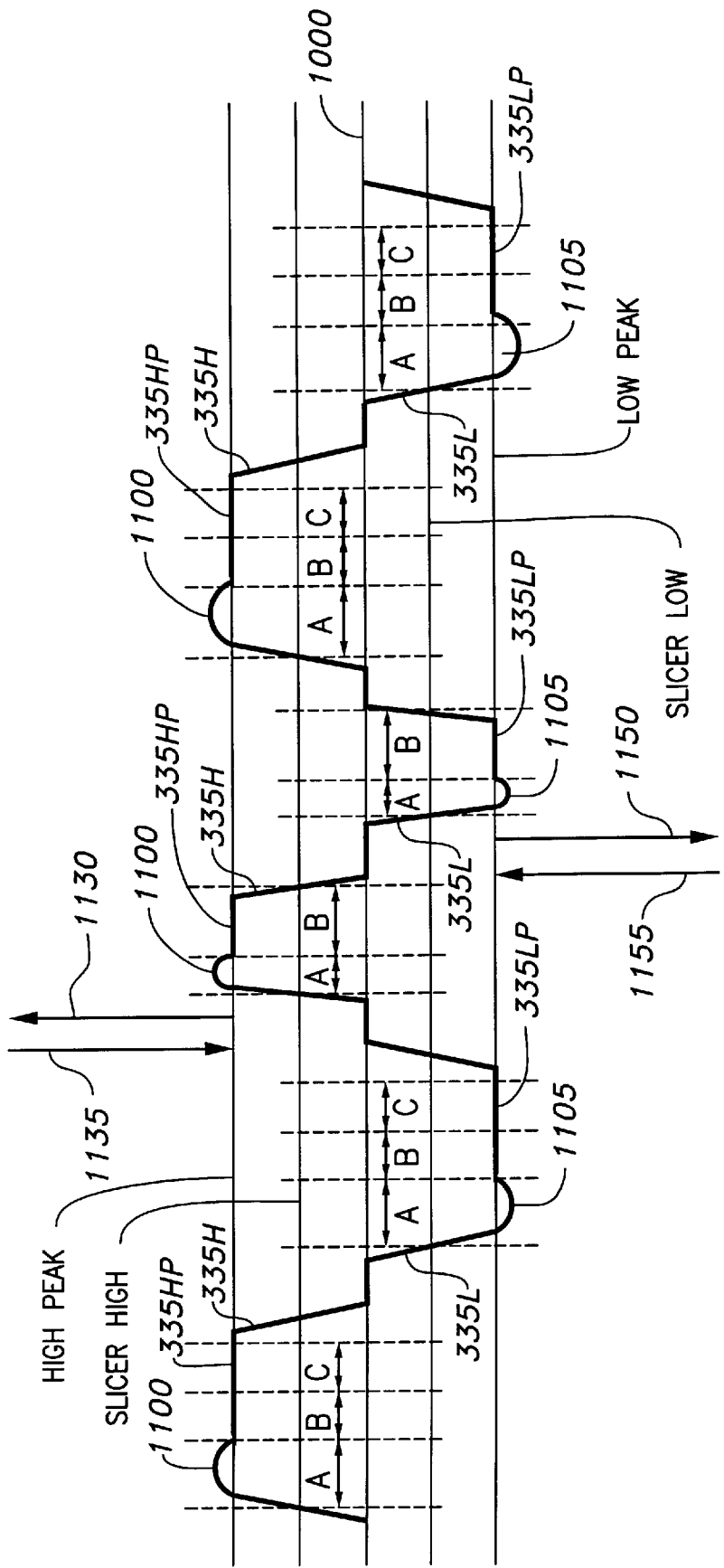
FIG. 18 is used to illustrate a method of adjusting the peaks of high pulses 335H and low pulses 335L, after Peak Training Mode has completed training.

The HIGH PEAK OFFSET CONTROL signal on line 340 controls the application of a programmable voltage addition between 0 millivolts and 40 millivolts to the voltage setting determined by HIGH PEAK DIGITAL CONTROL when a high pulse 335H is in REGION A (see FIG. 18). The LOW PEAK OFFSET CONTROL signal on line 346 controls the application of a programmable voltage addition between 0 millivolts and 40 millivolts in the voltage setting determined by LOW PEAK DIGITAL CONTROL when a low pulse 335L is in REGION A (see FIG. 18). Digital Logic Control Stage 405 is discussed below in conjunction with FIGS. 8, 9, 10, 11, 12, and 13.

Waveform Analyzer Stage 350 has six output terminals connected to six input terminals of Digital Logic Control Stage 405. The digital signals traveling on these lines are, respectively, a "HIGH PEAK HIT HIGH FREQUENCY" ("HIGH PEAK HIT HF") on line 362, a "HIGH PEAK HIT LOW FREQUENCY" ("HIGH PEAK HIT LF") on line 364, a "SLICER HIGH" on line 366, a "SLICER LOW" on line 368, a "LOW PEAK HIT HIGH FREQUENCY" ("LOW PEAK HIT HF") on line 370, and a "LOW PEAK HIT LOW FREQUENCY" ("LOW PEAK HIT LF") on line 372. SLICER HIGH on line 366 and SLICER LOW on line 368 are the data outputs of system 300 which are sent to the "Clock Recovery Module" (not shown) of the ESI Line Interface Chip. These signals and Waveform Analyzer Stage 350 are discussed below in conjunction with FIG. 6A.

Digital Logic Control Stage sends five input signals over buses and lines to Equalizer 310. A signal is sent over eight (8) bit bus 408 to Equalizer DAC 410. Equalizer DAC 410 drives an output signal on bus 412 to Equalizer 310 for setting the strength of equalization. Digital Logic Control Stage 405 sends a signal over sixty-four (64) bit bus 413 to a baseline wander (BLW) DAC 417. BLW DAC 417 drives a signal over bus 419 to Equalizer 310 that compensates input waveform 320 for the DC offset caused by baseline wander.

Figure 1:
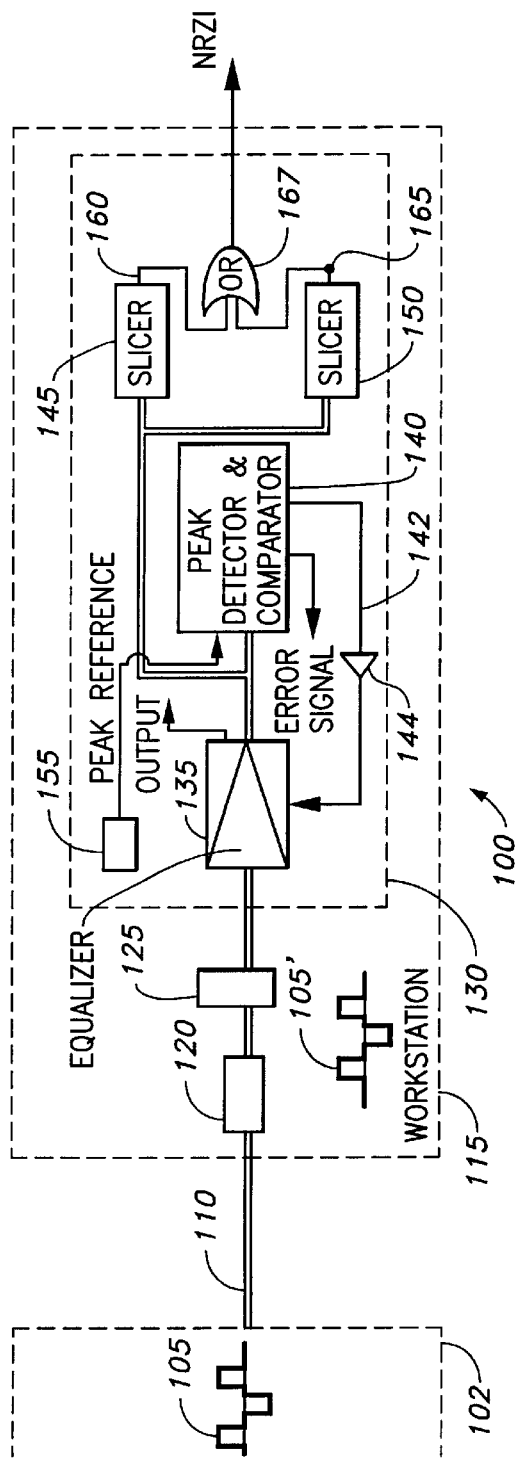
FIG. 1 is a block diagram of a conventional adaptive equalizer system with a peak detector.
Figure 2:
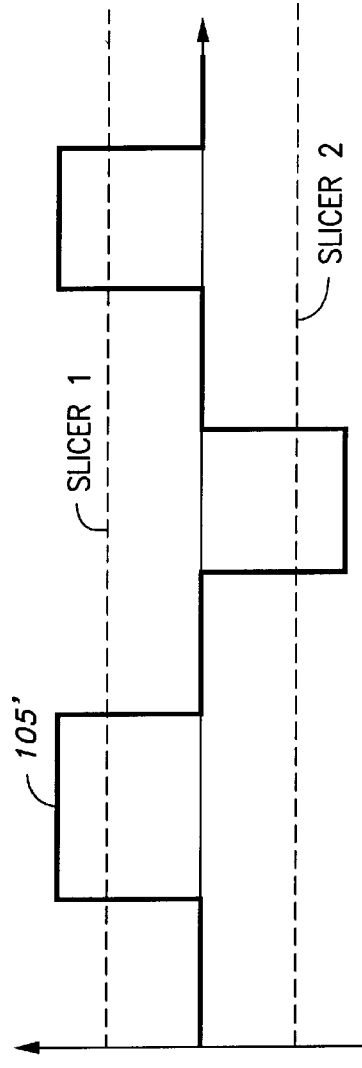
FIG. 2 shows the flow of signals from the conventional adaptive equalizer system of FIG. 1.

Digital Logic Control Stage 405 is also connected via line 415 directly to Equalizer 310 for providing a "FILTER SELECT" signal to choose between two different high frequency boost filters (not shown) in Equalizer 310. The FILTER SELECT signal is chosen dependent on whether a long or short transmission line 110 connects workstation 102 and workstation 115 (see FIG. 2). Line 409 sends a "BOOST SELECT" signal that is gated on when the equalization algorithm determines that further equalization is required for longer transmission line 110. Line 411 sends a "GAIN ATTENUATOR" signal that is gated on and off during the algorithm that also determines the final setting of FILTER SELECT.

Figure 9:
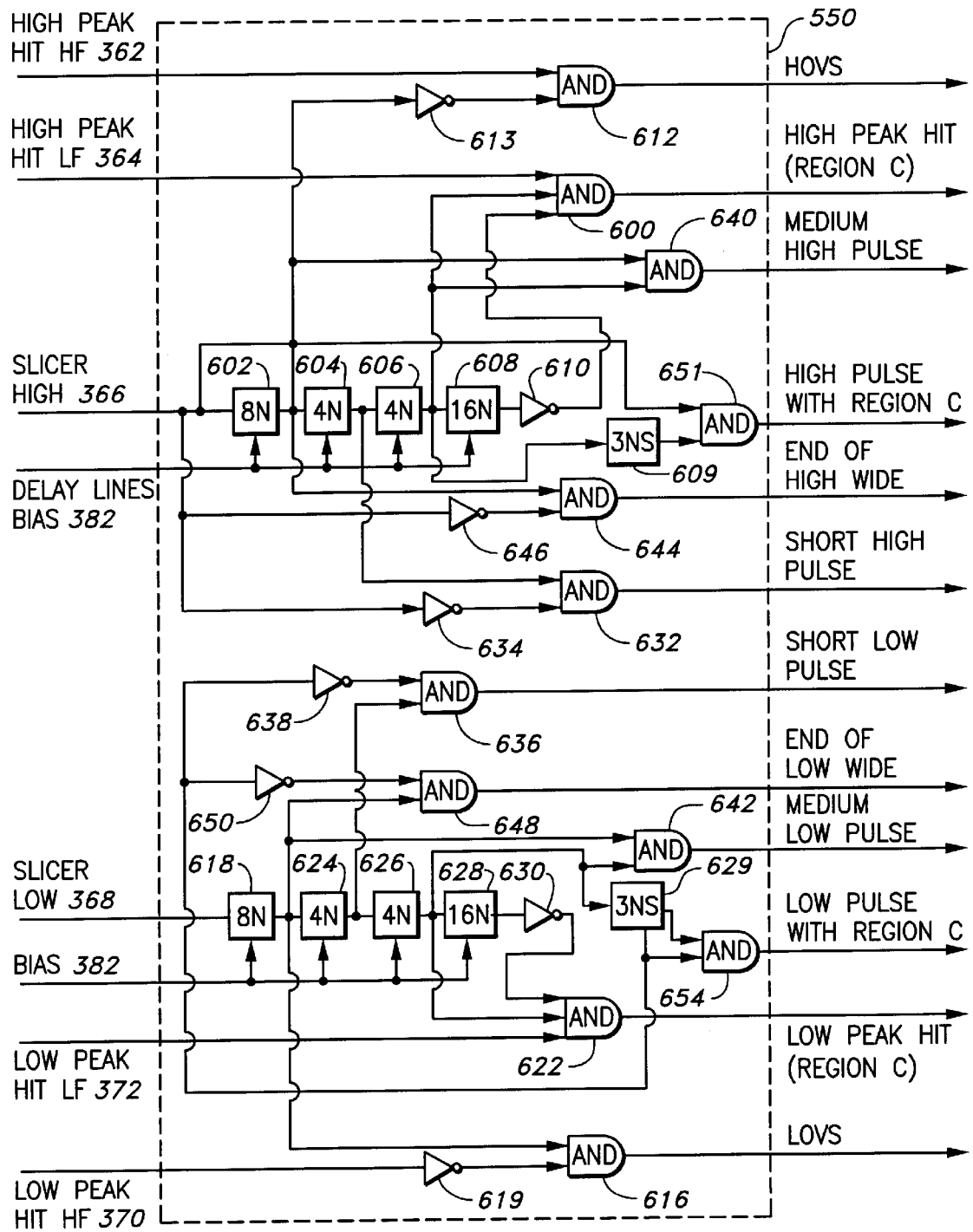
FIG. 9 shows elements of the Synchronizer/Region Definer Control Block of FIG. 8.

Discussed below in conjunction with FIG. 7, a Delay Line Calibration Circuit 380 sends a "DELAY LINE BIAS" signal on line 382 to delay elements in Digital Logic Control Stage 405. The delay elements are located in the Synchronizer/Region Definer 550 (see FIG. 9) and are calibrated using DELAY LINE BIAS (the delay elements in FIG. 9 are 602, 604, 606, 608, 609, 618, 624, 626, 628, and 629). Finally, a Management Port 420 sends over cable 422 various programmable values (indicated below) to Digital Logic Control Stage 405.

Waveform Analyzer Stage Description

Figure 6A:
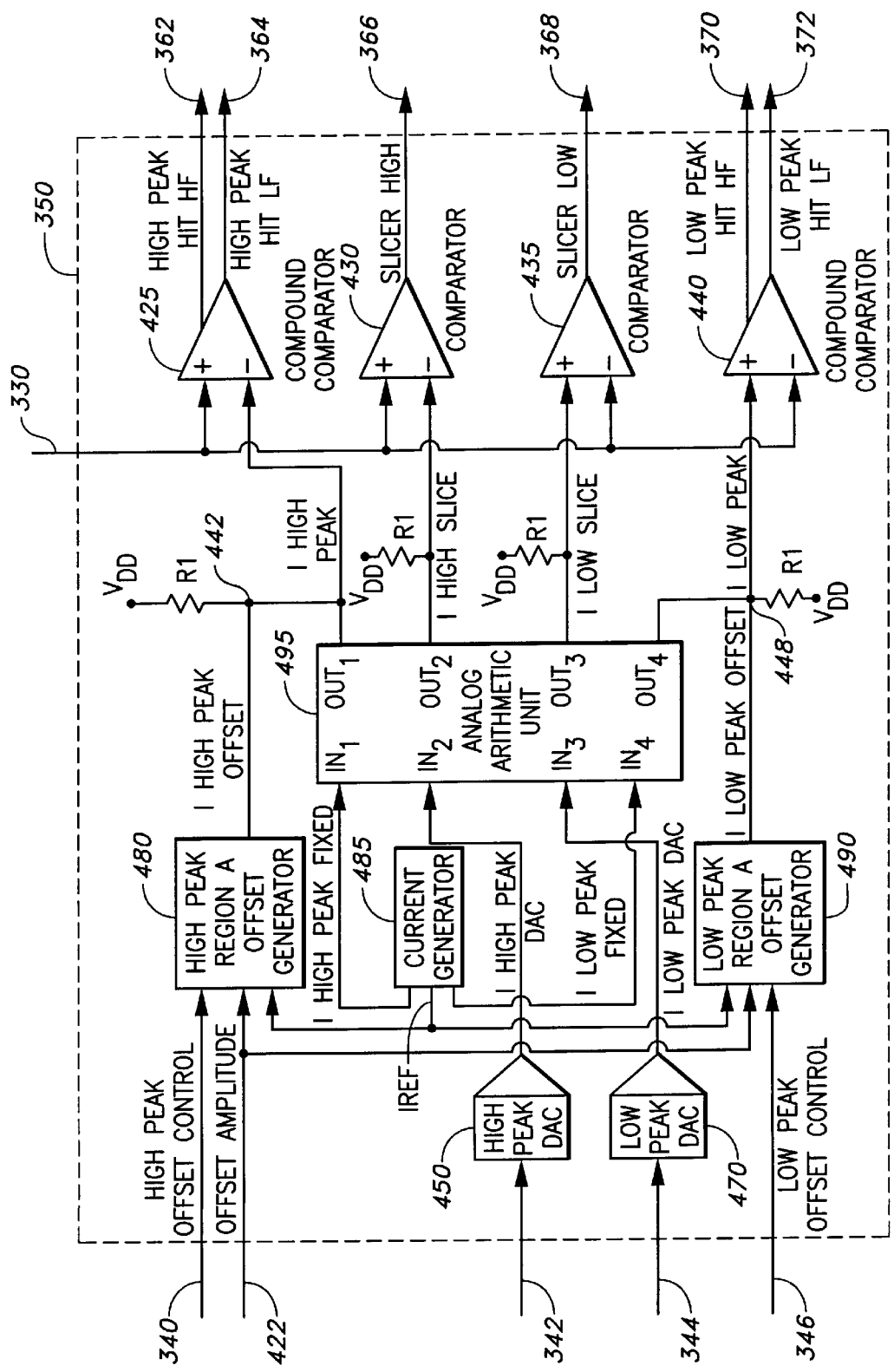
FIGS. 6A, 6B, and 6C are block diagrams showing details of the Waveform Analyzer Stage of FIG. 5.

FIG. 6A shows Waveform Analyzer Stage 350 according to a preferred embodiment of the invention. FIG. 6A labels the currents (I) that flow into and out of an analog arithmetic unit (AAU) 495. AAU 495 performs mathematical operations on the values of the currents entering AAU 495 via the "IN" terminals. Results of the operations performed by AAU 495 are placed on the "OUT" terminals. The IN terminals are current sources, and the OUT terminals are current sinks.

HIGH PEAK DAC 450 receives the signal HIGH PEAK DIGITAL CONTROL on bus 342 and has an output terminal for driving $I_{HIGH\ PEAK\ DAC}$. $I_{HIGH\ PEAK\ DAC}$ connects to AAU 495 at $IN_2$. LOW PEAK DAC 470 has an input terminal connected to LOW PEAK DIGITAL CONTROL on bus 344 and has an output terminal for driving $I_{LOW\ PEAK\ DAC}$. $I_{LOW\ PEAK\ DAC}$ connects to AAU 495 at $IN_3$.

Current generator 485 has two output terminals for driving $I_{HIGH\ PEAK\ FIXED}$ and $I_{LOW\ PEAK\ FIXED}$. $I_{HIGH\ PEAK\ FIXED}$ connects to AAU 495 at $IN_1$. $I_{LOW\ PEAK\ FIXED}$ connects to AAU 495 at $IN_4$. $I_{HIGH\ PEAK\ FIXED}$ and $I_{LOW\ PEAK\ FIXED}$ are chosen such that the four outputs of AAU 495 are referenced from common mode level 1000 (see FIG. 16) of data 335 (see FIG. 5). Common mode level 1000 is not zero volts in the preferred embodiment but is set at a positive voltage. All voltages in waveform 335 are positive in the preferred embodiment.

AAU 495 processes the current values from $IN_1$ and $IN_2$ and places the result on $OUT_1$. The current on $OUT_1$ is $I_{HIGH\ PEAK}$. Using AAU 495 input currents, Equation 1 is a mathematical representation of the analog operations of AAU 495 for $OUT_1$.

$$I_{HIGH\ PEAK} = I_{HIGH\ PEAK\ FIXED} + I_{HIGH\ PEAK\ DAC} \qquad \text{Eq. 1}$$

AAU 495 processes the current values from $IN_3$ and $IN_4$ and places the result on $OUT_4$. The current on $OUT_4$ is $I_{LOW\ PEAK}$. Using AAU 495 input currents, Equation 2 is a mathematical representation of the analog operations of AAU 495 for $OUT_4$.

$$I_{LOW\ PEAK} = I_{LOW\ PEAK\ FIXED} + I_{LOW\ PEAK\ DAC} \qquad \text{Eq. 2}$$

AAU 495 processes the current values from $IN_1$, $IN_2$, $IN_3$ and $IN_4$ and places the result on $OUT_2$. The current on $OUT_2$ is $I_{HIGH\ SLICE}$. The value of $I_{HIGH\ SLICE}$ is represented in Equation 3A. Using AAU 495 input currents, Equation 3A is a mathematical representation of the analog addition operations of AAU 495 for $OUT_2$.

$$I_{HIGH\ SLICE} = \tfrac{3}{4}(I_{HIGH\ PEAK\ FIXED} + I_{HIGH\ PEAK\ DAC}) + \tfrac{1}{4}(I_{LOW\ PEAK\ FIXED} + I_{LOW\ PEAK\ DAC}) \qquad \text{Eq. 3A}$$

Alternatively, the value of $I_{HIGH\ SLICE}$ can be expressed using $OUT_1$ and $OUT_4$ in Equations 3B and 3C.

$$I_{HIGH\ SLICE} = \tfrac{3}{4}(I_{HIGH\ PEAK}) + \tfrac{1}{4}(I_{LOW\ PEAK}) \qquad \text{Eq. 3B}$$

$$I_{HIGH\ SLICE} = I_{HIGH\ PEAK} - \tfrac{1}{4}(I_{HIGH\ PEAK} - I_{LOW\ PEAK}) \qquad \text{Eq. 3C}$$

Finally, AAU 495 processes the current values from $IN_1$, $IN_2$, $IN_3$ and $IN_4$ and places the result on $OUT_3$. The current on $OUT_3$ is $I_{LOW\ SLICE}$. The value of $I_{LOW\ SLICE}$ is represented in Equation 4A. Using AAU 495 input currents, Equation 4A is a mathematical representation of the analog addition operations of AAU 495 for $OUT_3$.

$$I_{LOW\ SLICE} = \tfrac{3}{4}(I_{LOW\ PEAK\ FIXED} + I_{LOW\ PEAK\ DAC}) + \tfrac{1}{4}(I_{HIGH\ PEAK\ FIXED} + I_{HIGH\ PEAK\ DAC}) \qquad \text{Eq. 4A}$$

Alternatively, the value of $I_{LOW\ SLICE}$ can be expressed using $OUT_1$ and $OUT_4$ in Equations 4B and 4C.

$$I_{LOW\ SLICE} = \tfrac{3}{4}(I_{LOW\ PEAK}) + \tfrac{1}{4}(I_{HIGH\ PEAK}) \qquad \text{Eq. 4B}$$

$$I_{LOW\ SLICE} = I_{LOW\ PEAK} + \tfrac{1}{4}(I_{HIGH\ PEAK} - I_{LOW\ PEAK}) \qquad \text{Eq. 4C}$$

High peak REGION A offset generator 480 has an input terminal connected to $I_{REF}$. $I_{REF}$ flows from current generator 485 and is enough current to cause a maximum preferred voltage drop across R1 of 20 millivolts. High peak REGION A offset generator 480 has an input terminal connected to HIGH PEAK OFFSET CONTROL on line 340 which gates on and off the added voltage drop across R1. Compound Comparator 425 has the voltage $V_{HIGH\ PEAK}$ connected to the reference (−) terminal. $V_{HIGH\ PEAK}$ is the signal "HIGH PEAK." The output of high peak REGION A offset generator 480 is $I_{HIGH\ PEAK\ OFFSET}$. At analog summing node 442, $I_{HIGH\ PEAK\ OFFSET}$ sums with $I_{HIGH\ PEAK}$ to boost $V_{HIGH\ PEAK}$ in REGION A (the high frequency region) of pulse 335H.

Low peak REGION A offset generator 490 has an input terminal connected to $I_{REF}$. $I_{REF}$ flows from current generator 485 and is enough current to cause a maximum voltage drop of 20 millivolts (preferred value) across R1. Low peak REGION A offset generator 480 has an input terminal connected to LOW PEAK OFFSET CONTROL on line 346 which gates on and off the added voltage drop across R1. Compound Comparator 440 has the voltage $V_{LOW\ PEAK}$ connected to the reference (−) terminal. $V_{LOW\ PEAK}$ is the signal "LOW PEAK." The output of low peak REGION A offset generator 490 is $I_{LOW\ PEAK\ OFFSET}$. At analog summing node 448, $I_{LOW\ PEAK\ OFFSET}$ sums with $I_{LOW\ PEAK}$ to boost $V_{LOW\ PEAK}$ in REGION A (the high frequency region) of pulse 335L.

Line 330 carries waveform 335 into Waveform Analyzer Stage 350. Line 330 is connected to four voltage comparators. Line 330 is connected to the positive input terminals of Compound Comparator 425 and Comparator 430. And line 330 is connected to the negative input terminals of Comparator 435 and Compound Comparator 440.

A comparator compares two analog voltage inputs and outputs a binary voltage signal. If the voltage level at the positive terminal of a comparator is greater than the voltage level at the reference terminal (i.e., the negative terminal), then the comparator outputs a digital HIGH value. If the voltage level at the positive terminal of a comparator is less than the voltage at the reference terminal, then the comparator outputs a digital LOW value. Comparators are further described in Horowitz, Paul and Hill, Winfield, *The Art Of Electronics* (2nd ed.), Cambridge University Press, New York, N.Y. (1996), which is fully incorporated herein by reference thereto as if repeated verbatim immediately hereinafter.

Compound Comparator 425 has the voltage $V_{HIGH\ PEAK}$ connected to the reference terminal. $V_{HIGH\ PEAK}$ is the signal HIGH PEAK. $V_{HIGH\ PEAK\ (REG.\ A)}$ is the signal "HIGH-PEAK(REGION A)". The details of Compound Comparator 425 are discussed below in conjunction with FIGS. 6B and 6C. Compound Comparator 425 drives the HIGH PEAK HIT HIGH FREQUENCY binary signal on line 362 and the HIGH PEAK HIT LOW FREQUENCY binary signal on line 364.

The signal HIGH PEAK, i.e., the value of $V_{HIGH\ PEAK}$, is expressed in Equation 5 for REGION C. $V_{HIGH\ PEAK\ (REG.\ A)}$ is expressed in Equation 6 for REGION A. $V_{DD}$ is the voltage from the power supply of Adaptive Equalizer System 300.

$$V_{HIGH\ PEAK} = V_{DD} - R1(I_{HIGH\ PEAK}) \qquad \text{Eq. 5}$$

$$V_{HIGH\ PEAK\ (REG.\ A)} = V_{DD} - R1(I_{HIGH\ PEAK}) + R1(I_{HIGH\ PEAK\ OFFSET}) \qquad \text{Eq. 6}$$

Comparator 430 has the voltage $V_{HIGH\ SLICE}$ connected to the reference terminal. Comparator 430 drives a "SLICER HIGH" binary signal on line 366. Derived from Equations 3B and 3C, the value of $V_{HIGH\ SLICE}$ is expressed in Equations 7A and 7B.

$$V_{HIGH\ SLICE} = \tfrac{3}{4}(V_{HIGH\ PEAK}) + \tfrac{1}{4}(V_{LOW\ PEAK}) \qquad \text{Eq. 7A}$$

$$V_{HIGH\ SLICE} = V_{HIGH\ PEAK} - \tfrac{1}{4}(V_{HIGH\ PEAK} - V_{LOW\ PEAK}) \qquad \text{Eq. 7B}$$

Comparator 435 has the voltage $V_{LOW\ SLICE}$ connected to the reference terminal. Comparator 435 drives a "SLICER LOW" binary signal on line 368. Derived from Equation 4B and 4C, the value of $V_{LOW\ SLICE}$ is expressed in Equations 8A and 8B.

$$V_{LOW\ SLICE} = \tfrac{3}{4}(V_{LOW\ PEAK}) + \tfrac{1}{4}(V_{HIGH\ PEAK}) \qquad \text{Eq. 8A}$$

$$V_{LOW\ SLICE} = V_{LOW\ PEAK} + \tfrac{1}{4}(V_{HIGH\ PEAK} - V_{LOW\ PEAK}) \qquad \text{Eq. 8B}$$

Compound Comparator 440 has the voltage $V_{LOW\ PEAK}$ connected to the reference terminal (refer to the discussion below in conjunction with FIGS. 6B and 6C, which teach the details of Compound Comparator 425). Compound Comparator 440 drives a LOW PEAK HIT HIGH FREQUENCY binary signal on line 370 and a LOW PEAK HIT LOW FREQUENCY binary signal on line 372.

The signal LOW PEAK is $V_{LOW\ PEAK}$, which is expressed in Equation 9 for REGION C. The signal "LOW-PEAK (REGION A)" is $V_{LOW\ PEAK\ (REG.\ A)}$ which is expressed in Equation 10 for REGION A.

$$V_{LOW\ PEAK} = V_{DD} - R1(I_{LOW\ PEAK}) \qquad \text{Eq. 9}$$

$$V_{LOW\ PEAK\ (REG.\ A)} = V_{DD} - R1(I_{LOW\ PEAK}) - R1(I_{LOW\ PEAK\ OFFSET}) \qquad \text{Eq. 10}$$

Figure 6B:
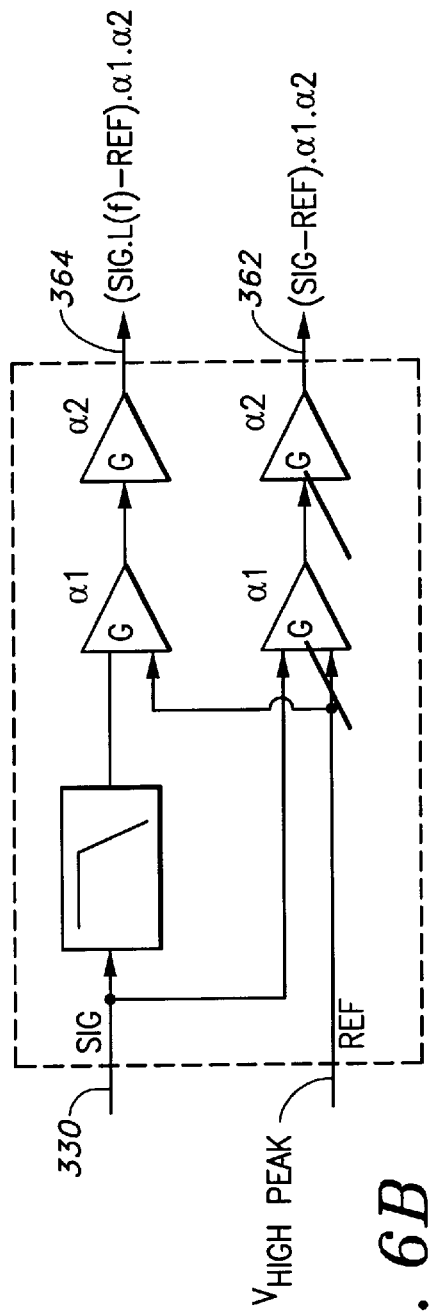

FIG. 6B shows Compound Comparator 425 according to a functional implementation of the circuit. FIG. 6B shows Compound Comparator 425 with two input lines, a signal (SIG) and a reference (REF). SIG is on the (+) input terminal and is connected to line 330 which carries waveform 335. REF is on the (−) input terminal and is attached to $V_{HIGH\ PEAK}$, the HIGH PEAK signal.

Compound Comparator 425 has two output lines, line 362 and line 364. When a positive high pulse 335H on SIG is greater than the REF voltage level, line 362 goes HIGH, i.e., the signal HIGH PEAK HIT HIGH FREQUENCY (HF) is HIGH. Stated another way, HIGH PEAK HIT HF goes HIGH when the peak of the waveform 335H crosses HIGH PEAK in REGION A or REGION B.

The signal "HOVS" or high overshoot is derived from HIGH PEAK HIT HF and is described below in conjunction with FIG. 9. For each positive pulse, if HIGH PEAK HIT HF goes from a LOW to a HIGH during an eight (8) nanosecond window, defined from the midlevel of the leading rising edge 335H, then this event is registered in the digital machine as a high overshoot (HOVS) in REGION A. It is the LOW to HIGH transition which is registered so as only one HOVS can be registered for each high pulse.

The circuitry of Compound Comparator 425 which has HIGH PEAK HIT HF as an output has high gain bandwidth characteristics since its function is to register voltage overshoots of short time duration and small amplitude occurring at the peaks of positive leading edge pulses. Using gain stages (G) with amplifications of a, and a2, the output signal of line 362 is shown in Equation 11.

$$(SIG - REF) \cdot a_1 \cdot a_2 \qquad \text{Eq. 11}$$

Because crosstalk and noise tends to be present in the high frequencies of the data, a low-pass filter will remove most of these artifacts. The invention tracks the average peak of the low frequency content of the incoming data pulses. In part, this is accomplished by looking for occurrences of the positive waveform 335H peak in REGION C (see FIG. 18) which are greater than the REF voltage of the compound comparator. Since the machine looks for any edge transition of the compound comparator output in REGION C, this implies that if the data has high frequency noise or crosstalk superimposed on the signal, the machine would tend to track the noise peaks in the high frequency part of the signal instead of the true data peaks. In order to escape from this difficulty, the compound comparator has a parallel path with HIGH PEAK HIT LF on line 364 as an output. This path has a low-pass filter introduced which significantly reduces the amplitude of high frequency information, thus making it possible to track the true low frequency peak of the incoming data.

When REF is connected to HIGH PEAK, line 364 goes HIGH, i.e., the signal HIGH PEAK HIT LOW FREQUENCY (LF) is HIGH, when the waveform crosses HIGH PEAK in REGION C. A low-pass filter, L(f), is used in the circuit to detect waveform crossings above HIGH PEAK in the low frequency regions of waveform 335H, i.e., REGION C (see FIG. 18). The output of line 364 is shown in Equation 12.

$$(\text{SIG} \cdot L(f) - \text{REF}) \cdot \alpha_1 \cdot \alpha_2 \qquad \text{Eq. 12}$$

Figure 6C:
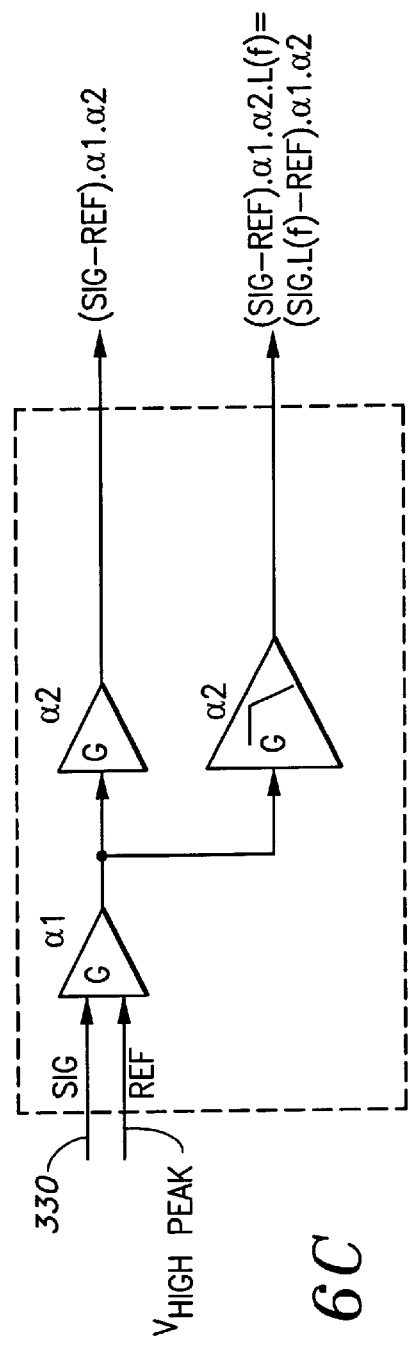

FIG. 6C shows a Compound Comparator 425 according to a preferred implementation of the circuit. For the circuit in FIG. 6B, it is self-evident that the output of line 362 is expressed in Equation 11. The output of line 364 is shown in Equation 13.

$$(\text{SIG} - \text{REF}) \cdot \alpha_1 \cdot \alpha_2 \cdot L(f) \qquad \text{Eq. 13}$$

Equation 13 is mathematically equivalent to Equation 12. This is shown in the derivation of Equation 12 using Equations 13, 14, and 15. Equation 14 is simply an expansion of Equation 13.

$$\text{SIG} \cdot \alpha_1 \cdot \alpha_2 \cdot L(f) - \text{REF} \cdot \alpha_1 \cdot \alpha_2 \cdot L(f) \qquad \text{Eq. 14}$$

Applying a low-pass filter to a DC voltage yields the same result as not applying the low-pass filter. This is shown in Equation 15. Factoring out a, a2 yields Equation 12.

$$\text{SIG} \cdot \alpha_1 \cdot \alpha_2 \cdot L(f) - \text{REF} \cdot \alpha_1 \cdot \alpha_2 \qquad \text{Eq. 15}$$

Delay Line Calibration Circuit Description

Figure 7:
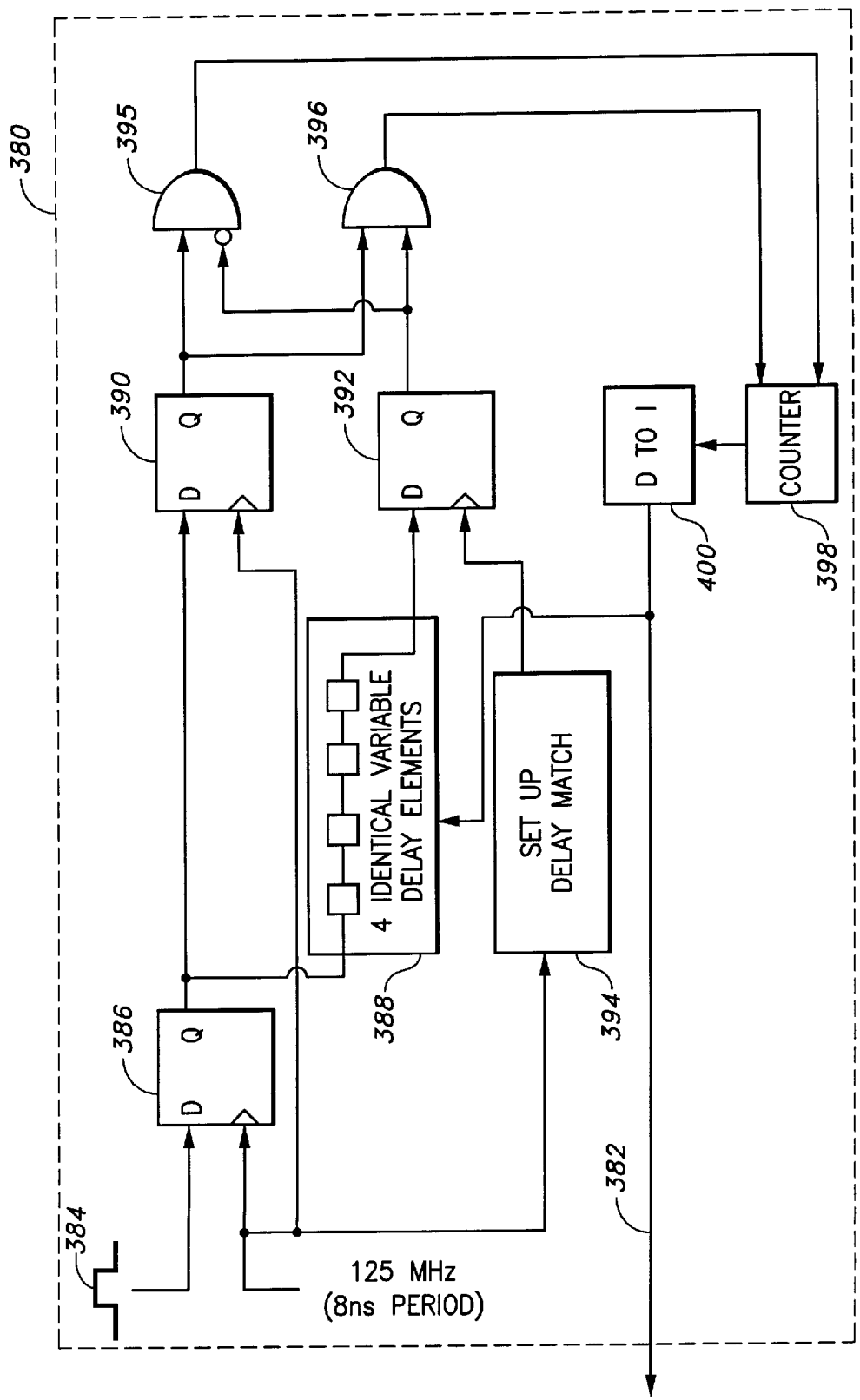
FIG. 7 is a block diagram showing details of the Delay Line Calibration Circuit of FIG. 5.

FIG. 7 shows a Delay Line Calibration Circuit 380 according to a preferred embodiment of the invention. The output of circuit 380, DELAY LINE BIAS, goes over line 382 into Digital Logic Control Stage 405. A pulse 384 is generated every one microsecond. Pulse 384 enters capture flip-flop 386 and is synchronized with a 125 megahertz clock. Pulse 384 then enters flip-flop 390 and, concurrently, eight nanoseconds delay line 388. After eight (8) nanoseconds, pulse 384 enters flip-flop 392. Set-Up and Delay Match 394 cancels the effect of clock to Q delay of synchronizer and setup requirement of capture flip-flop 386.

When flip-flop 390 is high, and flip-flop 392 is high, delay line 388 needs to be incremented. When flip-flop 390 is high, and flip-flop 392 is low, delay line 388 needs to be decremented. AND gates 394 and 396 increment or decrement Counter 398. Counter 398 outputs a signal to digital to current (D/I) converter 400. D/I 400 outputs a current which drives delay line 388 and increments or decrements the delay line bias. D/I 400 drives the signal DELAY LINE BIAS over line 382 which goes to the delay elements in the Synchronizer/Region Definer 550 (FIG. 9) of Digital Logic Control Stage 405.

Digital Logic Control Stage Description

Figure 8A:
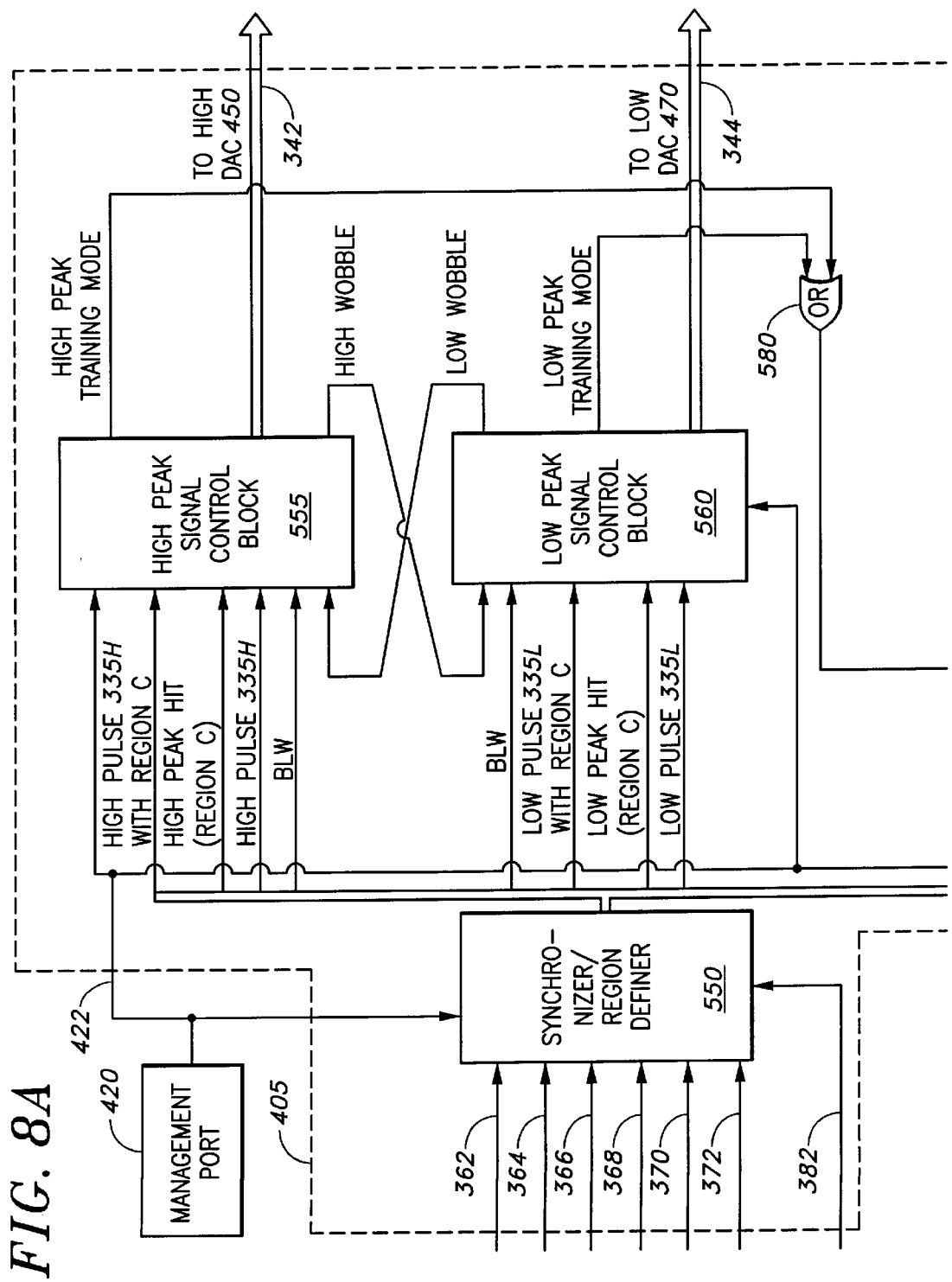
FIG. 8 is a block diagram showing details of the Digital Control Logic Stage of FIG. 5.
Figures 8, 8B:
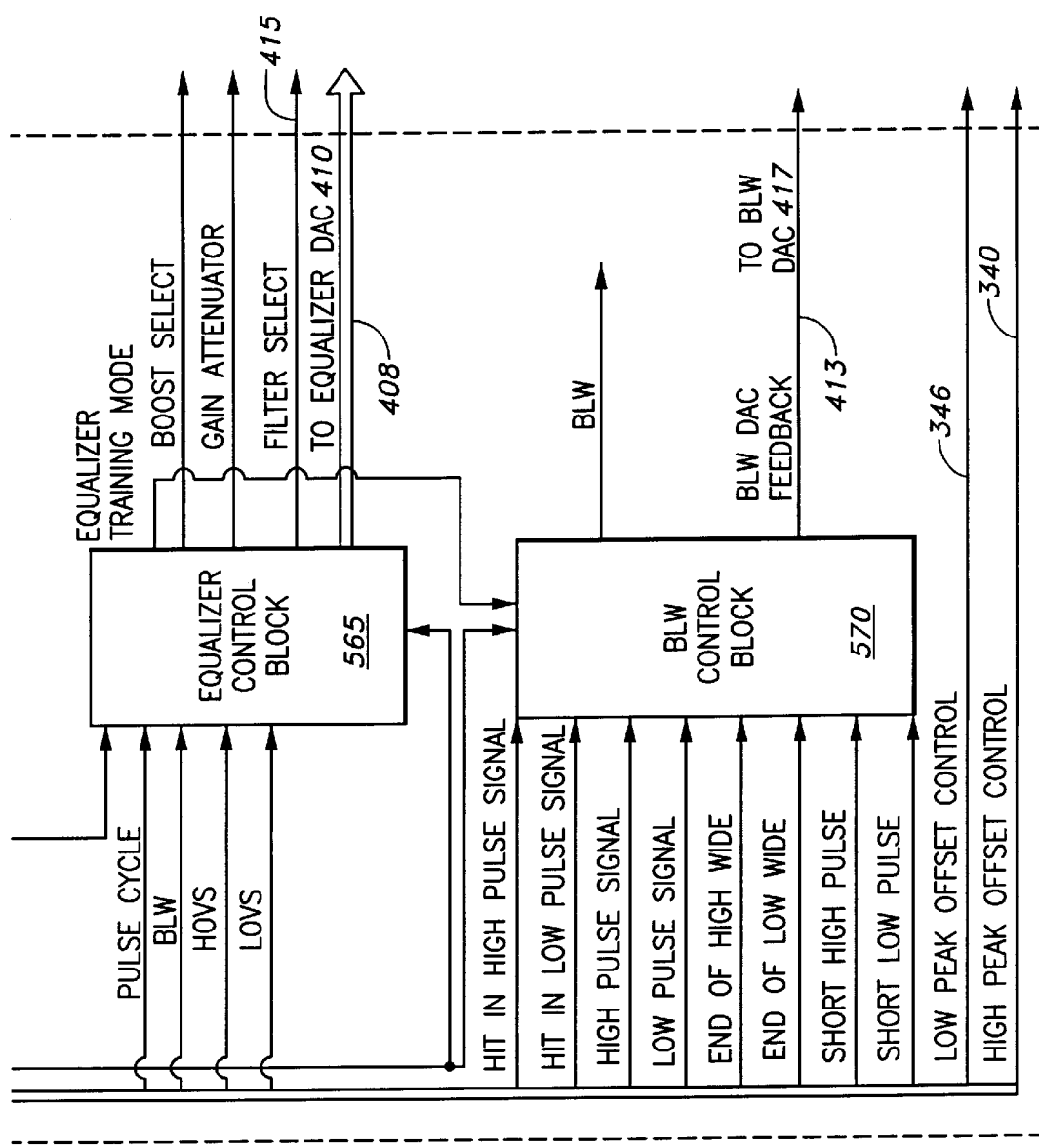

FIG. 8 shows Digital Logic Control Stage 405 according to a preferred embodiment of the invention, which includes: "Synchronizer/Region Definer" 550, "HIGH PEAK Control Block" 555, "LOW PEAK Control Block" 560, "Equalizer Control Block" 565, and "Baseline Wander (BLW) Control Block" 570. Each of these elements receives control parameters from Management Port 420. BLW Control Block 570 receives various input signals and drives BLW DAC 417.

Synchronizer/Region Definer 550 receives signals from Waveform Analyzer Stage 350 on lines 362, 364, 366, 368, 370, and 372. Synchronizer/Region Definer 550 generates output signals to HIGH PEAK Control Block 555, LOW PEAK Control Block 560, Equalizer Control Block 565 and BLW Control Block 570. Block 550 also generates a HIGH PEAK OFFSET CONTROL signal on line 340 and a LOW PEAK OFFSET CONTROL signal on line 346. Lines 340 and 346 go to Waveform Analyzer Stage 350 (see FIG. 6A). Synchronizer/Region Definer 550 is further described below in conjunction with FIG. 9.

HIGH PEAK Control Block 555 receives a signal indicating propagation of high pulse 335H with REGION C (see FIG. 18), a "HIGH PEAK HIT (REGION C)" signal, and a signal indicating propagation of a high pulse 335H (with or without REGION C). The low frequency components of a high pulse 335H (or of a low pulse 335L) define REGION C. HIGH PEAK Control Block 555 sources signal HIGH PEAK DIGITAL CONTROL on bus 342 to HIGH PEAK DAC 450. Block 555 also sources the signal "HIGH PEAK HIT TRAINING MODE" to the second input terminal of OR gate 580. HIGH PEAK Control Block 555 is further described below in conjunction with FIG. 10.

LOW PEAK Control Block 560 receives a signal indicating propagation of a low pulse 335L with REGION C (see FIG. 18), a "LOW PEAK HIT (REGION C)" signal and a signal indicating propagation of a low pulse 335L (with or without REGION C). LOW PEAK Control Block 560 sources LOW PEAK DIGITAL CONTROL on bus 344 to LOW PEAK DAC 470. LOW PEAK Block 560 also sources the signal "LOW PEAK HIT TRAINING MODE" to the first input terminal of OR gate 580. LOW PEAK Control Block 560 is further described below in conjunction with FIG. 11.

Equalizer Control Block 565 receives a "PULSE CYCLE" signal (which indicates propagation of one MLT-3 pulse cycle of output waveform 335), a "high overshoot" ("HOVS") signal and a "low overshoot" ("LOVS") signal (see FIG. 9). HIGH PEAK Control Block 555 outputs the signal "HIGH PEAK TRAINING MODE" and the LOW PEAK Control Block 560 outputs the signal "LOW PEAK TRAINING MODE," which are both sent to OR gate 580 to generate a "PEAK TRAINING MODE" signal input to block 565. Block 565 drives FILTER SELECT on line 415, GAIN ATTENUATOR on line 411, and BOOST SELECT on line 409. Block 565 also drives Equalizer DAC 410 on bus 408. Finally, Block 565 generates an "EQUALIZER TRAINING MODE" signal which goes to BLW Control Block 570. Equalizer Control Block 565 is further described below in conjunction with FIG. 12.

BLW Control Block 570 receives the following eight (8) input signals from Synchronizer/Region Definer 550:

HOVS, "SHORT HIGH PULSE," "MEDIUM HIGH PULSE," "END OF WIDE HIGH PULSE," LOVS, "SHORT LOW PULSE," "MEDIUM LOW PULSE," and "END OF WIDE LOW PULSE." Using the aforementioned six input signals from Synchronizer/Region Definer 550 along with six (6) signals from Waveform Analyzer Stage 350, BLW Control Block 570 generates a signal on bus 413 which drives BLW DAC 417. BLW Control Block 570 commands BLW DAC 417 to compensate for baseline wander, i.e., the DC shift of the incoming waveform 320.

FIG. 9 shows details of Synchronizer/Region Definer 550. Delay line elements 602, 604, 606, 608, and 609 are used to define REGION A, REGION B, and REGION C of a high pulse 335H. The delay line elements are set to the values shown in FIG. 9 according to the preferred embodiment. REGION A is defined as the first eight (8) nanoseconds of a pulse. REGION B is defined as the second eight (8) nanoseconds of a pulse (i.e., after REGION A). REGION C is defined as the part of a pulse sixteen (16) nanoseconds after REGION B.

An AND gate 600 has a first input terminal which receives the HIGH PEAK HIT LF signal from Compound Comparator 425 on line 364. The purpose of HIGH PEAK HIT LOW FREQUENCY (LF) is to filter out crosstalk and noise. AND gate 600 has a second input terminal which receives a SLICER HIGH signal on line 366 delayed by delay line elements 602, 604, and 606. AND gate 600 has a third input terminal which receives the SLICER HIGH signal delayed by delay line elements 602, 604, 606 and 608 and inverted by inverter 610. AND gate 600 has an output terminal which produces the "HIGH PEAK HIT (REGION C)" signal which goes to HIGH PEAK HIT Counter 665 (see FIG. 10) in HIGH PEAK Control Block 555. HIGH PEAK HIT Counter 665 is used to set HIGH PEAK DAC 450.

An AND gate 612 has a first input terminal which receives the HIGH PEAK HIT HF signal from Compound Comparator 425 on line 362; a second input terminal which receives a SLICER HIGH signal on line 366 delayed by delay line element 602 and inverter 613; and an output terminal which produces the HOVS signal. Since HIGH PEAK HIT HF signals that waveform 335H has crossed in either REGION A or REGION B, the purpose of HOVS is to detect high overshoot (HOVS) in REGION A only. REGION A is the high frequency region of pulse 335H (see FIG. 18).

As already stated above, HOVS or high overshoot is derived from HIGH PEAK HIT HF. For each positive pulse, if HIGH PEAK HIT HF goes from a LOW to a HIGH during an eight (8) nanosecond window, defined from the midlevel of the rising leading edge 335H, then this event is registered in the digital machine as a high overshoot (HOVS) in REGION A. It is the LOW to HIGH transition which is registered so as only one HOVS can be registered for each high pulse 335H. The HOVS signal is sent to Equalizer Control Block 565 and BLW Control Block 570.

An AND gate 632 has a first input terminal which receives a SLICER HIGH signal on line 366 delayed by delay line elements 602 and 604. A second input terminal receives a SLICER HIGH signal through inverter 634. The output terminal produces SHORT HIGH PULSE which goes to BLW Control Block 570. SHORT HIGH PULSE goes HIGH when a high pulse that is less than or equal to 8 ns wide is detected; i.e., SLICER HIGH goes HIGH for 8 ns when an 8 ns pulse is detected on waveform 335H. After 8 ns, SLICER HIGH goes LOW. Thus, after 12 ns, the first input terminal of AND gate 632 will be HIGH (because SLICER HIGH has propagated through delay lines 602 and 604), and the second input terminal of AND gate 632 will be HIGH (because SLICER HIGH has gone LOW so that the output of inverter 634 is HIGH), thereby making a the output of AND gate 632 HIGH. The extra 4 ns is added to avoid erroneous detection due to jitter and calibration error.

An AND gate 640 has a first input terminal which receives a SLICER HIGH signal on line 366 delayed by delay line element 602. A second input terminal receives a SLICER HIGH signal delayed by delay line elements 602, 604, and 606. The output terminal produces a MEDIUM HIGH PULSE signal which goes to BLW Control Block 570. MEDIUM HIGH PULSE goes HIGH when a high pulse greater than 8 ns and less than or equal to 16 ns wide is detected; i.e., SLICER HIGH goes HIGH for 16 ns when a 16 ns pulse is detected on waveform 335H. After 16 ns SLICER HIGH goes LOW. Thus, after 16 ns, the first terminal of AND gate 640 will be HIGH and the second terminal of AND gate 640 will be HIGH, producing a HIGH signal from AND gate 640.

An AND gate 644 has a first input terminal which receives a SLICER HIGH signal on line 366 delayed by delay line elements 602. A second input terminal receives a SLICER HIGH signal through inverter 646. The output terminal produces an END OF HIGH WIDE PULSE signal which goes to BLW Control Block 570. END OF HIGH WIDE PULSE goes HIGH when a high pulse greater than 16 ns ends, i.e., after the trailing falling edge is detected. For example, SLICER HIGH goes LOW after a wide pulse has passed. Thus, after 8 ns, the first terminal of AND gate 644 will be HIGH and the second terminal of AND gate 640 will be HIGH, producing a HIGH signal from AND gate 644.

An AND gate 651 has a first input terminal which receives a SLICER HIGH signal on line 366. A second input terminal receives a SLICER HIGH signal delayed by delay elements 602, 604, 606, and 609 (19 ns delay). The output terminal produces a "HIGH PULSE WITH REGION C" signal which is received by the (+) terminal of High Pulse Counter 660 in HIGH PEAK Control Block 555. HIGH PULSE WITH REGION C goes HIGH when a high pulse is wide enough to have a REGION C (i.e., wider than 16 ns). For example, SLICER HIGH goes HIGH when a wide pulse is present so that the first terminal of AND gate 651 is HIGH. If after 19 ns, when the second terminal of AND gate 651 is HIGH, the first input terminal of AND gate 651 is still HIGH, then the output terminal of AND gate 651 will be HIGH.

Delay line elements 618, 624, 626, 628, and 629 are used to define REGION A, REGION B, and REGION C of a low pulse 335L. The delay line elements are set to the values shown in FIG. 9 according to the preferred embodiment. REGION A is defined as the first eight (8) nanoseconds of a pulse. REGION B is defined as the second eight (8) nanoseconds of a pulse (i.e., after REGION A). REGION C is defined as the part of the pulse sixteen (16) nanoseconds after REGION B.

An AND gate 622 has a first input terminal which receives a SLICER LOW signal on line 368 delayed by delay line elements 618, 624, 626 and 628 and inverted by inverter 630; a second input terminal which receives a SLICER LOW signal delayed by delay line elements 618, 624 and 626; and a third input terminal which receives the LOW PEAK HIT LF signal on line 372. The output terminal produces a "LOW PEAK HIT (REGION C)" signal which goes to LOW PEAK HIT Counter 765 (see FIG. 11).

An AND gate 616 has a first input terminal which receives a SLICER LOW signal on line 368 delayed by delay line element 618, and a second input terminal which receives the inverted LOW PEAK HIT LF signal on line 370, and an output terminal which produces the LOVS signal. Since LOW PEAK HIT HF signals that waveform 335L has crossed in either REGION A or REGION B, the purpose of LOVS is to detect low overshoot (LOVS) in REGION A only. REGION A is the high frequency region of pulse 335L (see FIG. 18).

As already stated above, LOVS or low overshoot is derived from LOW PEAK HIT HF. For each low pulse, if LOW PEAK HIT HF goes from a LOW to a HIGH during an eight (8) nanosecond window, defined from the midlevel of the leading falling edge 335L, then this event is registered in the digital machine as a low overshoot (LOVS) in REGION A. It is the LOW to HIGH transition which is registered so as only one LOVS can be registered for each low pulse 335L. The LOVS signal is sent to Equalizer Control Block 565 and BLW Control Block 570.

An AND gate 636 has a first input terminal which receives a SLICER LOW signal on line 368 through inverter 638. A second input terminal receives a SLICER LOW signal delayed by delay line elements 618 and 624. The output terminal produces SHORT LOW PULSE signal which goes to BLW Control Block 570. SHORT LOW PULSE goes HIGH when a low pulse that is less than or equal to 8 ns wide is detected.

An AND gate 642 has a first input terminal which receives a SLICER LOW signal on line 368 delayed by delay line element 618. A second input terminal receives a SLICER LOW signal delayed by delay line elements 618, 624, and 626. The output terminal produces a MEDIUM LOW PULSE signal which goes to BLW Control Block 570. MEDIUM LOW PULSE goes HIGH when a low pulse greater than 8 ns and less than or equal to 16 ns wide is detected.

An AND gate 648 has a first input terminal which receives a SLICER LOW signal on line 368 through inverter 650. A second input terminal receives a SLICER HIGH signal delayed by delay line elements 618 and 624. The output terminal produces an END OF WIDE LOW PULSE signal which goes to BLW Control Block 570. END OF WIDE LOW PULSE goes HIGH when a low pulse greater than 16 ns ends.

An AND gate 654 has a first input terminal which receives a SLICER LOW signal on line 368. A second input terminal receives a SLICER LOW signal delayed by delay elements 618, 624, 626, and 629. The output terminal produces a "LOWPULSE WITH REGION C" signal which is received by the (+) terminal of Low Pulse Counter 760 in LOW PEAK Control Block 560. LOW PULSE WITH REGION C goes HIGH when a low pulse is wide enough to have a REGION C. For example, SLICER LOW goes HIGH when a wide pulse is present so that the first terminal of AND gate 654 is HIGH. If after 19 ns, when the second terminal of AND gate 654 is HIGH, the first input terminal of AND gate 654 is still HIGH, then the output terminal of AND gate 654 will be HIGH.

Preferably, delay line elements 602 and 618 each provides eight (8) nanoseconds of delay, while delay line elements 604, 606, 624 and 626 each provides four (4) nanoseconds of delay. Preferably, delay line elements 608 and 628 each provides sixteen (16) nanoseconds of delay. And preferably, delay line elements 609 and 629 each provides three (3) nanoseconds of delay. Delay elements 608 and 628 are currently implemented using flip-flop circuitry in the preferred embodiment of the invention.

Synchronizer/Region Definer Control Block 550 further includes a synchronizer (not shown) for synchronizing its output signals with a clock (not shown) in Adaptive Equalizer System 300.

Figure 10:
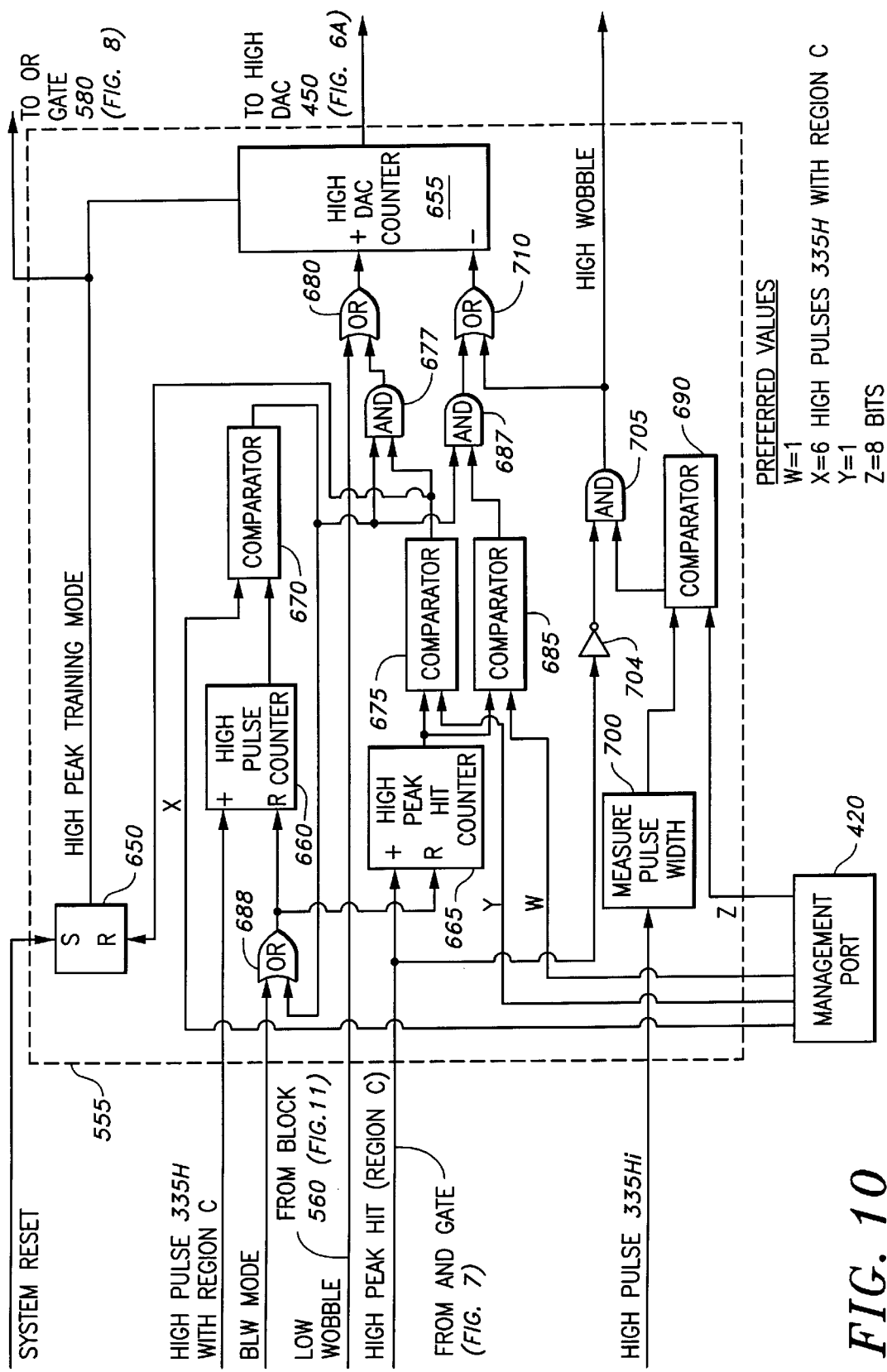
FIG. 10 shows elements of the HIGH PEAK Signal Control Block of FIG. 5.

FIG. 10 shows High Peak Signal Control Block 555 according to a preferred embodiment of the invention. A set/reset (SR) flip-flop 650 has an "S" input terminal (which receives a "SYSTEM RESET" signal), and an "R" input terminal which receives the output of Comparator 675. The output of SR flip-flop 650 drives a HIGH PEAK TRAINING MODE signal to OR gate 580 (FIG. 8) and to HIGH DAC Counter 655 which drives HIGH PEAK DAC 450 (FIG. 6A).

A HIGH PULSE Counter 660 counts the HIGH PULSE WITH REGION C (see FIG. 9) signals at the increment (+) input terminal, which counts the number of propagating high pulses 335H with REGION C. A HIGH PEAK HIT Counter 665 counts the HIGH PEAK HIT (REGION C) signals at the increment (+) input terminal.

A Comparator 670 has a first input terminal which receives a programmable variable "X" signal from Management Port 420, a second input terminal connected to the HIGH PULSE Counter 660 output terminal. The output terminal is connected to the second input terminal of OR gate 688, the first input terminal of AND gate 677, and the first input terminal of AND gate 687. Counters and comparators are further described in Horowitz, Paul and Hill, Winfield, *The Art Of Electronics* (2nd ed.), supra.

Another Comparator 675 has a first input terminal connected to the HIGH PEAK HIT Counter 665 output terminal and a second input terminal which receives a programmable variable "Y" signal from Management Port 420. The output of Comparator 675 goes to the second input terminal of AND gate 677 and the R terminal of SR flip-flop 650.

An OR gate 680 has a first input terminal which receives a "LOW WOBBLE" signal from LOW PEAK Control Block 560 (FIG. 11), a second input terminal connected to the output terminal of AND gate 677, and an output terminal connected to the increment (+) input terminal of HIGH DAC Counter 655.

A Comparator 685 has a first input terminal connected to the HIGH PEAK HIT Counter 665 output terminal and a second input terminal which receives a programmable value "W" signal from Management Port 420. The output of Comparator 685 goes to the second input of AND gate 687.

Another Comparator 690 has a first input terminal which receives a high pulse 335H via pulse width measurement circuit 700 and a second input terminal which receives a programmable value "Z" signal from Management Port 420. The output of Comparator 690 goes to the second input terminal of AND gate 705.

An AND gate 705 has a first input terminal which receives a HIGH PEAK HIT (REGION C) signal inverted by Inverter 704, and a second input terminal connected to the output terminal of Comparator 690. The output of AND gate 705 goes to the second input of OR gate 710 and is also output from Block 555 as the signal "HIGH WOBBLE."

An OR gate 710 has a first input terminal connected to the output terminal of AND gate 687, a second input terminal connected to the output terminal of AND gate 705, and an output terminal connected to the decrement (−) input terminal of HIGH DAC Counter 655.

Figure 11:
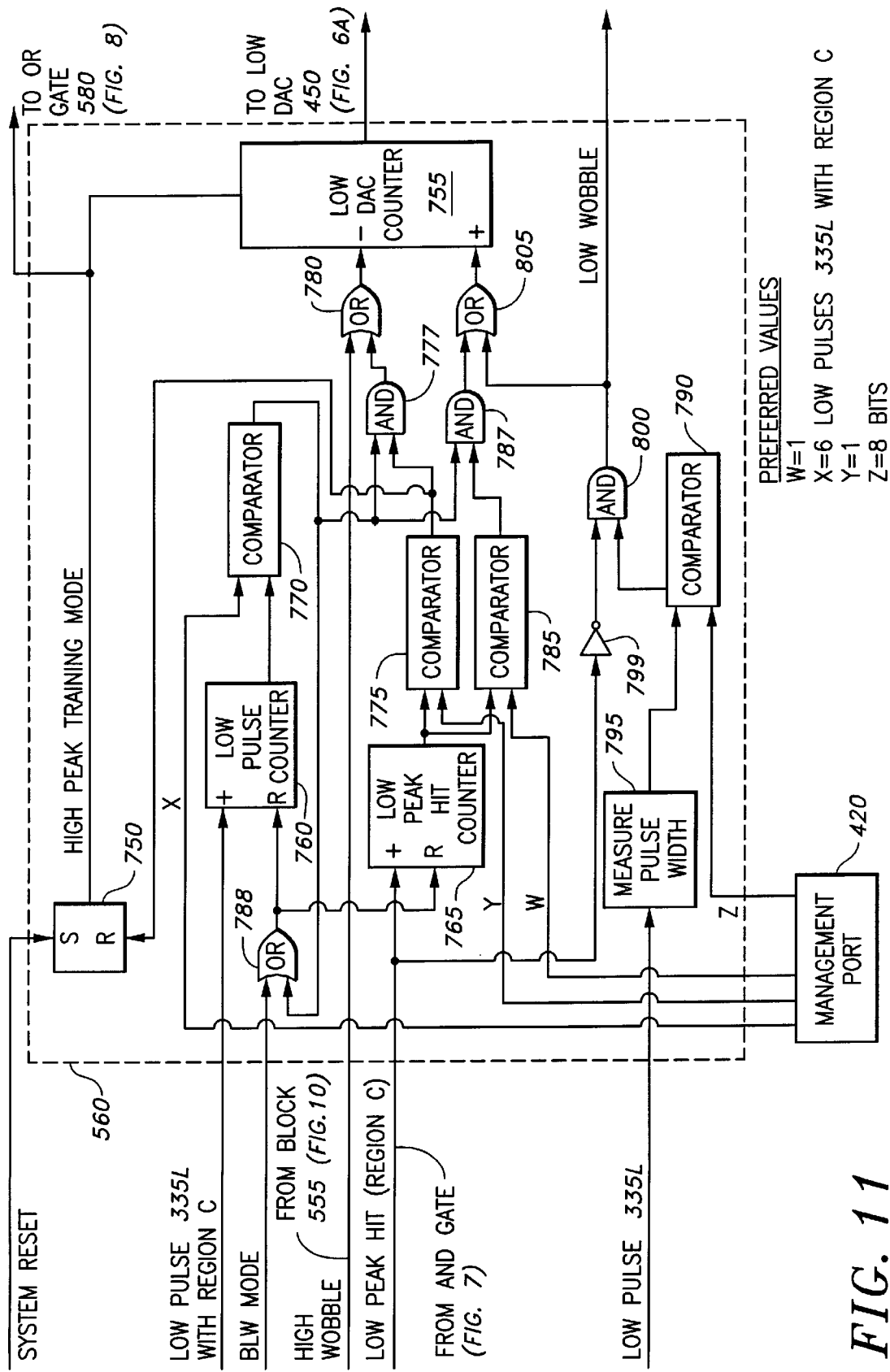
FIG. 11 shows elements of the LOW PEAK Signal Control Block of FIG. 5.

FIG. 11 shows Low Peak Signal Control Block 560 according to a preferred embodiment of the invention. A set/reset (SR) flip-flop 750 has an "S" input terminal (which receives a "SYSTEM RESET" signal), and an "R" input terminal which receives the output of Comparator 775. The output of SR flip-flop 750 drives a LOW PEAK TRAINING MODE signal to OR gate 580 (FIG. 8) and to LOW DAC Counter 755 which drives LOW PEAK DAC 470 (FIG. 6A).

A LOW PULSE Counter 760 counts the LOW PULSE WITH REGION C (see FIG. 9) signals at the increment (+) input terminal, which counts the number of propagating low pulses 335L with REGION C. A LOW PEAK HIT Counter 765 counts the LOW PEAK HIT (REGION C) signals at the increment (+) input terminal.

A Comparator 770 has a first input terminal which receives a programmable variable "X" signal from Management Port 420, a second input terminal connected to the LOW PULSE Counter 760 output terminal. The output terminal is connected to the second input terminal of OR gate 788, the first input terminal of AND gate 777, and the first input terminal of AND gate 787.

Another Comparator 775 has a first input terminal connected to the LOW PEAK HIT Counter 765 output terminal and a second input terminal which receives a programmable variable "Y" signal from Management Port 420. The output of Comparator 775 goes to the second input terminal of AND gate 777 and the R terminal of SR flip-flop 750.

An OR gate 780 has a first input terminal which receives a "HIGH WOBBLE" signal from HIGH PEAK Control Block 555 (FIG. 10), a second input terminal connected to the output terminal of AND gate 777, and an output terminal connected to the decrement (−) input terminal of LOW DAC Counter 755.

A Comparator 785 has a first input terminal connected to the LOW PEAK HIT Counter 765 output terminal and a second input terminal which receives a programmable value "W" signal from Management Port 420. The output of Comparator 785 goes to the second input of AND gate 787.

Another Comparator 790 has a first input terminal which receives a low pulse 335H via pulse width measurement circuit 795 and a second input terminal which receives a programmable value "Z" signal from Management Port 420. The output of Comparator 790 goes to the second input terminal of AND gate 800.

An AND gate 800 has a first input terminal which receives a LOW PEAK HIT (REGION C) signal inverted by Inverter 799, and a second input terminal connected to the output terminal of Comparator 790. The output of AND gate 800 goes to the second input of OR gate 805 and is also output from Block 555 as the signal "LOW WOBBLE."

An OR gate 805 has a first input terminal connected to the output terminal of AND gate 787, a second input terminal connected to the output terminal of AND gate 800, and an output terminal connected to the increment (+) input terminal of LOW DAC Counter 755.

Figure 12:
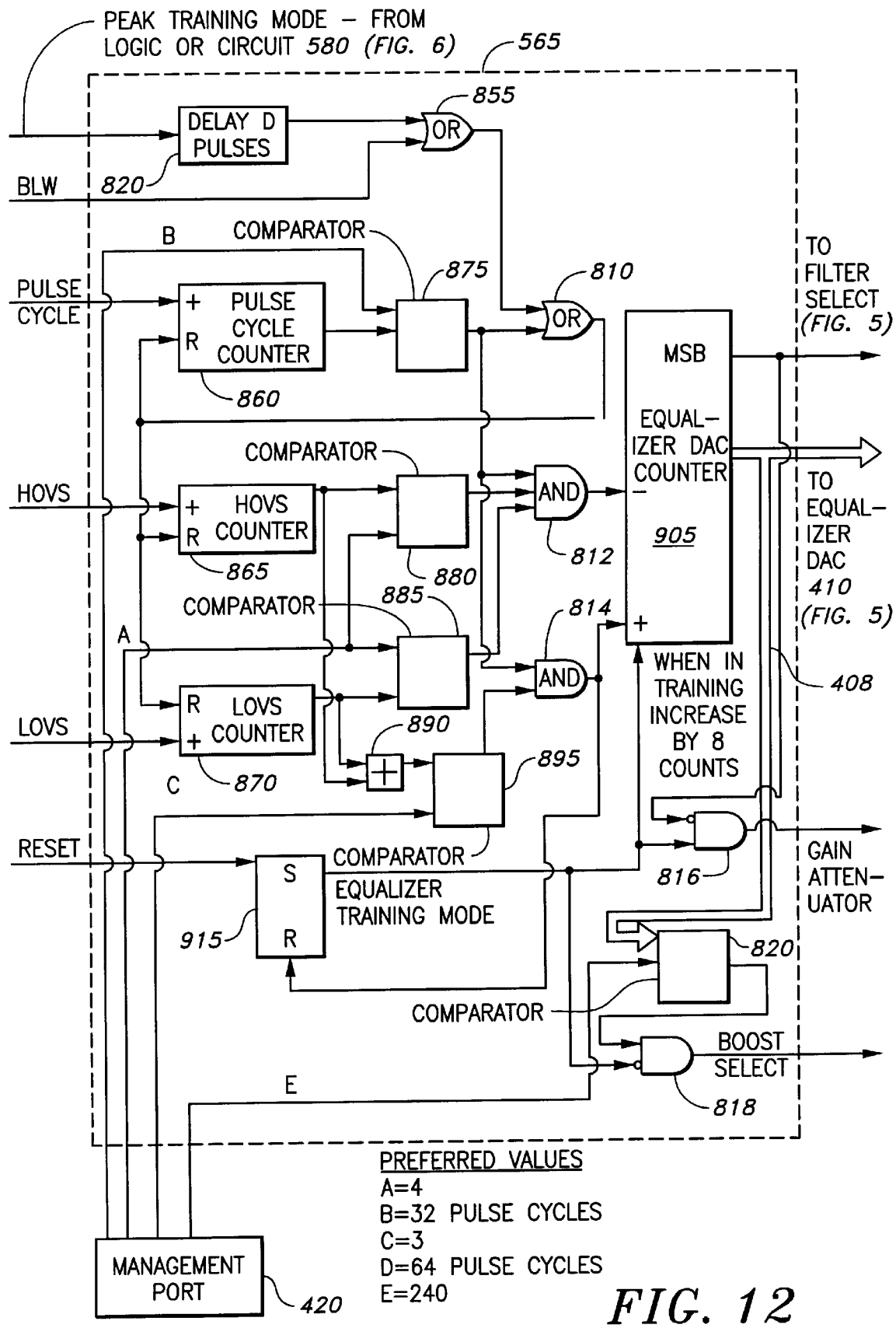
FIG. 12 shows elements of the Equalizer Control Block of FIG. 5.

FIG. 12 shows Equalizer Control Block 565 according to a preferred embodiment of the invention. The PEAK TRAINING MODE signal enters Delay D Pulses 820 and the output is sent to the first input of OR gate 855. The BLW MODE signal is sent to the second input of OR gate 855. The output of OR gate 855 is sent to the first input of OR gate 810.

Pulse Cycle Counter 860 has an increment (+) terminal which receives the PULSE CYCLE signal, which indicates propagation of an MLT-3 pulse cycle of output waveform 335. HOVS Counter 865 has an increment (+) terminal which receives the HOVS signal, while LOVS Counter 870 has an increment (+) terminal which receives the LOVS signal. Comparator 875 has a first input terminal connected to the Pulse Cycle Counter 860 output terminal, a second input terminal which receives a programmable "B" from Management Port 420 signal, and an output to the second input terminal of OR gate 810.

The first input terminal of OR gate 810 is connected to the output terminal of OR gate 855. The output terminal of OR gate 810 is connected to the reset (R) terminal of Pulse Cycle Counter 860, the R terminal of HOVS Counter 865, and the R terminal of LOVS Counter 870. Comparator 880 has a first input terminal connected to the HOVS Counter 865 output terminal and a second input terminal which receives a programmable "A" signal from Management Port 420.

Comparator 885 has a first input terminal connected to the LOVS Counter 870 output terminal and a second input terminal which receives the programmable "A" signal. Adder 890 has a first input terminal connected to the LOVS Counter 870 output terminal and a second input terminal connected to the HOVS Counter 865 output terminal. Comparator 895 has a first input terminal connected to the adder 890 output terminal and a second input terminal which receives a programmable "C" signal from Management Port 420.

An AND gate 812 has a first input terminal connected to the Comparator 875 output terminal, a second input terminal connected to the Comparator 880 output terminal, a third input terminal connected to the Comparator 885 output terminal, and an output terminal connected to the decrement (−) terminal of an Equalizer DAC Counter 905.

An AND gate 814 has a first input terminal connected to the Comparator 875 output terminal, a second input terminal connected to the Comparator 895 output terminal, and an output terminal connected to the increment (+) terminal of Equalizer DAC Counter 905.

An SR flip-flop 915 has an "S" terminal which receives a "RESET" signal to "S" input terminal, the output of AND gate 814 to "R" input terminal, and an output terminal connected to Equalizer DAC Counter 905 for driving the EQUALIZER TRAINING MODE signal. When the invention is in Adaptive Equalizer Training Mode, the EQUALIZER TRAINING MODE signal commands the output of Equalizer DAC Counter 905 to increase by steps of eight (8).

The output of Equalizer DAC Counter 905 is sent on eight (8) bit bus 408 to Equalizer DAC 410 and to the first input terminal of Comparator 820. The second input terminal of Comparator 820 receives a programmable "E" signal from Management Port 420. When the output of Equalizer DAC Counter 905 is greater than E, a HIGH is sent to the first input terminal of AND gate 818. The inverted EQUALIZER TRAINING MODE signal is sent to the second input terminal of AND gate 818. The output of AND gate 818 is sent to Equalizer 310 as the signal BOOST SELECT.

The FILTER SELECT signal is output from Equalizer DAC Counter 905 to Equalizer 310 and carries the value of the most significant bit (MSB) of bus 408. The inverted FILTER SELECT signal is sent to the first input of AND gate 816. EQUALIZER TRAINING MODE is sent to the second input terminal of AND gate 816. The output of OR gate 816 is the GAIN ATTENUATOR signal which is sent to Equalizer 310.

Figure 13B:
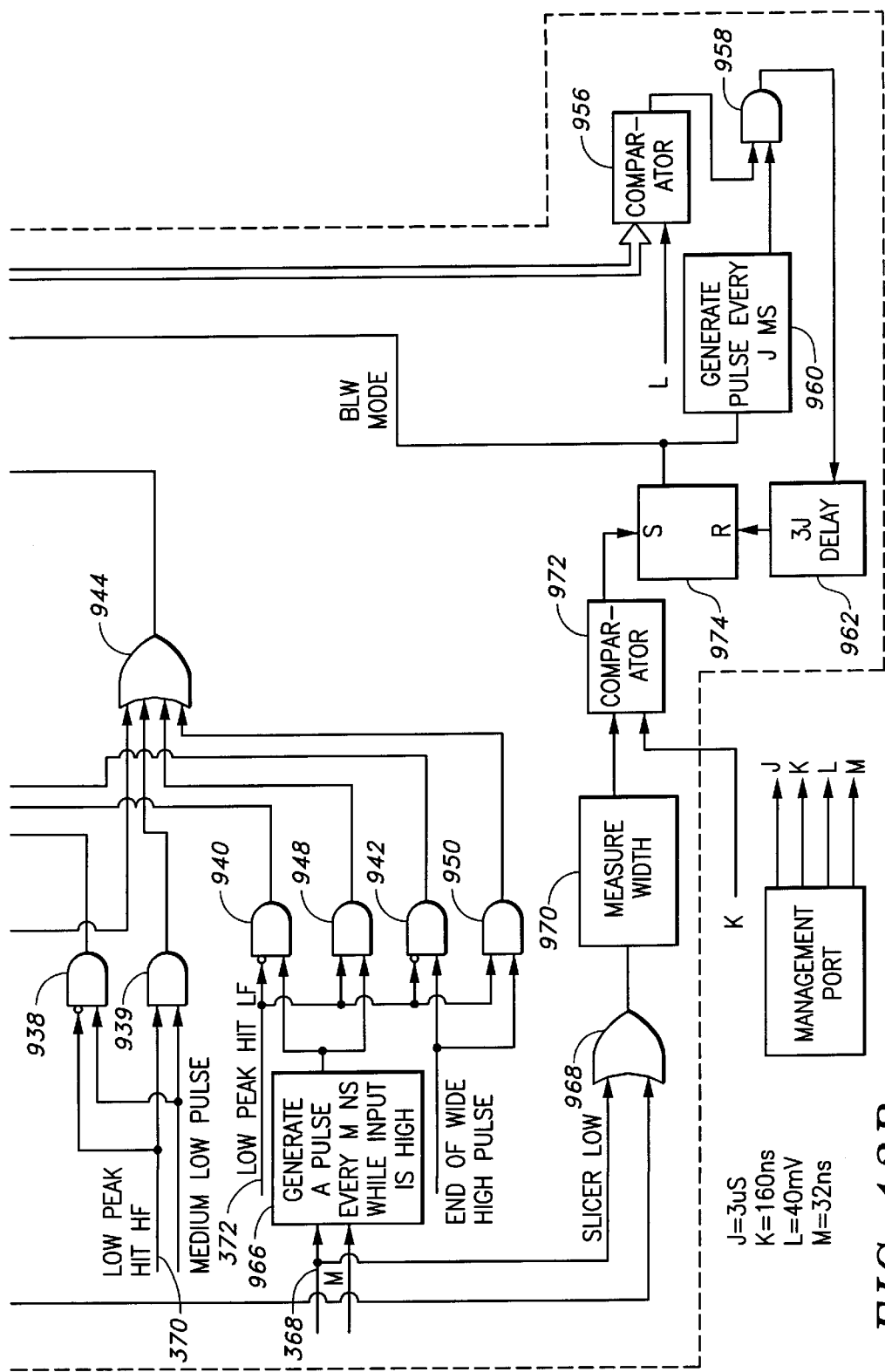
FIG. 13 shows elements of the BLW Control Block of FIG. 5.

FIG. 13 shows Baseline Wander (BLW) Control Block 565 according to a preferred embodiment of the invention. An OR gate 920 has its first input terminal connected to the output terminal of AND gate 921, its second input terminal connected to the output terminal of AND gate 922, its third input terminal connected to the output terminal of AND gate 924, and its fourth input terminal connected to the output terminal of AND gate 926.

An OR gate 928 has its first input terminal connected to the output terminal of AND gate 930, its second input terminal connected to the output terminal of AND gate 931, its third input terminal connected to the output terminal of AND gate 932, and its fourth input terminal connected to the output terminal of AND gate 934.

An OR gate 936 has its first input terminal connected to the output terminal of AND gate 945, its second input terminal connected to the output terminal of AND gate 938, its third input terminal connected to the output terminal of AND gate 940, and its fourth input terminal connected to the output terminal of AND gate 942.

An OR gate 944 has its first input terminal connected to the output terminal of AND gate 946, its second input terminal connected to the output terminal of AND gate 939, its third input terminal connected to the output terminal of AND gate 948, and its fourth input terminal connected to the output terminal of AND gate 950.

An OR gate 952 has its output terminal connected to the decrement (−) terminal of the baseline wander digital-to-analog (BLW DAC) Counter 953, its first input terminal connected to the output terminal of OR gate 928, and its second input terminal connected to the output terminal of OR gate 936.

An OR gate 954 has its output terminal connected to the increment (+) terminal of BLW DAC Counter 953, its first input terminal connected to the output terminal of OR gate 920, and its second input terminal connected to the output terminal of OR gate 944.

BLW Counter 953 has its output terminal connected to the input terminal of baseline wander digital-to-analog (BLW DAC) 417 via sixty-four (64) bit bus 413. BLW DAC 417 is implemented as a sixty-four (64) bit shift-register to operate at the fast rates and low switching noise to compensate for baseline wander.

The output of BLW Counter 953 is also connected to the first input terminal of Comparator 956. The second input terminal of Comparator 956 is configured to receive the programmable variable L. Typically, L is set to the digital equivalent of 40 millivolts.

AND gate 958 has its first input terminal connected to the output terminal of Comparator 956, its second input terminal connected to a pulse generating stage 960, and its output terminal connected to a delay circuit 962. Stage 960 is a divide-by-N counter off of a one megahertz clock.

The following eight (8) input signals to BLW Control Block 565 come from Synchronizer/Region Definer 550: HOVS, SHORT HIGH PULSE, MEDIUM HIGH PULSE, END OF HIGH WIDE PULSE, LOVS, SHORT LOW PULSE, MEDIUM LOW PULSE, and END OF WIDE LOW PULSE. The following six (6) input signals to .BLW Control Block 565 come from Waveform Analyzer Stage 350: HIGH PEAK HIT HF on line 362, HIGH PEAK HIT LF on line 364, SLICER HIGH on line 366, SLICER LOW on line 368, LOW PEAK HIT HF on line 370, and LOW PEAK HIT LF on line 372.

HOVS is received by the first input terminal (note bubble) of AND gate 921 and the first input terminal of AND gate 930. SHORT HIGH PULSE is received by the second input terminal of AND gate 92.1 and the second input terminal of AND gate 930. SHORT HIGH PULSE depends on the output of Comparator 430 (FIG. 6A) and delay elements 602 and 604 (FIG. 9). SHORT HIGH PULSE determines whether a pulse is less than or equal to twelve (12) nanoseconds wide.

HIGH PEAK HIT HF (line 362) is received by the first input terminal (note bubble) of AND gate 922 and by the first input terminal of AND gate 931. HIGH PEAK HIT LF (line 364) is received by the first input terminal (note bubble) of AND gate 924, by the first input terminal of AND gate 932, by the first input terminal (note bubble) of AND gate 926, and by the first input terminal of AND gate 934.

MEDIUM HIGH PULSE is received by the second input terminal of AND gate 922 and by the second input terminal of AND gate 931. MEDIUM HIGH PULSE depends on the output of Comparator 430 (FIG. 6A) and delay elements 602, 604, and 606 (FIG. 9). MEDIUM HIGH PULSE determines whether a pulse is less than or equal to sixteen (16) nanoseconds wide.

SLICER HIGH is driven into the input terminal of Pulse Generator 964. SLICER HIGH detects the leading-rising-edge of a pulse 335H. When 335H is detected, Pulse Generator 964 will generate a clock-wide pulse every M nanoseconds while SLICER HIGH is HIGH in order to sample above the peak or below the peak of the 335H. The preferred value for M is twenty-four (24) nanoseconds. M must be a multiple of the clock rate and is implemented by using counters. Pulse Generator 964 sends pulse signals to the second input terminal of AND gate 924 and the second input terminal of AND gate 932.

END OF HIGH WIDE PULSE is received by the second input terminal of AND gate 926 and by the second input terminal of AND gate 934.

LOVS is received by the first input terminal (note bubble) of AND gate 945 and the first input terminal of AND gate 946. SHORT LOW PULSE is received by the second input terminal of AND gate 945 and the second input terminal of AND gate 946. SHORT LOW PULSE depends on the output of Comparator 435 (FIG. 6A) and delay elements 618 and 624 (FIG. 9). SHORT LOW PULSE determines whether a pulse is less than or equal to twelve (12) nanoseconds wide.

LOW PEAK HIT HF (line 370) is received by the first input terminal (note bubble) of AND gate 938 and by the first input terminal of AND gate 939. LOW PEAK HIT LF (line 372) is received by the first input terminal (note bubble) of AND gate 940, by the first input terminal of AND gate 948, by the first input terminal (note bubble) of AND gate 942, and by the first input terminal of AND gate 950.

MEDIUM LOW PULSE is received by the second input terminal of AND gate 938 and by the second input terminal of AND gate 939. MEDIUM LOW PULSE depends on the output of Comparator 435 (FIG. 6A) and delay elements 618, 624, and 626 (FIG. 9). MEDIUM LOW PULSE determines whether a pulse is less than or equal to sixteen (16) nanoseconds wide.

SLICER LOW is driven into the input terminal of Pulse Generator 966. SLICER LOW detects the leading-falling-edge of a pulse 335L. When 335L is detected, Pulse Generator 966 will generate a clock-wide pulse every M nanoseconds while SLICER LOW is HIGH in order to sample above the peak or below the peak of the 335L. The preferred value for M is twenty-four (24) nanoseconds. M must be a multiple of the clock rate and is implemented by using counters. Pulse Generator 966 sends pulse signals to the second input terminal of AND gate 940 and the second input terminal of AND gate 948.

END OF WIDE LOW PULSE is received by the second input terminal of AND gate 942 and by the second input terminal of AND gate 950.

An OR gate 968 has a first input terminal for receiving SLICER LOW and second input terminal for receiving SLICER HIGH. OR gate 968 drives its output signal to the input terminal of a Pulse Measurement Circuit 970. At the end of a high or low pulse, Pulse Measurement Circuit 970 comprises a counter that holds the width of the pulse in multiples of clock.

Pulse Measurement Circuit 970 drives its output signal to the first input terminal of Comparator 972. A preferred value "K" is driven into the second terminal of Comparator 970. Typically, the value of K is 150 nanoseconds. Comparator 972 drives its output to the "S" (set) terminal of an SR flip-flop 974, while Delay Circuit 962 drives its output signal to the "R" (reset) terminal of SR flip-flop 374. Delay Circuit 962 delays the signal by 3 times "J" microseconds. The preferred value of J is 3 microseconds.

The output of SR flip-flop 374 is driven into the input terminal of a Pulse Generator 960 and to the "R" (reset) terminal of BLW DAC Counter 953. Pulse Generator 960 drives a pulse every J microseconds. The output of Pulse Generator 960 is received by the second terminal of AND gate 958.

The output of BLW DAC Counter 953 is received by the first input terminal of Comparator 956. A value "L" is received by the second terminal of Comparator 956. The preferred value of L is 40 millivolts. The output of Comparator 956 is received by the first terminal of AND gate 958.

Operation of the Invention

Before beginning adaptive equalization, Adaptive Equalizer System 300 (FIG. 5) undergoes a "Training Mode" after power-up. The Training Mode is split into a "Peak Training Mode" and an "Adaptive Equalizer Training Mode."

Typically, training is done on idle data which is sent to system 300 for one millisecond after power-up. After Training Mode terminates, system 300 initiates "Adaptive Equalizer Mode." Adaptive Equalizer Mode performs peak adjustment and adaptive equalization gain on output waveform 335 continuously and is only interrupted by compensations for baseline wander.

Figure 14A:
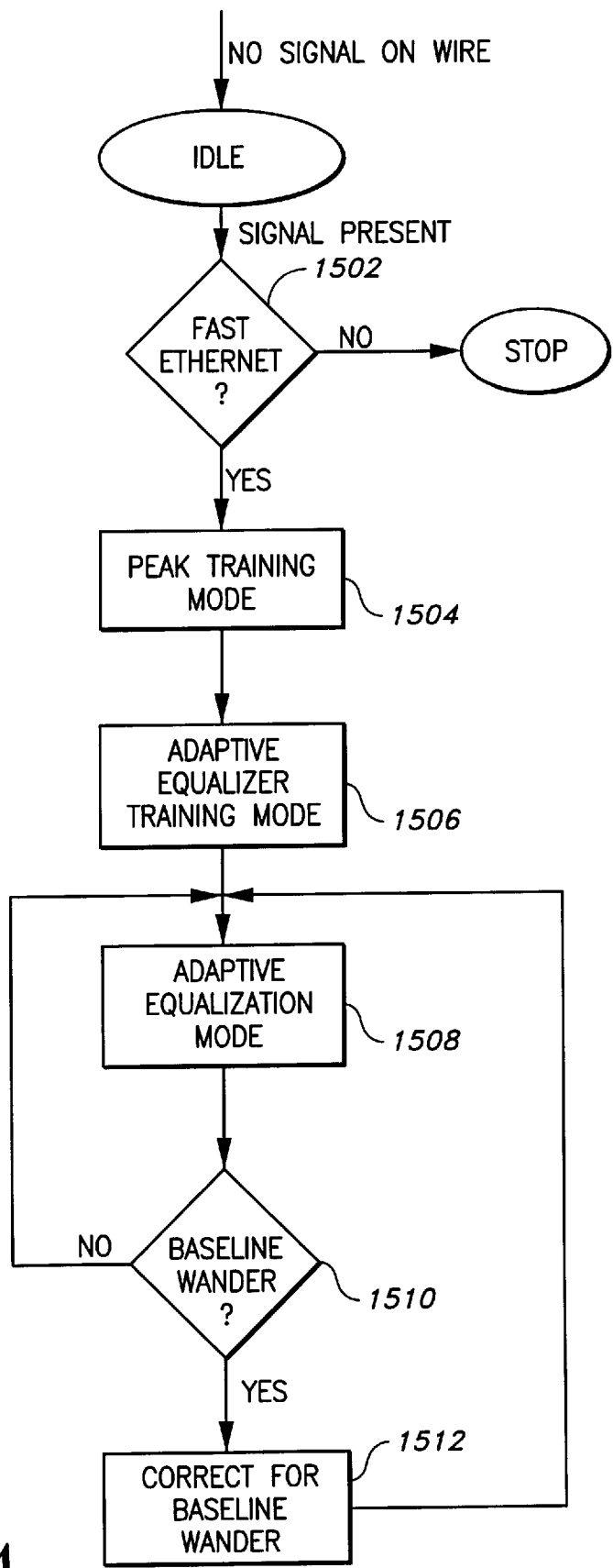
FIG. 14A is a flowchart illustrating steps in a method for how a computer implements the invention on an Ethernet LAN.

FIG. 14A is a flowchart illustrating system level steps in a method for how a computer, equipped with an Ethernet card using the ESI Line Interface Chip, implements the invention, Adaptive Equalizer System 300, on an Ethernet LAN, according to a preferred embodiment of the invention. According to the ISO-051 Reference Model, the components of Adaptive Equalizer System 300 reside at the physical layer of the model. The ISO-OSI Reference Model is fully incorporated herein by reference thereto as if repeated verbatim immediately hereinafter. System 300 is idle until a signal appears on the wire. Upon detection of a signal to a workstation on an Ethernet LAN, the method begins in step 1502.

In step 1502 the ESI Line Interface Chip determines whether Fast Ethernet (100 Mbps) is operating according to the IEEE Autonegotiation Standard. The Autonegotiation Standard is found in IEEE Standard 802.3U which is fully incorporated herein by reference thereto as if repeated verbatim immediately hereinafter. If Fast Ethernet is operating, Training Mode is initiated in step 1504. If Fast Ethernet is not operating, then the method waits until a Fast Ethernet signal is detected. When system 300 first detects a Fast Ethernet signal, it goes through a training period.

While data is being sent on the Ethernet, Adaptive Equalizer System 300 enters a Training Mode. It is period up to one millisecond where data is sent to a computer operating on the Ethernet LAN. Data is typically sent over a twisted pair medium through an RJ45 connection and isolation transformer before input into the ESI Line Interface Chip.

The Training Mode is comprised of a peak training period and an equalization training period. Both Peak Training Mode and Adaptive Equalizer Training Mode are typically completed before 200 microseconds after signal detect.

In step 1504 Adaptive Equalizer System 300 enters Peak Training Mode. During Peak Training Mode, HIGH PEAK and LOW PEAK for the pulses of waveform 335 are calibrated. System 300 starts with both peaks furthest from common mode 1000 and equalization set at minimum. HIGH PEAK is decremented every two microseconds until it goes below the high pulses of the MLT-3 waveform, and LOW PEAK is incremented every two microseconds until it goes above the low pulses of the MLT-3 waveform. Peak Training Mode is done when this result is achieved. No equalization is performed while system 300 is in Peak Training Mode.

After Peak Training Mode terminates, system 300 performs peak adjustment continuously (including during Adaptive Equalizer Training Mode), with the exception of when system 300 is in Baseline Wander Mode. To determine the setting of HIGH PEAK and LOW PEAK after the Training Mode of system 300 terminates, the two peak control blocks, HIGH PEAK Control 555 and LOW PEAK Control 560, find the moving average low frequency peak of high and low MLT-3 pulses. This is accomplished by defining a window of six (6) pulses for each high and low pulse. Within this window, statistics are gathered, and, at the end of the window, the peak (HIGH PEAK or LOW PEAK) may be moved based on these statistics. The low frequency region of a pulse, REGION C, in the preferred embodiment is considered to start 16 ns past the beginning of the pulse and end at 32 ns past the beginning of the pulse.

To compute HIGH PEAK, for each window of X=6 pulses, the system counts how many high pulses go above the moving average high peak in REGION C. Then, based on that count, HIGH PEAK may be moved. In the preferred embodiment, if the count is less than W=1, HIGH PEAK is moved up. If the count is greater than Y=1, HIGH PEAK is moved down. Otherwise, HIGH PEAK is not changed.

To compute LOW PEAK, for each window of X=6 pulses, the system counts how many high pulses go below the moving average low peak in REGION C. Then, based on that count, LOW PEAK may be moved. In the preferred embodiment, if the count is less than W=1, LOW PEAK is moved down. If the count is greater than Y=1, LOW PEAK is moved up. Otherwise, LOW PEAK is not changed.

After Peak Training Mode terminates, in step 1506 Adaptive Equalizer Training Mode initiates for the pulses of waveform 335. Equalizer Control Block 565 uses the moving average low frequency peak computed by HIGH PEAK Control 555 and LOW PEAK Control 560 to determine the equalization parameters sent to Equalizer 310. The high frequency peak of every incoming pulse is compared to the moving average low frequency peaks computed by the two peak control blocks.

The high frequency peak of a pulse in the preferred embodiment is the peak measured in the first eight (8) nanoseconds of a pulse, defined as REGION A. If a high pulse peak in REGION A goes above the average high peak, it is referred to as high overshoot (HOVS). If a low pulse peak in REGION A goes below the average low peak, it is referred to as low overshoot (LOVS). Statistics of overshoots are gathered over a window of B=32 pulses. At the end of the window, the logic in Equalizer Control Block 565 decides whether equalization should be changed.

In the preferred embodiment HOVS Counter 865 and LOVS Counter 870 keep track of high and low overshoots.

At the end of the window, if the total number of overshoots (LOVS plus HOVS) is less than C=3, system 300 is underequalized, and the equalization gain is increased via Equalizer DAC 410. At the end of the window, if LOVS is greater than A=4 and HOVS is greater than A=4, system 300 is overequalized, and the equalization gain is decreased. Otherwise, equalization is not changed. Typically, common mode shift can fool a conventional system into making errors in the compilation of overshoot statistics; however, the use of both LOVS and HOVS statistics by system 300 eliminates the possibility of error.

After the Training Mode terminates, Adaptive Equalizer System 300 initiates in step 1508 Adaptive Equalizer Mode. While the data is being received by the ESI Line Interface Chip, Adaptive Equalizer Mode computes HIGH PEAK and LOW PEAK and adjusts equalization of waveform 335 as needed. The algorithm for processing peaks in Adaptive Equalizer Mode is the same as that described above for adjusting peaks after Peak Training Mode has terminated. The algorithm for processing equalization in Adaptive Equalizer Mode is the same as described for Adaptive Equalizer Training Mode, except that the Adaptive Equalizer Training Mode algorithm increments the equalizer in steps of eight. Adaptive Equalizer Mode increments the equalizer in steps of one.

A decision is made in step 1510 as to whether baseline wander is occurring. If baseline wander is occurring, the method proceeds to step 1512 where the problem is compensated in Baseline Wander Mode. In Baseline Wander Mode, Adaptive Equalizer Mode is frozen, i.e., peak control algorithms and equalization control algorithms are frozen. If baseline wander is not occurring, the method goes back to step 1508.

Figure 14B:
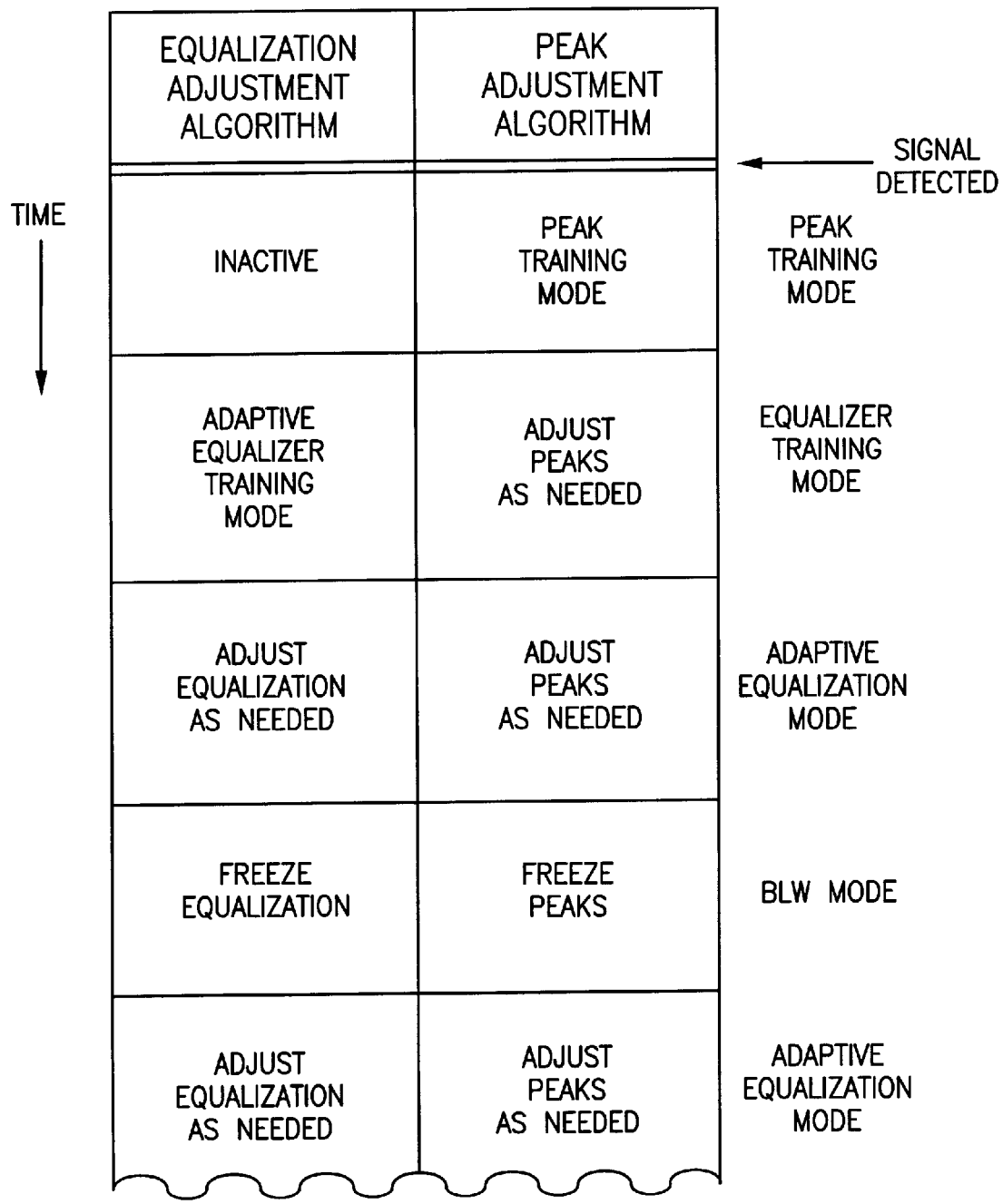
FIG. 14B is a block diagram illustrating how the invention proceeds in its operation through time.

FIG. 14B is a block diagram illustrating how the invention proceeds in its operation through time. FIG. 14B shows the same system level steps described in FIG. 14A.

Figure 15:
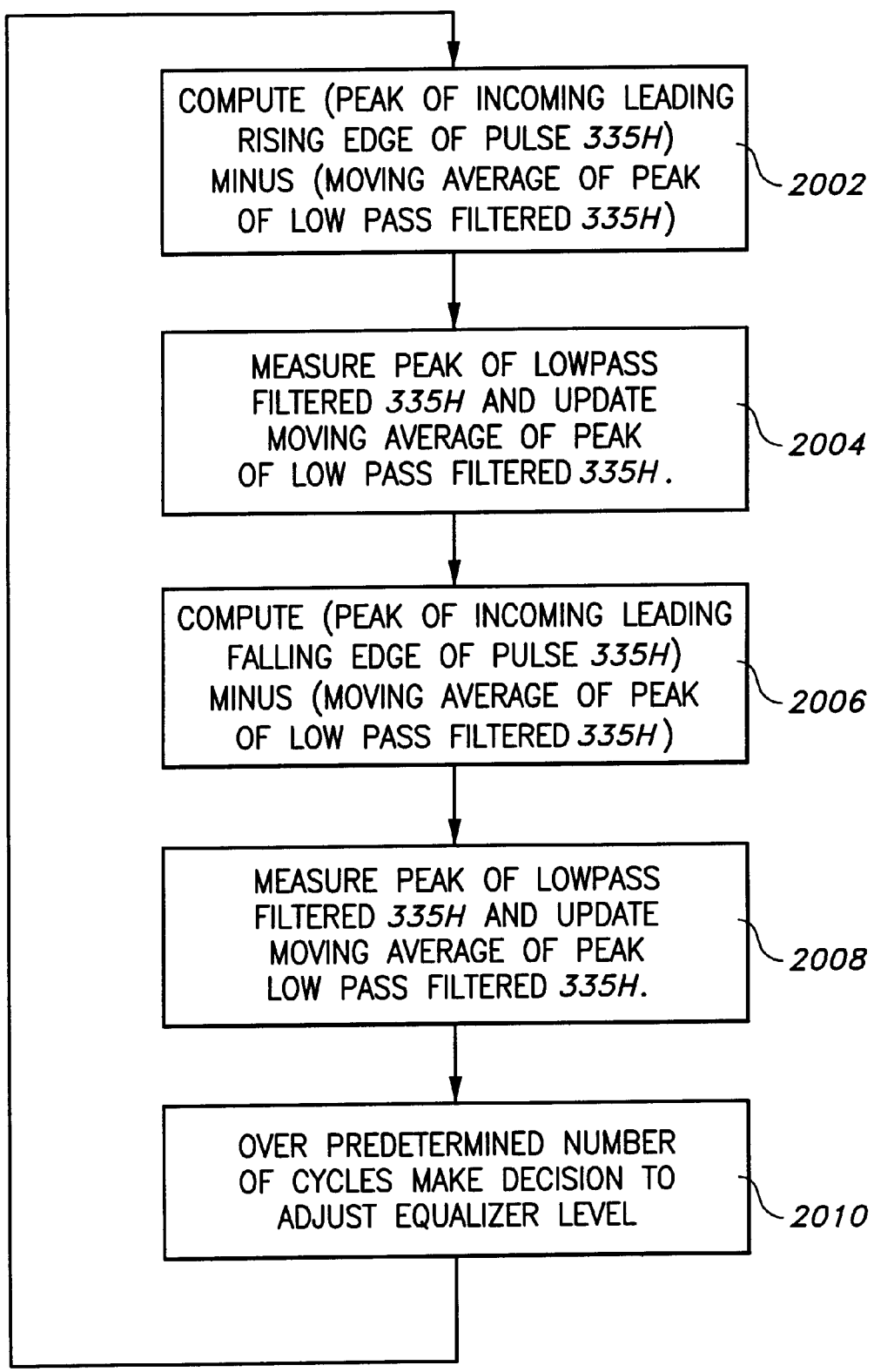
FIG. 15 is a flowchart illustrating steps in a method for implementing the Adaptive Equalizer Mode according to a preferred embodiment.

FIG. 15 is a flowchart illustrating steps in a method for implementing the Adaptive Equalizer Mode according to a preferred embodiment of the present invention. Adaptive Equalizer Mode refers to the concurrent operation of peak control after training and equalization control after training. FIG. 15 corresponds to step 1508 in FIG. 14A. In step 2002 the method begins by measuring the peak of an incoming leading-rising-edge of pulse 335H of waveform 335 (see FIG. 5) and subtracting the value from the moving average of the peak of a low-pass filtered pulse 335H. Next, in step 2004 the peak of a low-pass filtered, leading-rising-edge pulse, 335H, is measured, and the previous moving average value used in step 2002 is updated.

In step 2006 the method measures the peak of an incoming leading-falling-edge of pulse 335L of waveform 335 (see FIG. 5) and subtracts the value from the moving average of the peak of a low-pass filtered, leading-falling-edge pulse, 335L. Next, in step 2008 the peak of a low-pass filtered pulse 335L is measured and the previous moving average value used in step 2006 is updated. In step 2010, after a predetermined number of cycles, a decision is made by Adaptive Equalizer System 300 to adjust Equalizer 310 levels. The method then goes back to step 2002 and repeats.

Figure 24:
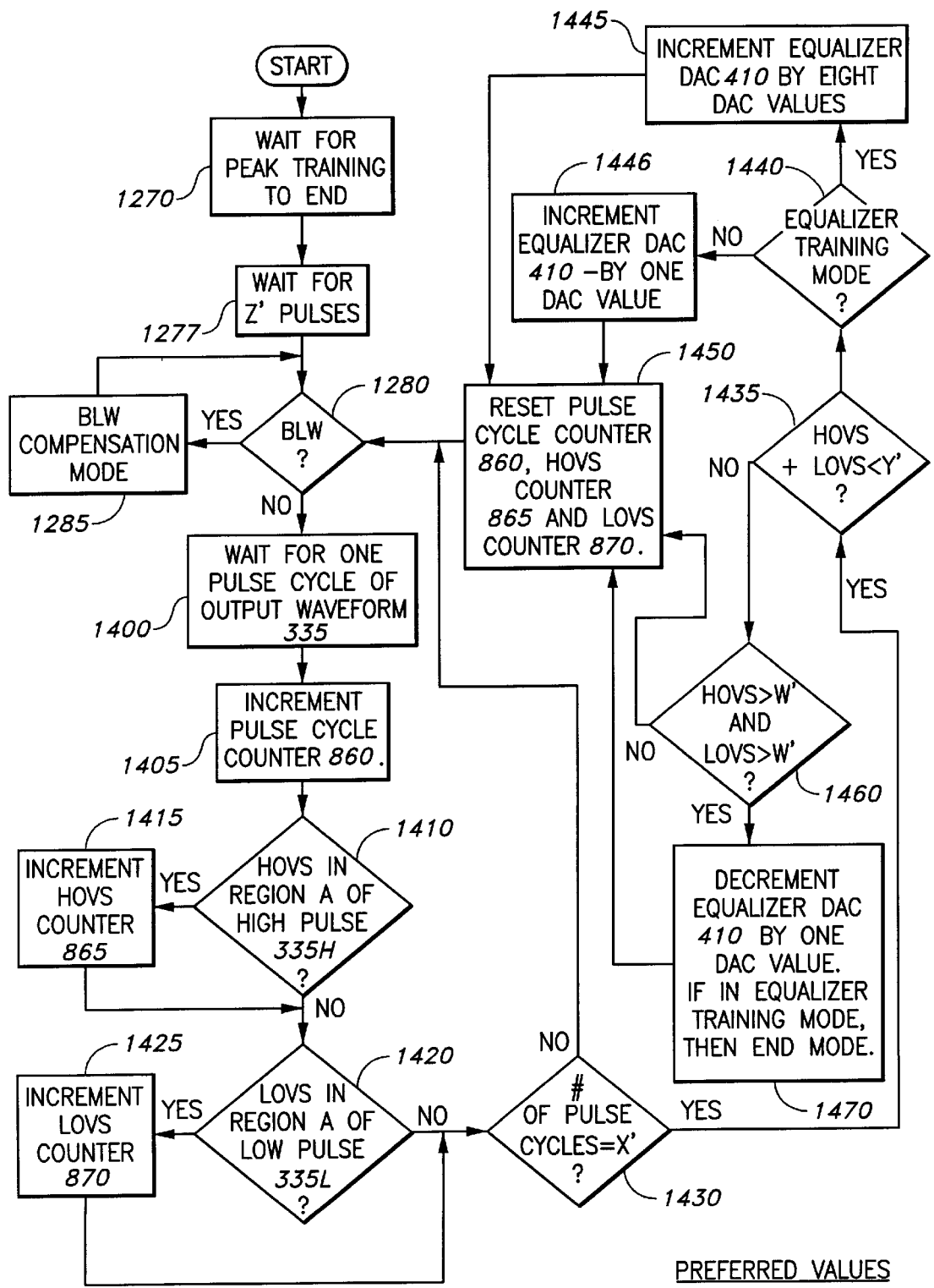
FIG. 24 is a flowchart illustrating steps in a method for implementing the Adaptive Equalizer Training Mode and for implementing equalization adjustment after training, according to a preferred embodiment.

Further, the method for implementing an Adaptive Equalizer System 300 according to a preferred embodiment of the present invention can be configured using two alternative subsets of the steps in FIG. 24. In one alternative, system 300 can be implemented using sequential steps 2002, 2004, and 2010. In another alternative, system 300 can be implemented using sequential steps 2006, 2008, and 2010.

Figure 16:
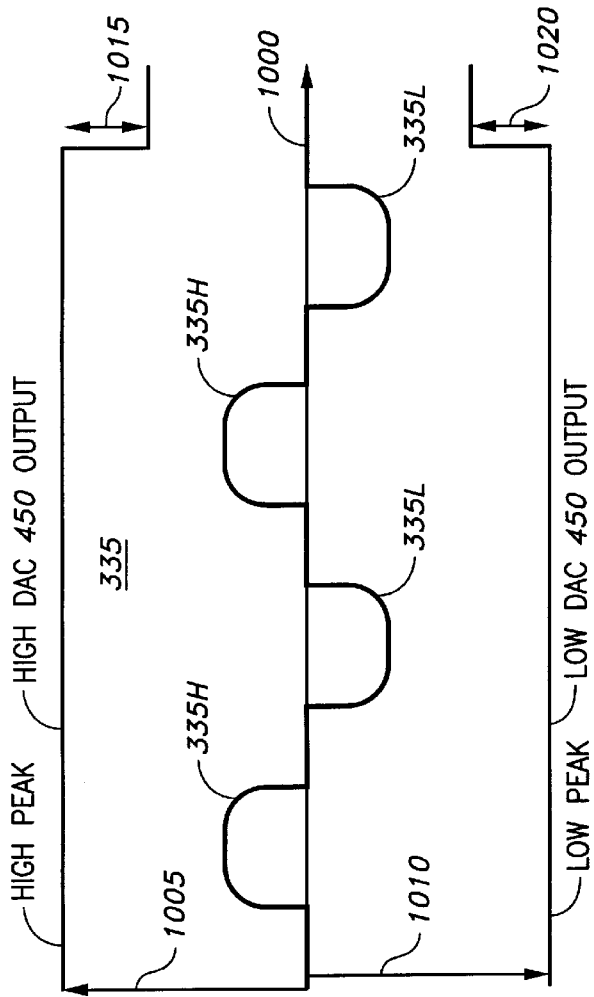
FIG. 16 shows the waveform 335 at the start of Peak Training Mode, after initial power-up or system reset.

FIG. 16 shows the waveform 335 at the start of Peak Training Mode. Peak Training Mode is initiated immediately after initial power up or system reset. High (positive) pulses 335H are data pulses above common mode level 1000, while low pulses 335L are data pulses below common mode level 1000. Since Equalizer 310 is set to the lowest gain during the Peak Training Mode, then, due to under-equalization and high frequency component loss, high pulses 335H and low pulses 335L will have rounded corners which vary in shape depending on the length of transmission line through which output waveform 335 has propagated.

During the Peak Training Mode, HIGH PEAK DAC 450 (FIG. 6A) is initially set to its maximum value (or scale) so that it generates the HIGH PEAK signal at an offset 1005, for example, at about 700 millivolts, above common mode level 1000. However, the HIGH PEAK signal may initiate at less than 700 millivolts above common mode level 1000. HIGH PEAK DAC 450 can decrement to a minimum value so that the HIGH PEAK signal is at about 200 millivolts above common mode level 1000. Thus, the HIGH PEAK signal can track a high pulse 335H with an amplitude ranging from about 200 millivolts to about 700 millivolts above common mode level 1000.

Similarly, LOW PEAK DAC 470 (FIG. 6A) is initially set to its minimum value so that it generates the LOW PEAK signal at an offset 1010, for example, at about 700 millivolts, below common mode level 1000. However, the LOW PEAK signal may initiate at less than 700 millivolts below common mode level 1000. LOW PEAK DAC 470 can increment to a maximum value so that the LOW PEAK signal is at about 200 millivolts below common mode level 1000. Thus, LOW PEAK DAC 470 can track a low pulse 335L with an amplitude ranging from about 700 millivolts to about 200 millivolts below common mode level 1000.

Since there is a 500 millivolts difference between the maximum and minimum DAC values for each of HIGH PEAK DAC 450 and LOW PEAK DAC 470, seven-bit DACs may be used to track output waveform 335 without sacrificing DAC resolution. Additionally, by initially setting the HIGH PEAK signal at preferably about 700 millivolts above common mode level 1000 and by setting the LOW PEAK signal at preferably about 700 millivolts below common mode level 1000, complexity in the digital logic design of the invention is reduced.

Upon power up, once signal is detected, every two micro-seconds, HIGH DAC Counter 655 (FIG. 10) decrements by eight DAC values the HIGH PEAK DAC 450 output so that the HIGH PEAK voltage level decreases in the direction of arrow 1015 towards common mode level 1000. Similarly, every two microseconds LOW DAC Counter 755 (FIG. 11) increments by eight DAC values the LOW PEAK DAC 470 output so that the LOW PEAK voltage level increases in the direction of arrow 1020 towards common mode level 1000. A timer (not shown) sets the programmable two micro-second time period when decreasing the HIGH PEAK voltage level and increasing the LOW PEAK voltage level.

Figure 17:
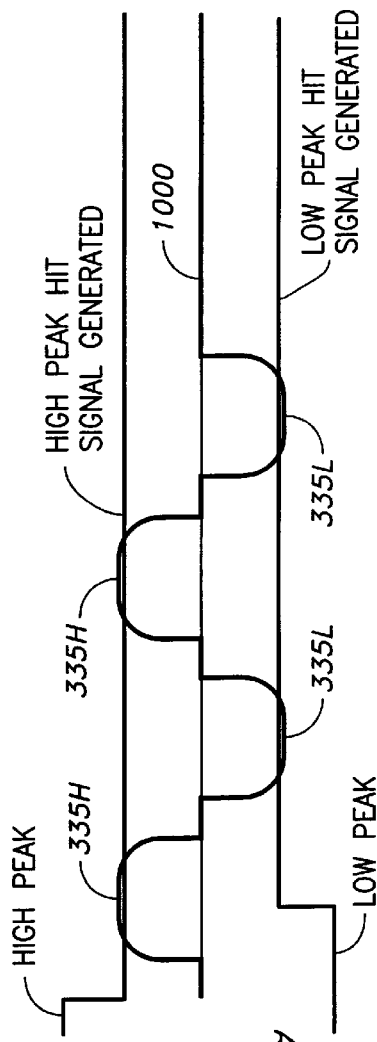
FIG. 17 shows the waveform 335 at the time Peak Training Mode terminates.

FIG. 17 shows the waveform 335 at the time Peak Training Mode terminates. FIG. 17 shows that the HIGH PEAK voltage level has decreased sufficiently to cross (or hit) a high pulse 335H. Similarly, the LOW PEAK voltage level has increased sufficiently to cross (or hit) a low, pulse 335L. When a high pulse 335H crosses the HIGH PEAK signal, Compound Comparator 425 (FIG. 6A) outputs the HIGH PEAK HIT LF and HIGH PEAK HIT HF signals for feedback to Digital Logic Control Stage 405. When a low pulse 335L crosses the LOW PEAK signal, Compound Comparator 440 (FIG. 6A) outputs the LOW PEAK HIT LF and LOW PEAK HIT HF signals for feedback to Digital Logic Control Stage 405.

Comparator 675 drives the HIGH PEAK HIT signal to reset SR flip-flop 650 (FIG. 10), thereby terminating the HIGH PEAK TRAINING MODE signal. Comparator 775 drives the LOW PEAK HIT signal to SR flip-flop 750 (FIG. 11), thereby terminating the LOW PEAK TRAINING signal. Thus, OR gate 580 (FIG. 8) terminates the PEAK TRAINING MODE signal being driven to Equalizer Control Block 565, thereby ending the Peak Training Mode.

Additionally, when the Peak Training Mode ends, HIGH PEAK DAC 450, which was previously decrementing by steps of eight DAC values, begins incrementing or decrementing by steps of one DAC value as the HIGH PEAK signal follows high pulses 335H. Similarly, LOW PEAK DAC 470, which was previously incrementing at steps of eight DAC values, will now increment or decrement at steps of one DAC value as the LOW PEAK signal follows low pulses 335L.

Once the Peak Training Mode terminates, Adaptive Equalizer System 300 undergoes a "settling period" before initiating the Adaptive Equalizer Training Mode. During the settling period, Equalizer 310 stays at lowest equalization value until 100 MLT-3 pulse cycles (programmable value) of output waveform 335 have propagated. The settling period permits HIGH PEAK DAC 450 and LOW PEAK DAC 470 to settle, since both DACs were previously changing at eight DAC values per two micro-seconds during the Peak Training Mode. After 100 pulse cycles of output waveform 335 (see FIG. 5) have propagated, the Adaptive Equalizer Training Mode initiates.

FIG. 18 is used to illustrate a method of adjusting the peaks of high pulses 335H and low pulses 335L, after Peak Training Mode has completed training, according to a preferred embodiment of the invention. Referring to FIG. 18, it shows the equalized output waveform 335, the four reference outputs of AAU 495 (i.e., HIGHPEAK, LOWPEAK, SLICER HIGH, SLICER LOW), and the common mode voltage 1000 of the equalized output waveform.

At the beginning of the Adaptive Equalizer Training Mode, Equalizer 310 activates and trains until it overequalizes output waveform 335 so that an overshoot 1100 appears at the rising edge of a high pulse 335H, and an overshoot 1105 appears at the falling edge of a low pulse 335L. When output waveform 335 is sufficiently overequalized, overshoot 1100 is about 20 millivolts (preferred value) above the voltage level of low frequency region peak 335HP of high pulse 335H, and overshoot 1105 is about 20 millivolts (preferred value) below the voltage level of low frequency region peak 335LP of low pulse 335L.

As stated above, the SLICER HIGH signal is set, preferably, at a voltage level equal to Equations 7A and 7B.

$$V_{HIGH\ SLICE} = \tfrac{3}{4}(V_{HIGH\ PEAK}) + \tfrac{1}{4}(V_{LOW\ PEAK}) \qquad \text{Eq. 7A}$$

$$V_{HIGH\ SLICE} = V_{HIGH\ PEAK} - \tfrac{1}{4}(V_{HIGH\ PEAK} - V_{LOW\ PEAK}) \qquad \text{Eq. 7B}$$

Similarly, as stated above, the SLICER LOW signal is set, preferably, at a voltage level equal to Equations 8A and 8B.

$$V_{LOW\ SLICE} = \tfrac{3}{4}(V_{LOW\ PEAK}) + \tfrac{1}{4}(V_{HIGH\ PEAK}) \qquad \text{Eq. 8A}$$

$$V_{LOW\ SLICE} = V_{LOW\ PEAK} + \tfrac{1}{4}(V_{HIGH\ PEAK} - V_{LOW\ PEAK}) \qquad \text{Eq. 8B}$$

The SLICER HIGH and SLICER LOW signals, along with the delay elements in Synchronizer/Region definer 550 (see FIG. 9), define REGION A, REGION B, and REGION C in high and low pulses 335H and 335L (see FIG. 18). Compound Comparator 425 (FIG. 6A) detects a high pulse 335H crossing HIGH PEAK in REGION A or in REGION C. Compound Comparator 440 (FIG. 6A) detects a low pulse 335L crossing LOW PEAK in REGION A or in REGION C. HIGH PEAK HIT LF 364 and LOW PEAK HIT LF 372 are used for REGION C and beyond.

REGION A, REGION B and REGION C are defined as three regions of a pulse 335H or 335L. The pulse regions are set to the values shown in the Synchronizer/Region Definer 550 (FIG. 9) in the preferred embodiment. REGION A is defined as the first eight (8) nanoseconds of a pulse. REGION B is defined as the eight (8) nanoseconds after REGION A. REGION C is defined as the sixteen (16) nanoseconds after REGION B. Thus, in one example, a high pulse 335H (or low pulse 335L) with an eight (8) nanosecond pulse width will only contain REGION A. Using another example, a high pulse 335H (or low pulse 335L) with a twenty-four (24) nanosecond pulse width will have an eight (8) nanosecond REGION A, an eight (8) nanosecond REGION B, and an eight nanosecond REGION C (i.e., rather than a sixteen nanosecond REGION C).

Sampling the first eight (8) nanoseconds (i.e., the REGION A portion) of a high pulse 335H of waveform 335 (see FIG. 5) or of a low pulse 335L is difficult to perform accurately, even with use of a high-speed clock (e.g., one Gigahertz). Sampling techniques fail because of frequency and phase differences between a clock and the pulses of waveform 335. Also, sampling using the local clock of Adaptive Equalizer System 300 is not useful because the local clock is asynchronous to incoming pulses from waveform 320.

Rather than using a clock, delay elements are used by Synchronizer/Region definer 550 to solve the timing problems associated with trying to sample waveform 335. To assure that the proper regions of a pulse are sampled, REGION A, REGION B, and REGION C are referenced to the tripping of mid-level Comparators 430 and 435, i.e., the rising edge of SLICER HIGH or SLICER LOW.

Changes in air temperature, voltage levels, and process parameters will cause delay elements to vary their delay parameters. Delay Line Calibration Circuit 380 (FIG. 7) assures that the delay elements in Synchronizer/Region Definer 550 are set at a predetermined delay by sending DELAY LINE BIAS over line 382 to each delay element. The delay elements in Synchronizer/Region Definer 550 (602, 604, 606, 608, 609, 618, 624, 626, 628, and 629) are calibrated by circuit 380 to compensate for environmental changes (e.g., temperature) or voltage changes to assure that the preferred delay is produced.

According to the invention, the SLICER HIGH input signal to Synchronizer/Region Definer 550 (FIG. 9) indicates the rising edge of high pulse 335H. Delay element 602 defines REGION A as the first eight (8) nanoseconds of high pulse 335H, which sends a digital HIGH to one input terminal of AND gate 612. HIGH PEAK HIT HF is sent to a second input terminal of AND gate 612 over line 362. When both input terminals of AND gate 612 are HIGH, AND gate 612 sends to HOVS Counter 865 a digital HIGH. High peak overshoot (HOVS) only occurs in REGION A. Similarly, delay element 618 defines REGION A of low pulse 335L using SLICER LOW and LOW PEAK HIT HF. The first eight nanoseconds of 335H is done to within ten percent accuracy by Delay Line Calibration Circuit 380 without the use of a clock.

Delay elements 604 and 606 define REGION B of high pulse 335H. REGION B is defined as the region between eight (8) nanoseconds and sixteen (16) nanoseconds, in the preferred embodiment. The existence of a high pulse 335H with REGION B qualifies by determining that 335H is at least 12 ns wide, as defined by delay elements 604 and 606. Similarly, delay elements 624 and 626 define REGION B of a low pulse 335L.

Delay elements 602, 604, 606, and 609 define REGION C of high pulse 335H. REGION C is defined as the region after sixteen (16) nanoseconds from the start of the pulse, in the preferred embodiment. The existence of a high pulse 335H with REGION C qualifies by determining that such 335H is at least 19 ns wide, as defined by delay elements 602, 604, 606, and 609. Similarly, delay elements 618, 624, 626, and 629 define REGION C of a low pulse 335L.

During the Adaptive Equalizer Training Mode, the HIGH PEAK signal (i.e., $V_{HIGH\ PEAK}$) continues to follow the average peak 335HP of a high pulse 335H. Thus, the HIGH PEAK DAC 450 value is within one Least Significant Bit (LSB) of the average peak 335HP value. High Pulse Counter 660 (FIG. 10) uses the signal HIGH PULSE WITH REGION C to increment for every propagating high pulse 335H with REGION C. Comparator 670 (FIG. 10) determines when six (preferred value X=6) high pulses 3.35H with REGION C have propagated by comparing the High Pulse Counter 660 value with its input signal X, where X=6.

For each of the six high pulses 335H with REGION C, if any of these six pulses register a HIGH PEAK HIT LF, then AND gate 600 (FIG. 9) outputs the HIGH PEAK HIT (REGION C) signal to increment High Peak Hit Counter 665 (FIG. 10). Comparator 675 (FIG. 10) determines if the HIGH PEAK HIT (REGION C) signal occurs more than once (i.e., Y=1 is the preferred value). Similarly, Comparator 685 (FIG. 10) determines if the HIGH PEAK HIT (REGION C) signal occurs less than once (i.e., W=1 is the preferred value). The variables Y and W may also be set to other values.

If the HIGH PEAK HIT (REGION C) signal occurs more than once (i.e., for Y=1) in the last six high pulses with REGION C, OR gate 680 (FIG. 10) increments High DAC Counter 655 (FIG. 10) by one DAC value. This increases the HIGH PEAK DAC 450 output value and moves the HIGH PEAK signal in the direction of arrow 1130 (FIG. 18). If the HIGH PEAK HIT (REGION C) signal does not occur (i.e., occurred less than W=1) in the last six high pulses with REGION C, OR gate 710 decrements High DAC Counter 655 by one DAC value. This decreases the HIGH PEAK DAC 450 output value and moves the HIGH PEAK signal in the direction of arrow 1135 (FIG. 18). If the conditions above do not occur, the output of High DAC Counter 655 does not change.

Similarly, during the Adaptive Equalizer Training Mode, the LOW PEAK signal (i.e., $V_{LOW\ PEAK}$) continues to follow the average peak 335LP of a low pulse 335L. Thus, the LOW PEAK DAC 470 value is within one Least Significant Bit (LSB) of the average peak 335LP value. Low Pulse Counter 760 (FIG. 11) uses the signal LOW PULSE WITH REGION C to increment for every propagating low pulse 335L with REGION C. Comparator 770 (FIG. 11) determines when six (preferred value X=6) low pulses 335L with REGION C have propagated by comparing the Low Pulse Counter 760 value with its input signal X, where X=6.

For each of the six low pulses 335L with REGION C, if any of these six pulses register a LOW PEAK HIT LF, then AND gate 622 (FIG. 9) outputs the LOW PEAK HIT (REGION C) signal to increment Low Peak Hit Counter 765 (FIG. 11). Comparator 775 (FIG. 11) determines if the LOW PEAK HIT (REGION C) signal occurs more than once (i.e., Y=1 is the preferred value). Similarly, Comparator 785 (FIG. 11) determines if the LOW PEAK HIT (REGION C) signal occurs less than once (i.e., W=1 is the preferred value). The variables Y and W may also be set to other values.

If the LOW PEAK HIT (REGION C) signal occurs more than once (i.e., for Y=1) in the last six low pulses with REGION C, OR gate 780 (FIG. 10) decrements Low DAC Counter 755 (FIG. 11) by one DAC value. This decreases the LOW PEAK DAC 470 output value and moves the LOW PEAK signal in the direction of arrow 1150 (FIG. 18). If the LOW PEAK HIT (REGION C) signal does not occur (i.e., occurred less than W=1) in the last six low pulses with REGION C, OR gate 805 increments Low DAC Counter 755 by one DAC value. This increases the LOW PEAK DAC 470 output value and moves the LOW PEAK signal in the direction of arrow 1155 (FIG. 18). If the conditions above do not occur, the output of Low DAC Counter 755 does not change.

Thus, according to the invention, the HIGH PEAK signal decrements, increments or does not change levels after every six propagating high pulses 335H with REGION C. Similarly, the LOW PEAK signal increments, decrements or does not change levels after every six propagating low pulses 335L with REGION C. The invention, therefore, avoids the problem encountered by conventional adaptive equalizers where a sparse-data patterned waveform 205 (FIG. 4) causes the peak detector's internal high peak signal 200 to overly decrement when data pulses are absent.

For every six (X=6) high pulses 335H with REGION C, the Comparator 670 output signal resets High Pulse Counter 660 and High Peak Hit Counter 665. High Pulse Counter 660 will then again count the next six (X=6) propagating high pulses 335H with REGION C, and High Peak Hit Counter 665 restarts the count of pulses registering HIGH PEAK HIT WITH REGION C.

Similarly, for every six low pulses 335L with REGION C, the Comparator 770 output signal resets Low Pulse Counter 760 and Low Peak Hit Counter 765. Low Pulse Counter 760 will then again count the next six propagating low pulses 335L with REGION C, while Low Peak Hit Counter 765 restarts the count of pulses registering LOW PEAK HIT WITH REGION C.

Figure 19:
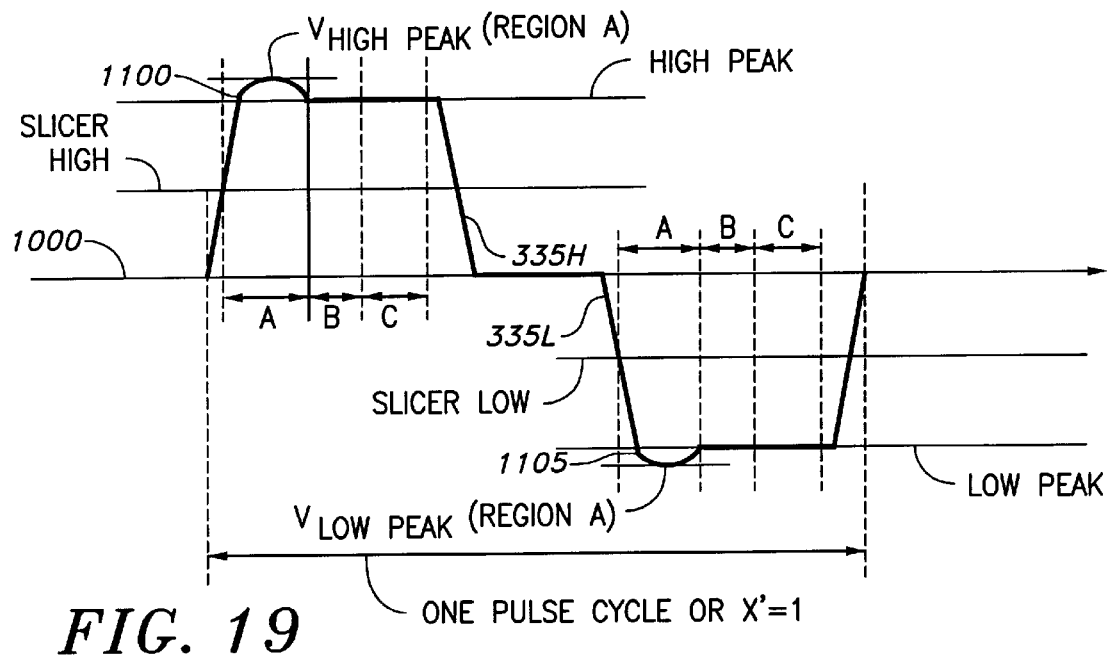
FIG. 19 is used to illustrate a method of determining adjustments in the equalization of high pulses 335H and of low pulses 335L.

FIG. 19 is used to illustrate a method of determining adjustments in the equalization of high pulses 335H and of low pulses 335L, according to a preferred embodiment of the invention. The invention uses peak statistics to equalize waveform 335. For each leading data pulse edge 335H and 335L, the invention compares the peak of the data edge in the first eight (8) nanoseconds to a reference level which is equal to the average low frequency voltage peaks. The first eight nanoseconds of a pulse is REGION A and is the high frequency region of a pulse.

High frequency leading edge peaks will form a distribution relative to the average low frequency peak. Proper equalization is defined as being achieved when, for an empirically predetermined number of data pulses (i.e., B=32), a approximately ten percent percentage (i.e., C=3) of the peaks of the leading rising or falling pulse edges will be some number of millivolts (i.e., 20 millivolts) above the average low frequency peak voltage level.

A problem arises in trying to determine when the peak of a particular data edge is 20 millivolts above the average peak. It is not practical to shift the data by 20 millivolts. Therefore, the invention shifts the reference level of Compound Comparator 425 and 440 (FIG. 6A) up by 20 millivolts in the first eight (8) nanoseconds of the waveform. In effect the overshoot function is used to define the boundary of the distribution of high frequency peaks for a window of data pulses.

Since the voltage of the outlying members of the peak distribution is known and well controlled by the equalization algorithm, the invention is assured that all other members of the peak distribution (i.e., 29 of 32) will fall in a peak voltage range between low frequency peak plus 20 millivolts and low frequency peak minus some millivolts. By setting the value of the overshoot, the invention statistically moves the waveform from a relative underequalized to overequalized state.

Referring to FIG. 19, it shows one MLT-3 pulse cycle (i.e., B=1 shown) of output waveform 335. Pulse Cycle Counter 860 (FIG. 12) will increment for every MLT-3 pulse cycle propagation of output waveform 335. Comparator 875 (FIG. 12) determines when thirty-two (preferred value B=32) pulse cycles have propagated by comparing the Pulse Cycle Counter 860 value with its input signal B =32.

Analog summing node 442 (FIG. 6A) will add the $I_{HIGH\ PEAK\ OFFSET}$ current to the $I_{HIGH\ PEAK}$ current to generate, in REGION A of a high pulse 335H, a HIGH-PEAK(REGION A) signal. HIGH-PEAK(REGION A) is shown in Equation 6 as $V_{HIGH\ PEAK}$ (REG. A) A voltage of 20 millivolts (preferred value) is the reduction in the voltage potential across R1; i.e., $R1(I_{HIGH\ PEAK\ OFFSET})$.

$$V_{HIGH\ PEAK\ (REG.\ A)} = V_{DD} - R1(I_{HIGH\ PEAK}) + R1(I_{HIGH\ PEAK\ OFFSET}) \quad \text{Eq. 6}$$

Similarly, analog summing node 448 will subtract the $I_{LOW\ PEAK\ OFFSET}$ current from the $I_{LOW\ PEAK}$ current to generate, in REGION A of a low pulse 335L, a LOW-PEAK(REGION A) signal. LOW-PEAK (REGION A) is shown in Equation 10 as $V_{LOW\ PEAK\ (REG.\ A)}$. A voltage of 20 millivolts (preferred value) is the additional potential voltage drop across R1; i.e., $R1(I_{LOW\ PEAK\ OFFSET})$.

$$V_{LOW\ PEAK\ (REG.\ A)} = V_{DD} - R1(I_{LOW\ PEAK}) - R1(I_{LOW\ PEAK\ OFFSET}) \quad \text{Eq. 10}$$

For every thirty-two MLT-3 pulse cycles (i.e., preferred B=32) of output waveform 335, the invention determines when an overshoot 1100 crosses the HIGH-PEAK(REGION A) signal and when an overshoot 1105 crosses the LOWPEAK(REGION A) signal. Thus, in REGION A of a high pulse 335H, Compound Comparator 425 (FIG. 6A) compares an overshoot 1100 voltage value to the HIGH-PEAK(REGION A) voltage value. If an overshoot 1100 crosses the HIGHPEAK(REGION A) signal, then AND gate 612 (FIG. 9) outputs the HOVS signal to increment HOVS Counter 865 (FIG. 12).

Similarly, in REGION A of a low pulse 335L, Compound Comparator 440 (FIG. 6A) compares an overshoot voltage 1105 voltage value to the voltage value of the LOW-PEAK (REGION A) signal. If an overshoot 1105 crosses the LOW-PEAK(REGION A) signal, then AND gate 616 (FIG. 9) outputs the LOVS signal to increment LOVS counter 870 (FIG. 12).

For every thirty-two programmable pulse cycles (i.e., preferred B=32) of output waveform 335, the invention determines whether the overshoot 1100/HIGH-PEAK (REGION A) signal crossings and an overshoot 1105/LOW-PEAK(REGION A) signal crossings sum is less than three occurrences (programmable value C). Adder 890 (FIG. 12) sums the output of HOVS Counter 865 and LOVS Counter 870. Comparator 895 will then compare the adder 890 output value with its C=3 input signal to determine if the HOVS Counter 865 output and LOVS Counter 870 output sum is less than three. Similarly, Comparators 880 and 885 see that LOVS and HOVS are each greater than A=4. The method of operation of the invention depends on the conditions described below.

Condition 1: System 300 is Underequalized HOVS+LOVS<C (Adaptive Equalizer Training Mode is Active)

If the overshoot 1100/HIGH-PEAK(REGION A) signal crossings and overshoot 1105/LOW-PEAK(REGION A) signal crossings sum is less than C=3 and the invention is in the Adaptive Equalizer Training Mode, then the AND gate 910 (FIG. 12) output will increment Equalizer DAC Counter 905 to increase the Equalizer DAC 410 output by eight DAC values, thereby increasing the voltage level of overshoot 1100 and increasing the negative voltage level of overshoot 1105. The invention will then reset Pulse Cycle Counter 860, HOVS Counter 865 and LOVS Counter 870. Pulse Cycle Counter 860 will then again count the next thirty-two (32) pulse cycles of output waveform 335. For each thirty-two (32) pulse cycles, HOVS Counter 865 and LOVS Counter 870 will again count the occurrences of overshoot 1100/HIGH-PEAK(REGION A) signal crossings and overshoot 1105/LOW-PEAK(REGION A) signal crossings, respectively, to permit the invention to properly equalize output waveform 335.

Condition 2: System 300 is Underequalized HOVS+LOVS<C (Adaptive Equalizer Training Mode has Terminated)

If the overshoot 1100/HIGH-PEAK(REGION A) and overshoot 1105/LOW-PEAK(REGION A) signal crossings sum is less than C=3 and if the invention is no longer in the Adaptive Equalizer Training Mode, then the AND gate 814 (FIG. 12) output will increment Equalizer DAC Counter 905 to increase Equalizer DAC 410 output by one DAC value to increase equalization of output waveform 335. The invention will then reset Pulse Cycle Counter 860, HOVS Counter 865 and LOVS Counter 870, and again determine the proper equalization based on the next thirty-two pulse cycles (i.e., preferred B=32).

Condition 3: HOVS or LOVS is greater than A and DC shift in common mode level 1000 occurs If at the end of the window of thirty-two pulse cycles (preferred B=32), either HOVS or LOVS is greater than A=4, but both are not greater than A=4, this indicates that there may be a problem with common mode level 1000. Equalizer 310 will not change equalization value until the peak algorithm has corrected the peaks for common mode, or common mode 1000 goes back to normal, as indicated by HOVS and LOVS tracking more closely.

Condition 4: System 300 is Overequalized HOVS is greater than A, and LOVS is greater than A, and DC shift in common mode level 1000 does not occur, and Adaptive Equalizer Training Mode is Active If the overshoot 1100/HIGH-PEAK(REGION A) signal crossings total is greater than A=4, and if the overshoot 1105/LOW-PEAK(REGION A) signal crossings total is greater than A=4, then output waveform 335 is overequalized, and the next step of the invention depends on whether the Adaptive Equalizer Training Mode is still active. If the invention is in the Adaptive Equalizer Training Mode, then the Adaptive Equalizer Training Mode terminates, and the Comparator 875 (FIG. 12) output signal through OR gate 810 then resets Pulse Cycle Counter 860, HOVS Counter 865 and LOVS Counter 870. The invention will again count the overshoot 1100/HIGH-PEAK(REGION A) and overshoot 1105/LOW-PEAK(REGION A) signal crossings sum for thirty-two (32) pulse cycles to determine the proper equalization for output waveform 335. See Condition 5 (below) for the scenario where the Adaptive Equalizer Training Mode is inactive.

Condition 5: System 300 is Overequalized

HOVS is greater than A, and LOVS is greater than A, and DC shift in common mode level 1000 does not occur, and Adaptive Equalizer Training Mode has terminated If the overshoot 1100/HIGH-PEAK(REGION A) signal crossings total is greater than A=4, and if the overshoot 1105/LOW-PEAK(REGION A) signal crossings total is greater than A=4 and the Adaptive Equalizer Training Mode has terminated, then the AND gate 812 output signal decrements Equalizer DAC Counter 905 (FIG. 12) so that the equalizer DAC 410 output decreases by one DAC value for proper equalization of waveform 335. The invention then resets Pulse Cycle Counter 860, HOVS Counter 865 and LOVS Counter 870. The invention will again count the overshoot 1100/HIGH-PEAK(REGION A) and overshoot 1105/LOW-PEAK(REGION A) signal crossings sum for the next thirty-two (32) pulse cycles to determine the proper equalization for output waveform 335.

If the conditions above for thirty-two (32) pulse cycles do not occur, then the output waveform 335 is properly equalized and the equalizer DAC 410 output value is not incremented or decremented.

The invention may optionally ignore measuring overshoots 1100 when the HIGH PEAK signal is below peak 335HP in REGION C of a high pulse 335H. Similarly, the invention may optionally ignore measuring overshoots 1105 when the LOW PEAK signal is above peak 335LP in REGION C of a low pulse 335L. As another option, when performing the above-mentioned steps to determine equalization, the invention may use only pulses with REGION C.

According to a preferred embodiment of the invention as shown in FIG. 6A, Compound Comparator 425 has two outputs: HIGH PEAK HIT HF and HIGH PEAK HIT LF. HIGH PEAK HIT HF goes HIGH when a high pulse 335H crosses HIGH PEAK in REGION A. HIGH PEAK HIT LF goes HIGH when low pulse 335L crosses HIGH PEAK in REGION C and beyond. Similarly, Compound Comparator 440 does the equivalent for a low pulse 335L.

Comparator 430 detects when a high pulse 335H crosses SLICER HIGH. Similarly, Comparator 435 detects when a low pulse 335L crosses SLICER LOW. After training is completed, the function of Comparators 430 and 435 are to define the beginning and end of each pulse by output signals SLICER HIGH and SLICER LOW. Comparators 430 and 435 also output the binary data lines 366 and 368 of system 300, which are used by the Clock Recovery Module (not shown) in the ESI Line Interface Chip. In a less preferred embodiment of the invention, additional comparators may be used for separately detecting crossings in REGION A and in REGION C. However, offset problems may occur in CMOS embodiments.

Figure 20:
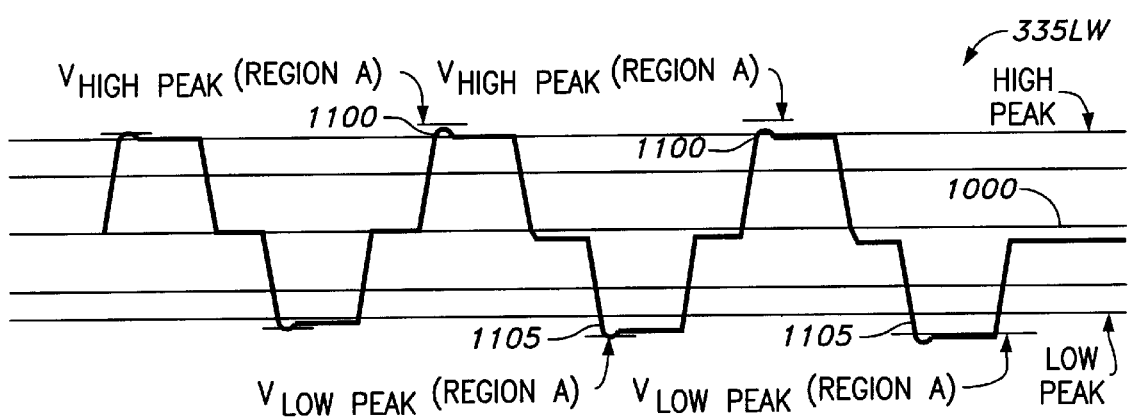
FIG. 20 is a data waveform which shifts downward from the common mode level due to "wobble;"
Figure 21:
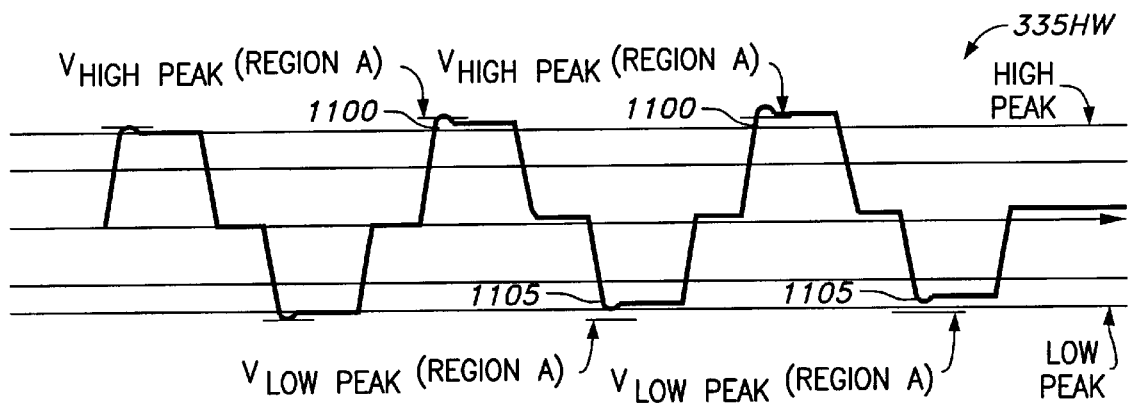
FIG. 21 is a data waveform which shifts upward from the common mode level due to wobble.

FIG. 20 shows an output waveform 335LW shifting downward from common mode level 1000 as a result of wobble, while FIG. 21 conversely shows an output waveform 335HW shifting upward from common mode level 1000 due to wobble. When a waveform 335 with a relative scarcity of transitions is propagating, the high-pass filter characteristics of a cabling system's transformer will cause wobble. As a result of the wobble in FIG. 20, overshoots 1105 will begin crossing the LOW-PEAK(REGION A) signal, while overshoots 1100 no longer cross the HIGH-PEAK(REGION A) signal.

FIG. 21 shows how wobble causes overshoots 100 to begin crossing the HIGH-PEAK(REGION A) signal, while overshoots 1105 no longer cross the LOW-PEAK(REGION A) signal. Since the invention detects both overshoots, i.e., 1100/HIGH-PEAK(REGION A) crossings, and overshoots, i.e., 1105/LOW-PEAK(REGION A) crossings, before increasing or decreasing equalization, waveforms 335LW and 335HW will not be inaccurately detected as overequalized waveforms.

Figure 22:
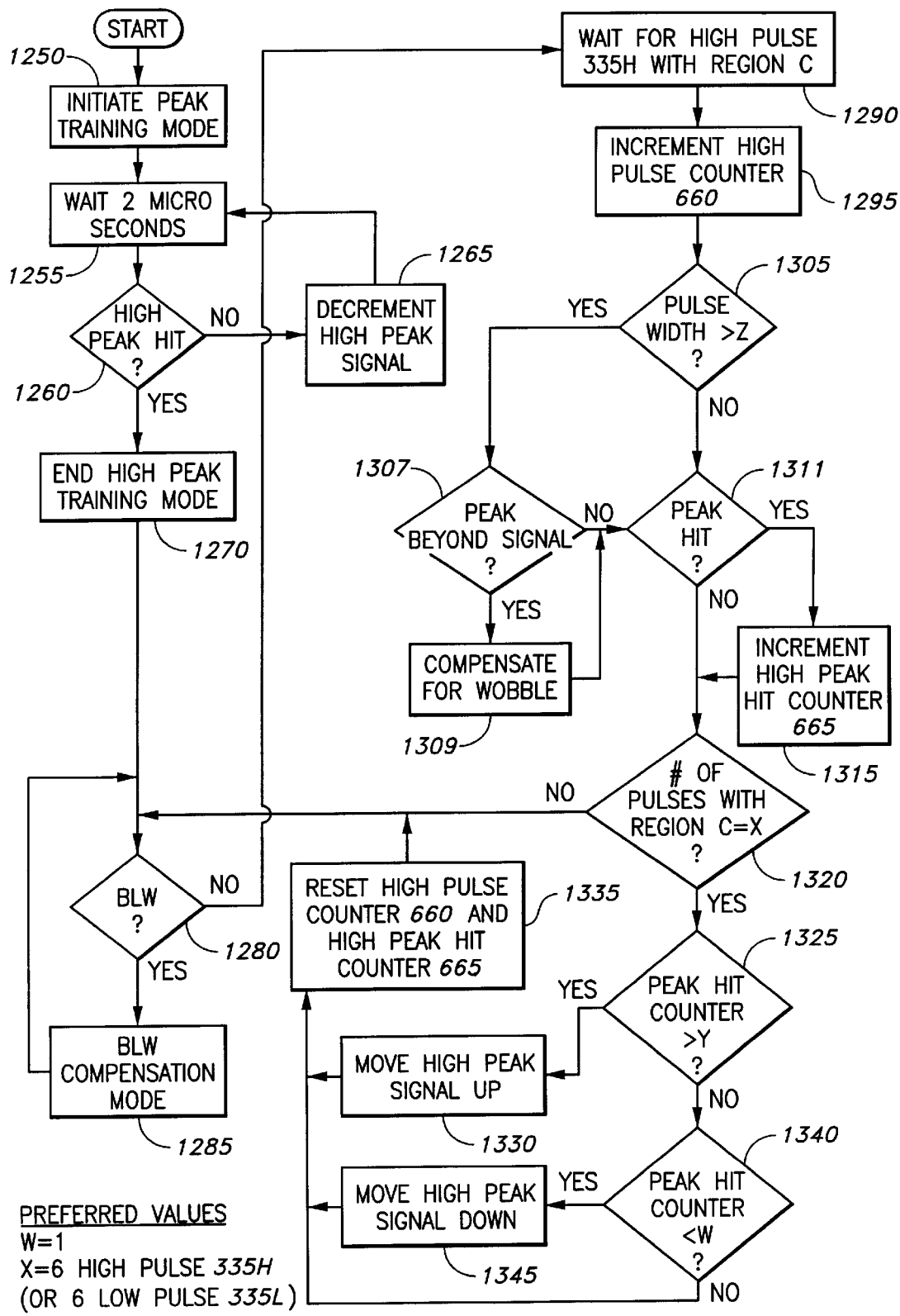
FIG. 22 is a flowchart illustrating steps in a method for implementing the Peak Training Mode and for implementing peak adjustment after training, for high (positive) pulses of the output waveform of the invention according to a preferred embodiment.
Figure 23:
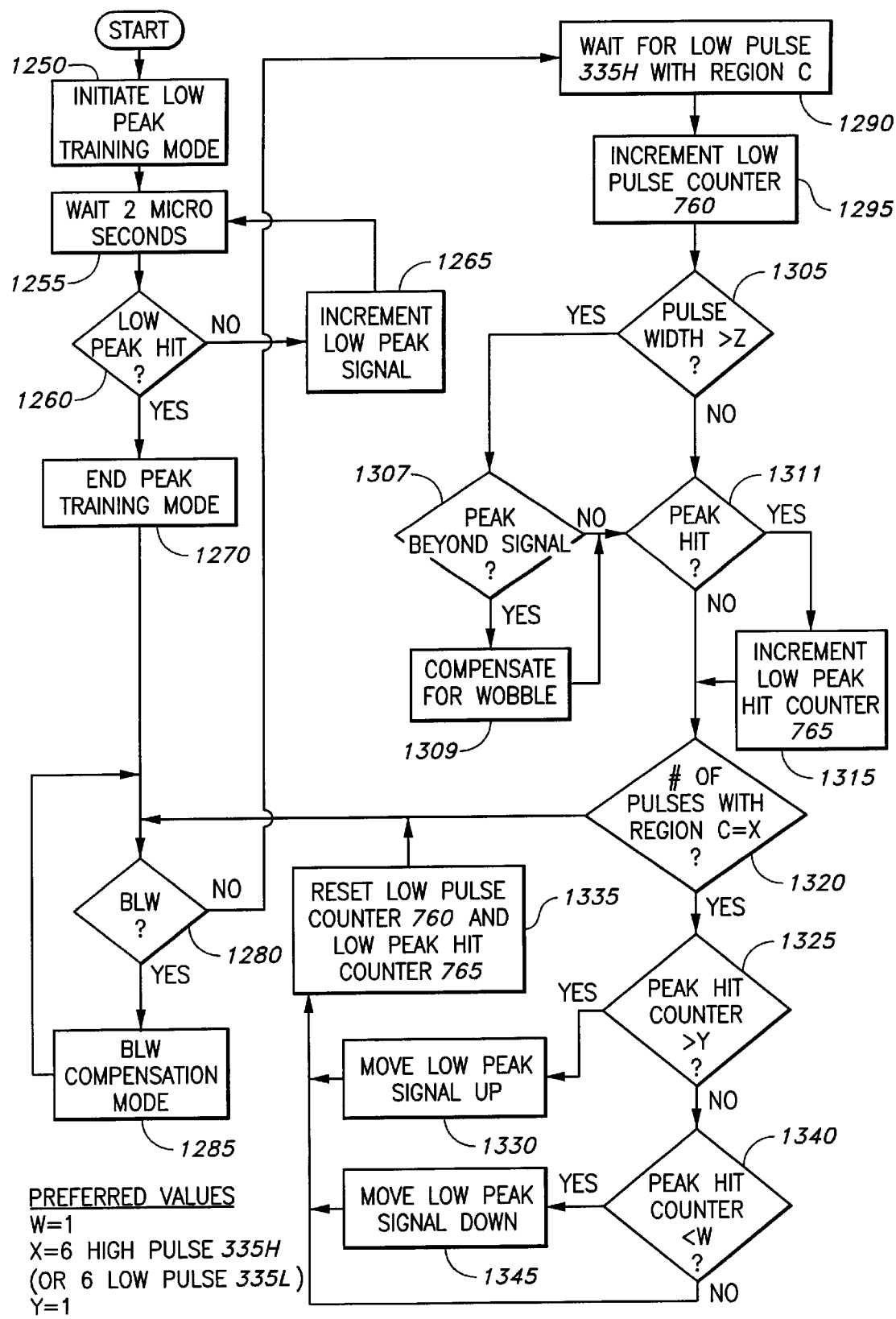
FIG. 23 is a flowchart illustrating steps in a method for implementing the Peak Training Mode and for implementing peak adjustment after training, for low pulses of the output waveform of the invention according to a preferred embodiment.

FIG. 22 is a flowchart illustrating steps in a method for implementing peak adjustments when following high pulses 335H, i.e., setting the signal HIGHPEAK, according to a preferred embodiment. FIG. 23 corresponds to how the invention implements peak adjustment from step 1504 through step 1512 in FIG. 14A.

Referring to FIG. 22, in step 1250 the invention initiates the Peak Training Mode. The system reset signal is driven into SR flip-flop 650 (FIG. 10) to initiate the HIGH PEAK TRAINING MODE signal (and into SR flip-flop 750 to initiate the LOW PEAK TRAINING MODE signal).

In step 1255 the HIGH PEAK signal waits for two micro-seconds while high pulses 335H propagate. In step 1260 the invention determines if a high pulse 335H crosses (or hits) the HIGH PEAK signal during the two microsecond wait time. If not, then in step 1265 the HIGH PEAK signal is decremented towards output waveform 335. From step 1265 the invention returns to step 1255 during which the HIGH PEAK signal waits for two micro-seconds while high pulses 335H propagate. If in step 1260 a high pulse 335H crosses HIGH PEAK signal, or a low pulse 335L crosses the LOW PEAK signal, then in step 1270 the corresponding Peak Training Mode ends.

An occurrence of baseline wander in output waveform 335 may be sensed in step 1280 (actual detection done by BLW Control Block 570). If baseline wander is detected, then in step 1285 peak adjustment is suspended while the BLW algorithm operates. In step 1290 the invention tests and waits for a propagating high pulse 335H with REGION C, and upon detection in step 1295, increments HIGH PULSE Counter 660 (FIG. 10). In step 1305 if a high pulse 335H has a width longer than eight (8) bit times (preferred value Z=8), then the method proceeds to step 1307. In step 1307 a decision is made whether the signal 335H crosses HIGHPEAK or whether the signal 335L crosses LOW-PEAK. If the signal 335H or 335L crosses HIGH PEAK or LOW PEAK respectively, then the invention may compensate for detected wobble in step 1309. By definition, baseline wander is an exaggerated case of wobble. Wobble is measured on a scale of tens of millivolts, whereas baseline wander is measured on a scale of hundreds of millivolts.

Beginning with step 1311, the HIGH PEAK signal tracks high pulses 335H by detecting when of a high pulse 335H with REGION C crosses (or hits) the HIGH PEAK signal. If so, then in step 1315 HIGH PEAK HIT Counter 665 (FIG. 10) is incremented and the invention proceeds to step 1320. If the HIGH PEAK HIT (REGION C) signal does not occur, the invention proceeds from step 1311 to step 1320.

In step 1320 the invention determines if six (preferred value X=6) high pulses 335H with REGION C have propagated. If not, then the invention returns to step 1280. If so, then the invention proceeds to step 1325 to determine if the HIGH PEAK HIT (REGION C) signal occurs more than once (preferred value Y=1). If Y=1 crossing occurs, then the invention proceeds to step 1330 during which HIGH DAC Counter 655 (FIG. 10) increments HIGH PEAK DAC 450 (FIG. 6) by one DAC value to move the HIGH PEAK signal upward from output waveform 335. The invention then proceeds to step 1335 during which the invention resets HIGH PULSE Counter 660 and HIGH PEAK HIT Counter 665. The invention then proceeds from step 1335 to step 1280.

If in step 1325 the HIGH PEAK HIT (REGION C) signal has not occurred, the invention proceeds to step 1340 to determine if the HIGH PEAK HIT (REGION C) signal occurs less than W=1 time. If so, then in step 1345 HIGH DAC Counter 655 decrements HIGH PEAK DAC 450 by one DAC value to move the HIGH PEAK signal down towards output waveform 335, and the invention then proceeds to step 1335. If in step 1340 the HIGH PEAK HIT (REGION C) does occur, the invention proceeds directly to step 1335, in which case HIGH PEAK DAC 450 is not changed.

FIG. 23 is a flowchart illustrating steps in a method for implementing peak adjustments when following low pulses 335L, i.e., setting the signal LOWPEAK, according to a preferred embodiment. The steps in the flowchart of FIG. 23 correspond to the discussion of the steps in the flowchart of FIG. 22. FIG. 23 corresponds to how the invention implements peak adjustment from step 1504 through step 1512 in FIG. 14A. Peak Training Mode ends when both HIGH PEAK and LOW PEAK training modes have independently ended.

FIG. 24 is a flowchart illustrating steps in a method for adjusting the equalization of output waveform 335, according to a preferred embodiment of the invention. FIG. 24 corresponds to how the invention implements equalization adjustment from step 1506 through 1512 in FIG. 14A. Referring to FIG. 24, in step 1270 the invention waits for Peak Training Mode to end. The invention then waits in step 1277 for 64 pulses to pass. An occurrence of baseline wander in output waveform 335 may be detected in step 1280. If baseline wander is detected, then in step 1285 determination of equalization is suspended while the BLW algorithm operates.

The invention will wait in step 1400 for one MLT-3 pulse cycle of output waveform 335 and will increment in step 1405 Pulse Cycle Counter 860 (FIG. 12) when one pulse cycle propagates. In step 1410 if an overshoot 1100 crosses the HIGH-PEAK(REGION A) signal, then AND gate 612 (FIG. 9) produces the HOVS signal. If so, the invention proceeds to step 1415 during which the HOVS signal increments HOVS Counter 865 (FIG. 12). The invention then proceeds to step 1420. If in step 1410 an overshoot 1100 does not cross the HIGH-PEAK(REGION A) signal, then the invention proceeds directly to step 1420.

In step 1420 if an overshoot 1105 crosses the LOW-PEAK (REGION A) signal, then AND gate 616 (FIG. 9) produces the LOVS signal. The invention proceeds to step 1425 during which the LOVS signal increments LOVS Counter 870 (FIG. 12) The invention then proceeds to step 1430. If in step 1420 an overshoot 1105 does not cross the LOW-PEAK(REGION A) signal, then the invention proceeds directly to step 1430.

In step 1430 the invention determines if the number of pulse cycles which have propagated, as indicated by the Pulse Cycle Counter 860, is equal to thirty-two (preferred value B=32). If the number is not equal to thirty-two (B=32), then the invention proceeds from step 1430 to step 1280 and then to step 1400 to test for additional pulse cycles of output waveform 335.

If in step 1430 the number of pulse cycles which have propagated is equal to thirty-two (B=32), then the invention proceeds to step 1435 during which the invention determines if the sum of the overshoot 1100/HIGH-PEAK(REGION A) signal crossings and of the overshoot 1105/LOW-PEAK (REGION A) signal crossings is less than three (programmable value C). If so, output waveform 335 is underequalized and the invention proceeds to step 1440. If the invention is in the Adaptive Equalizer Training Mode, then the invention proceeds from step 1440 to step 1445 during which Equalizer DAC 905 (FIG. 12) increments by eight DAC values the equalizer DAC 410 output signal to increase equalization of output waveform 335. In step 1450 Pulse Cycle Counter 860, HOVS Counter 865 and LOVS Counter 870 are reset. The invention then proceeds to step 1280.

If in step 1440 the Adaptive Equalizer Training Mode has terminated, then in step 1446 Equalizer DAC Counter 905 (FIG. 12) increments by one DAC value the Equalizer DAC 410 output signal to add equalization gain to output waveform 335. The invention then proceeds to step 1450.

If in step 1435 the sum of the overshoot 1100/HIGH-PEAK(REGION A) signal crossings and of the overshoot 1105/LOW-PEAK(REGION A) signal crossings is not less than three, then the invention proceeds to step 1460.

In step 1460 the invention determines if the overshoot 1100/HIGH-PEAK(REGION A) signal crossing count is greater than four (programmable value A), and if the overshoot 1105/LOW-PEAK(REGION A) signal crossing count is greater than A=4. If not, then output waveform 335 may have a DC shift in common mode level 1000, and the invention proceeds to step 1450. If in step 1460 the overshoot 1100/HIGH-PEAK(REGION A) signal crossing count is greater than four (programmable value A), and if the overshoot 1105/LOW-PEAK(REGION A) signal crossing count is greater than A=4, then output waveform 335 is overequalized and the invention proceeds to step 1470.

In step 1470 if the invention is in the Adaptive Equalizer Training Mode, then this mode is terminated since output waveform 335 is overequalized. If the Adaptive Equalizer Training Mode has terminated, then Equalizer DAC Counter 905 (FIG. 12) decrements by one DAC value the equalizer DAC 410 output signal to reduce overequalization of output waveform 335. The invention proceeds to step 1450, whether the invention is in Adaptive Equalizer Training Mode or has terminated Adaptive Equalizer Training Mode.

Operation Of The Invention: Baseline Wander Compensation Mode Overview

While the Adaptive Equalization Mode is operating, the invention will initialize Baseline Wander Mode on a pulse (high pulse 335H or low pulse 335L) which has a width of at least K. Typically, K is set to at least twenty (20) bit times (i.e., 160 nanoseconds), wherein each bit time is about 8.0 nanoseconds.

Referring to BLW Control Block 570 (FIG. 13), the pulse width measurement circuit 970 measures the pulse width and the comparator 972 determines whether the pulse width is at least K=160 nanoseconds. BLW Control Block 570 initializes Baseline Wander (BLW) Mode and controls BLW DAC 417.

If the pulse width is at least K=160 ns, then the comparator 972 (FIG. 13) outputs a signal to trigger the SR flip-flop 974 (FIG. 13) to initiate the Baseline Wander Mode. The SR flip-flop 974 will output the BLW MODE boolean signal to the reset (R) terminal of BLW DAC counter 953 (FIG. 13) thus releasing the reset (R) on BLW DAC counter 953 and allowing it to change at the initiation of the Baseline Wander Mode. BLW DAC counter 953 has a "sign bit" on bus 413 which allows the output to represent a negative number. The sign bit commands BLW DAC 417 to correct for situations where baseline wander causes pulses 335 to drift in the direction away from common mode 1000 or in the direction towards common mode 1000. The initiation of Baseline Wander Mode and the setting of BLW MODE to TRUE corresponds to step 3008 in FIG. 30A.

When the Baseline Wander Mode initiates, Equalizer DAC 410 (FIG. 5), HIGH PEAK DAC 450 (FIG. 6A), and LOW PEAK DAC 470 (FIG. 6A) are frozen in their current state. Thus, during Baseline Wander Mode, equalization gain changes will not occur because Adaptive Equalization Mode parameters are frozen. The HIGH PEAK and LOW PEAK signals will not increment or decrement, and will thus remain at fixed voltage levels used for determining whether a pulse has shifted upward away from baseline or has shifted downward away from baseline. If a high pulse 335H crosses the fixed HIGH PEAK level, then baseline wander has caused the entire waveform to shift upward (i.e., common mode 1000, 335H, and 335L have all drifted upward because the baseline has drifted upward). If a LOW PULSE 335L crosses the fixed LOW PEAK level, the baseline wander has caused the entire waveform to shift downward.

When the Baseline Wander Mode terminates, the BLW MODE boolean signal changes. BLW MODE allows Equalizer DAC 410 (FIG. 5), HIGH PEAK DAC 450 (FIG. 6A), and LOW PEAK DAC 470 (FIG. 6A) to continue operations and are thus removed from their previously frozen state.

BLW MODE also resets High Pulse Counter 660 (FIG. 10), High Peak Counter 665 (FIG. 10), Low Pulse Counter 760 (FIG. 11), and Low Peak Hit Counter 765 (FIG. 11). This is done so that statistics can not be gathered to change the peak and equalizer DACs.

After the Baseline Wander Mode is initiated by a 160 ns pulse, baseline wander compensation is performed depending on which class each pulse falls into. These three classes are: short pulses (less than or equal to 8 ns), medium pulses (greater than 8 ns and less than or equal to 16 ns), and wide pulses (greater than 16 ns). Baseline wander is corrected using circuit logic triggered by each class of pulse.

An alternate way to initialize Baseline Wander Mode is by using a thirty (30) bit wide shift register to detect the ratio of high pulses to low pulses. For every bit time (8 ns) that SLICER HIGH is HIGH (signaling a high MLT-3 pulse), a "1" is shifted into the shift register. For every bit time that SLICER LOW is HIGH (signaling a low MLT-3 pulse), a "0" is shifted into the shift register. If neither SLICER HIGH nor SLICER LOW is HIGH, the shift register is not changed. When all the bits in the shift register are added together, the count gives the number of 1's in the shift register. This count is the ratio of high MLT-3 pulses to low MLT-3 pulses (i.e., the ratio of high pulses 335H to low pulses 335L). For example, if the count is eighteen (18), the MLT-3 signal was HIGH for 18 bit times and LOW for 12 bit times during the last 30 times that the MLT-3 signal was not at mid-level (0 V). Using heuristic techniques, system 300 could go into baseline wander if the count is larger than 20 or less than 10. Empirically selected, a ratio of 2:1 (preferred value) would start Baseline Wander Mode.

Operation of the Invention: Baseline Wander Compensation for a Short Pulse

When the signal SHORT HIGH PULSE is HIGH, a high pulse less than or equal to 8 ns has been detected by Synchronizer/Region Definer 550 (FIG. 9). If baseline wander has occurred, the peak of a short high pulse 335H will either cross the HIGH PEAK signal or shift in the other direction, making a gap between the peak of the pulse and HIGH PEAK.

FIG. 25 shows a short low pulse 335SH(BLW) with a shift in the direction of arrow 1500 as a result of baseline wander. When a crossing has occurred, as shown in FIG. 25, this crossing is detected by the signal HOVS which originates from Synchronizer/Region Definer 550 (FIG. 9). Because short high pulse 335SH is less than or equal to 8 ns, HOVS is used because the invention only needs to look at Region A.

Referring to the BLW Control Block 570 (FIG. 13), when HOVS and SHORT HIGH PULSE are both HIGH, AND gate 930 outputs a HIGH result. The HIGH result from AND gate 930 causes OR gate 928 to output a HIGH result. The HIGH result from OR gate 928 causes OR gate 952 to output a HIGH result. The HIGH result from OR gate 952 decrements BLW DAC counter 953.

Decrementing counter 953 has the effect of shifting waveform 335SH(BLW) in the direction of arrow 1550. When counter 953 is decremented enough, 1505 of 335SH(BLW) will no longer cross HIGH PEAK. Thus, the BLW DAC 417 (FIGS. 5 and 13) decreases its output such that the short high pulse 335SH(BLW) shifts in the direction of arrow 1550. As best shown in FIG. 26, this shift in the direction of arrow 1550 moves the short high pulse 335SH(BLW) below the HIGH PEAK signal, thereby compensating for the baseline wander occurrence.

Similarly, during Baseline Wander Mode, if peak 1505 of 335SH(BLW) is below the HIGH PEAK level (this case not shown in the figures), then the invention changes the output of BLW DAC 417 to correct the wander. The short high pulse 335SH(BLW) moves in the direction of arrow 1500 when baseline wander compensation is performed.

When the signal SHORT HIGH PULSE is HIGH, a short pulse less than or equal to 8 ns has been detected by Synchronizer/Region Definer 550. When peak 1505 falls below HIGH PEAK, this gap is detected by the signal HOVS which originates from Synchronizer/Region Definer 550 (FIG. 9).

Referring to BLW Control Block 570 (FIG. 13), when HOVS is LOW and SHORT HIGH PULSE is HIGH, AND gate 921 outputs a HIGH result. The HIGH result from AND gate 921 causes OR gate 920 to output a HIGH result. The HIGH result from OR gate 920 causes OR gate 954 to output a HIGH result. The HIGH result from OR gate 954 increments BLW DAC counter 953.

Incrementing counter 953 has the effect of bringing waveform 335SH(BLW) in the direction of arrow 1500. When counter 953 is incremented enough, 1505 will no longer be below HIGH PEAK. Thus, the BLW DAC 417 (FIGS. 5 and 13) increases its output such that the short high pulse 335SH(BLW) shifts in the direction of arrow 1500. As best shown in FIG. 26, this shift in the direction of arrow 1500 moves the short high pulse 335SH(BLW) up to the HIGH PEAK signal, thereby compensating for the baseline wander occurrence.

When the signal SHORT LOW PULSE is HIGH, a low pulse less than or equal to 8 ns has been detected by Synchronizer/Region Definer 550. If baseline wander has occurred, the peak of a short low pulse 335SL(BLW) will either cross the LOW PEAK signal or shift in the other direction, making a gap between the peak of the pulse and LOW PEAK.

FIG. 27 shows a short low pulse 335SL(BLW) with a shift in the direction of arrow 1600 as a result of baseline wander. When a crossing has occurred, this is detected by the signal LOVS which originates from Synchronizer/Region Definer 550 (FIG. 9). Because short low pulse 335SL is less than or equal to 8 ns, LOVS is used because the invention only needs to look at Region A.

Referring to BLW Control Block 570 (FIG. 13), when LOVS and SHORT LOW PULSE are both HIGH, AND gate 946 outputs a HIGH result. The HIGH result from AND gate 946 causes OR gate 944 to output a HIGH result. The HIGH result from OR gate 944 causes OR gate 954 to output a HIGH result. The HIGH result from OR gate 954 increments BLW DAC counter 953.

Incrementing counter 953 has the effect of shifting waveform 335SL(BLW) in the direction of arrow 1650. When counter 953 is incremented enough, peak 1605 of 335SL(BLW) will no longer cross LOW PEAK. Thus, the BLW DAC 417 (FIGS. 5 and 13) increases its output such that the short low pulse 335SL(BLW) shifts in the direction of arrow 1650. As best shown in FIG. 28, this shift (in the direction of arrow 1650) moves the short low pulse 335SL(BLW) away from the LOW PEAK signal, thereby compensating for the baseline wander occurrence.

Similarly, during Baseline Wander Mode, if there is a gap between peak 1605 of 335SL(BLW) and the LOW PEAK signal (this case not shown in the figures), then the invention changes the output of BLW DAC 417 to correct the wander. The short low pulse 335SL(BLW) moves in the direction of arrow 1600 when baseline wander compensation is performed.

If baseline wander has occurred, a short low pulse 335SL(BLW) will have a gap between peak 1605 and LOW PEAK. This gap is detected by the signal LOVS which originates from Synchronizer/Region Definer 550 (FIG. 9). Because short low pulse 335SL is less than or equal to 8 ns, LOVS is used because the invention only needs to look at Region A.

When LOVS is LOW and SHORT LOW PULSE is HIGH, AND gate 945 outputs a HIGH result. The HIGH result from AND gate 945 causes OR gate 936 to output a HIGH result. The HIGH result from OR gate 936 causes OR gate 952 to output a HIGH result. The HIGH result from OR gate 952 decrements BLW DAC counter 953.

Decrementing counter 953 has the effect of shifting 335SL(BLW) in the direction of arrow 1600. When counter 953 is decremented enough, 1605 will no longer be below LOW PEAK. Thus, the BLW DAC 417 (FIGS. 5 and 13) decreases its output such that the short low pulse 335SL(BLW) shifts in the direction of arrow 1600. As best shown in FIG. 28, this shift (in the direction of arrow 1600) moves the short low pulse 335SL(BLW) towards LOW PEAK, thereby compensating for the baseline wander occurrence.

Operation of the Invention: Baseline Wander Compensation for a Medium Pulse

The description of how baseline wander compensation is done for a medium pulse is similar to the description supra for a short pulse. When the signal MEDIUM HIGH PULSE is HIGH, a medium high pulse greater than 8 ns and less than or equal to 16 ns has been detected by Synchronizer/Region Definer 550 (FIG. 9). If baseline wander has occurred, the peak of a medium high pulse will either cross the HIGH PEAK signal or shift in the other direction, making a gap between the peak of the pulse and HIGH PEAK.

In the case when the peak of a medium high pulse crosses HIGH PEAK, this crossing is detected by the signal HIGH PEAK HIT HF on line 362, which originates from Compound Comparator 426 (FIG. 6A). Referring to BLW Control Block 570 (FIG. 13), when HIGH PEAK HIT HF and MEDIUM HIGH PULSE are both HIGH, AND gate 931 outputs a HIGH result. The HIGH result from AND gate 931 causes OR gate 928 to output a HIGH result. The HIGH result from OR gate 928 causes OR gate 952 to output a HIGH result. The HIGH result from OR gate 952 decrements BLW DAC counter 953.

Decrementing counter 953 has the effect of shifting the waveform containing medium high pulse away from HIGH PEAK in the direction of the common mode. When counter 953 is decremented enough, a medium high pulse will no longer cross HIGH PEAK. Thus, the BLW DAC 417 (FIGS. 5 and 13) decreases its output such that the medium high pulse waveform shifts away from HIGH PEAK, thereby compensating for the baseline wander occurrence.

Similarly, during Baseline Wander Mode, if the peak of a medium high pulse is below the HIGH PEAK level, then the invention changes the output of BLW DAC 417 to correct the wander. In this case, baseline wander compensation causes the medium high pulse waveform to move towards HIGH PEAK.

When the signal MEDIUM HIGH PULSE is HIGH, a medium high pulse greater than or equal to 8 ns and less than or equal to 16 ns has been detected by Synchronizer/Region Definer 550. When the peak of a medium high pulse falls below HIGH PEAK, this gap is detected by the signal HIGH PEAK HIT HF which originates from Synchronizer/Region Definer 550 (FIG. 9). Referring to BLW Control Block 570 (FIG. 13), when HIGH PEAK HIT HF is LOW and MEDIUM HIGH PULSE is HIGH, AND gate 922 outputs a HIGH result. The HIGH result from AND gate 922 causes OR gate 920 to output a HIGH result. The HIGH result from OR gate 920 causes OR gate 954 to output a HIGH result. The HIGH result from OR gate 954 increments BLW DAC counter 953.

Incrementing counter 953 has the effect of shifting a waveform containing medium high pulse in the direction of HIGH PEAK. When counter 953 is incremented enough, medium high pulse will no longer be below HIGH PEAK. Thus, the BLW DAC 417 (FIGS. 5 and 13) increases its output such that the medium high pulse shifts in the direction HIGH PULSE, thereby compensating for the baseline wander occurrence.

When the signal MEDIUM LOW PULSE is HIGH, a low pulse greater than 8 ns and less than or equal to 16 ns has been detected by Synchronizer/Region Definer 550. If baseline wander has occurred, the peak of a medium low pulse will either cross the LOW PEAK signal or shift in the other direction, making a gap between the peak of the pulse and LOW PEAK.

When the peak of a medium low pulse crosses LOW PEAK, this crossing is detected by the signal LOW PEAK HIT HF on line 372, which originates from Compound Comparator 440 (FIG. 6A). Referring to BLW Control Block 570 (FIG. 13), when LOW PEAK HIT HF and MEDIUM LOW PULSE are both HIGH, AND gate 939 outputs a HIGH result. The HIGH result from AND gate 939 causes OR gate 944 to output a HIGH result. The HIGH result from OR gate 944 causes OR gate 954 to output a HIGH result. The HIGH result from OR gate 954 increments BLW DAC counter 953.

Incrementing counter 953 has the effect of shifting the waveform away from LOW PEAK in the direction of the common mode. When counter 953 is incremented enough, the medium low pulse will no longer cross LOW PEAK. Thus, the BLW DAC 417 (FIGS. 5 and 13) increases its output such that the medium low pulse waveform shifts away from LOW PEAK, thereby compensating for the baseline wander occurrence.

Similarly, during Baseline Wander Mode, if there is a gap between the peak of a medium low pulse and the LOW PEAK level, then the invention changes the output of BLW DAC 417 to correct the wander. The medium low pulse waveform moves in the direction of LOW PEAK when baseline wander compensation is performed.

When the signal MEDIUM LOW PULSE is HIGH, a short pulse less than or equal to 8 ns has been detected by Synchronizer/Region Definer 550. When the peak of a medium high pulse falls below LOW PEAK, this gap is detected by the signal LOW PEAK HIT HF which originates from Synchronizer/Region Definer 550 (FIG. 9). Referring to BLW Control Block 570 (FIG. 13), when LOW PEAK HIT HF is LOW and MEDIUM LOW PULSE is HIGH, AND gate 938 outputs a HIGH result. The HIGH result from AND gate 938 causes OR gate 936 to output a HIGH result. The HIGH result from OR gate 936 causes OR gate 952 to output a HIGH result. The HIGH result from OR gate 952 decrements BLW DAC counter 953.

Decrementing counter 953 has the effect of shifting a waveform containing medium high pulse in the direction of LOW PULSE. When counter 953 is decremented enough, there will no longer be a gap between the medium low pulse and LOW PEAK. Thus, the BLW DAC 417 (FIGS. 5 and 13) decreases its output such that the medium low pulse shifts in the direction LOW PEAK, thereby compensating for the baseline wander occurrence.

Operation of the Invention: Baseline Wander Compensation for a Wide Pulse

Figure 29:
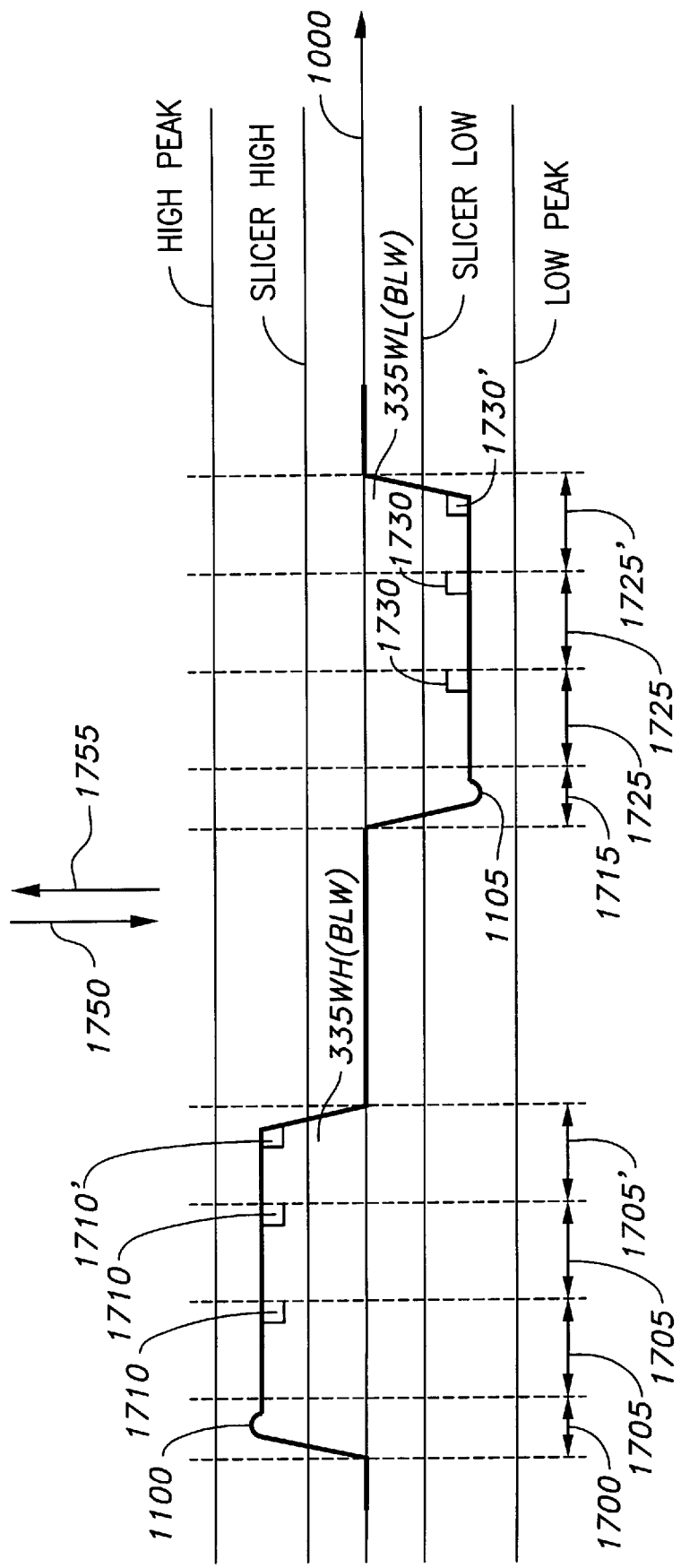
FIG. 29 is a data waveform with a wide high pulse and a wide low pulse.

FIG. 29 shows a method for baseline wander compensation when the waveform contains wide high pulses 335WH (BLW) and wide low pulses 335WL(BLW). For a wide high pulse 335WH(BLW), the first and second bit time (window 1700) is not evaluated for a crossing across the HIGH PEAK signal, since a high overshoot 1100 may be present. Referring to BLW Control Block 570 (FIG. 13), this crossing is signaled by HIGH PEAK HIT HF on line 362, which originates from Compound Comparator 426 (FIG. 6A). The invention ignores REGION A and REGION B for a wide pulse because overshoot 1100 on the leading rising edge is more pronounced for wide pulses. Overshoot 1100 crosses HIGH PEAK by design by 20 millivolts when the common mode 1000 is correctly located between HIGH PEAK and LOW PEAK.

FIG. 29 shows a method for dividing the wide high pulse 335WH(BLW) into windows 1705 each having a programmable time length of M=32 ns (preferred value). Referring to BLW Control Block 570 (FIG. 13), this sampling is done by Pulse Generator 964 and the SLICER HIGH signal on line 366. SLICER HIGH originates from Comparator 430 (FIG. 6A) and indicates the presence of a high pulse. Pulse Generator 964 generates a pulse every M=32ns while SLICER HIGH is HIGH.

Baseline wander compensation is performed at the end of each 32 ns region (M=32 ns) of 335WH(BLW), i.e., window 1705. FIG. 29 shows the last 8 ns of each region 1705 as represented by region 1710. Referring to BLW Control Block 570 (FIG. 13), when END OF WIDE HIGH PULSE is received from Synchronizer/Region Definer 550, baseline wander compensation is performed for the last 8 ns of 1705', i.e. region 1710'.

Similarly, FIG. 29 shows that for a wide low pulse 335WL(BLW), the first bit time (window 1715) is not evaluated for a crossing across the LOW PEAK signal, since a low overshoot 1105 may be present. Referring to BLW Control Block 570 (FIG. 13), this crossing is signaled by LOW PEAK HIT LF on line 372, which originates from Compound Comparator 440 (FIG. 6A).

FIG. 29 shows the wide low pulse 335WL(BLW) divided into windows 1725 each having a programmable time length of M=32 ns (preferred value). Referring to BLW Control Block 570 (FIG. 13), this sampling is done by Pulse Generator 966 and the SLICER LOW signal on line 368. SLICER LOW originates from Comparator 435 (FIG. 6A) and indicates the presence of a low pulse. Pulse Generator 966 generates a pulse every M=32 ns while SLICER LOW is HIGH.

Baseline wander compensation is performed for each 32 ns region of 335WL(BLW), i.e., window 1725. FIG. 29 shows the last 8 ns of each region 1725, represented by region 1730. Referring to BLW Control Block 570 (FIG. 13), when END OF WIDE HIGH PULSE is received from Synchronizer/Region Definer 550, baseline wander compensation is performed for the last 8 ns of 1725', i.e. region 1730'.

Baseline wander compensation for a wide high pulse 335WH(BLW) is done at 32 ns intervals performed by determining whether regions 1710 cross the HIGH PEAK. If region 1710 crosses the HIGH PEAK signal, then the BLW DAC 417 decreases its output so that the wide high pulse 335WH(BLW) moves in the direction of arrow 1750, towards common mode level 1000.

Referring to BLW Control Block 570 (FIG. 13), if a high pulse is present, then SLICER HIGH will be HIGH. If this high pulse is a wide high pulse 335WH (i.e., capable of being sampled at 32 ns intervals), then Pulse Generator 964 will output a HIGH value. If region 1710 crosses HIGH PEAK, then HIGH PEAK HIT LF will be HIGH. These HIGH results cause AND gate 932 to output a HIGH result. The HIGH result from And 932 causes OR gate 928 to output a HIGH result. The HIGH result from OR gate 928 causes OR gate 952 to output a HIGH result. The HIGH result from OR gate 952 decrements BLW DAC counter 953.

Decrementing counter 953 has the effect of shifting waveform 335WH(BLW) in the direction of arrow 1750. When counter 953 is decremented enough, 1705 of 335WH (BLW) will no longer cross HIGH PEAK. Thus, the BLW DAC 417 (FIGS. 5 and 13) decreases its output such that the wide high pulse 335WH(BLW) shifts in the direction of arrow 1750, thereby compensating for the baseline wander occurrence.

If the region 1710 does not cross the HIGH PEAK signal, then the BLW DAC 417 increases its output so that the wide high pulse 335WH(BLW) moves in the direction of arrow 1755, away from common mode level 1000.

Referring to BLW Control Block 570 (FIG. 13), if a high pulse is present, then SLICER HIGH will be HIGH. If this high pulse is a wide high pulse 335WH (i.e., capable of being sampled at 32 ns intervals), then Pulse Generator 964 will output a HIGH value. If region 1710 does not cross HIGH PEAK, then HIGH PEAK HIT LF will be LOW. These results cause AND gate 924 to output a HIGH result. The HIGH result from And 924 causes OR gate 920 to output a HIGH result. The HIGH result from OR gate 920 causes OR gate 954 to output a HIGH result. The HIGH result from OR gate 954 increments BLW DAC counter 953.

Incrementing counter 953 has the effect of shifting waveform 335WH(BLW) in the direction of arrow 1755. When counter 953 is incremented enough, 1705 of 335WH(BLW) will meet HIGH PEAK. Thus, the BLW DAC 417 (FIGS. 5 and 13) increases its output such that the wide high pulse 335WH(BLW) shifts in the direction of arrow 1755, thereby compensating for the baseline wander occurrence.

Baseline wander is also compensated for in the last region. If the last 8 ns of region 1705' (i.e., region 1710') crosses the HIGH PEAK signal, then the BLW DAC 417 decreases its output so that the wide high pulse 335WH (BLW) is shifted in the direction of arrow 1750, towards common mode level 1000.

Referring to BLW Control Block 570 (FIG. 13), if the end of a wide high pulse occurs, then END OF WIDE HIGH PULSE will be HIGH. If region 1710' crosses HIGH PEAK, then HIGH PEAK HIT LF will be HIGH. These HIGH results cause AND gate 934 to output a HIGH result. The HIGH result from And 934 causes OR gate 928 to output a HIGH result. The HIGH result from OR gate 928 causes OR gate 952 to output a HIGH result. The HIGH result from OR gate 952 decrements BLW DAC counter 953.

Decrementing counter 953 has the effect of shifting waveform 335WH(BLW) in the direction of arrow 1750. When counter 953 is decremented enough, 1710' of 335WH (BLW) will no longer cross HIGH PEAK. Thus, the BLW DAC 417 (FIGS. 5 and 13) decreases its output such that the wide high pulse 335WH(BLW) shifts in the direction of arrow 1750, thereby compensating for the baseline wander occurrence.

If last region 1710' does not cross the HIGH PEAK signal, then the BLW DAC 417 increases its output so that the wide high pulse 335WH(BLW) is shifted in the direction of arrow 1755, away from common mode level 1000.

Referring to BLW Control Block 570 (FIG. 13), if the end of a wide high pulse occurs, then END OF WIDE HIGH PULSE will be HIGH. If region 1710' does not cross HIGH PEAK, then HIGH PEAK HIT LF will be LOW. These results cause AND gate 926 to output a HIGH result. The HIGH result from And 926 causes OR gate 920 to output a HIGH result. The HIGH result from OR gate 920 causes OR gate 954 to output a HIGH result. The HIGH result from OR gate 954 increments BLW DAC counter 953.

Incrementing counter 953 has the effect of shifting waveform 335WH(BLW) in the direction of arrow 1755. When counter 953 is incremented enough, 1710' of 335WH(BLW) will meet HIGH PEAK. Thus, the BLW DAC 417 (FIGS. 5 and 13) increases its output such that the wide high pulse 335WH(BLW) shifts in the direction of arrow 1755, thereby compensating for the baseline wander occurrence.

Baseline wander compensation for a wide low pulse 335WL(BLW) is done at 32 ns intervals performed by determining whether regions 1725 cross the LOW PEAK. If region 1725 crosses the LOW PEAK signal, then the BLW DAC 417 increases its output so that the wide low pulse 335WL(BLW) moves in the direction of arrow 1755, towards common mode level 1000.

Referring to BLW Control Block 570 (FIG. 13), if a low pulse is present, then SLICER LOW will be HIGH. If this low pulse is a wide low pulse 335WL (i.e., capable of being sampled at 32 ns intervals), then Pulse Generator 966 will output a HIGH value. If region 1725 crosses LOW PEAK, then LOW PEAK HIT LF will be HIGH. These HIGH results cause AND gate 948 to output a HIGH result. The HIGH result from And 948 causes OR gate 944 to output a HIGH result. The HIGH result from OR gate 944 causes OR gate 954 to output a HIGH result. The HIGH result from OR gate 954 increments BLW DAC counter 953.

Incrementing counter 953 has the effect of shifting waveform 335WL(BLW) in the direction of arrow 1755. When counter 953 is incremented enough, 1725 of 335WL(BLW) will no longer cross LOW PEAK. Thus, the BLW DAC 417 (FIGS. 5 and 13) increases its output such that the wide low pulse 335WL(BLW) shifts in the direction of arrow 1755, thereby compensating for the baseline wander occurrence.

If the region 1725 does not cross the LOW PEAK signal, then the BLW DAC 417 decreases its output so that the wide high pulse 335WH(BLW) moves in the direction of arrow 1750, away from common mode level 1000.

Referring to BLW Control Block 570 (FIG. 13), if a low pulse is present, then SLICER LOW will be HIGH. If this low pulse is a wide low pulse 335WL (i.e., capable of being sampled at 32 ns intervals), then Pulse Generator 966 will output a HIGH value. If region 1725 does not cross LOW PEAK, then LOW PEAK HIT LF will be LOW. These results cause AND gate 940 to output a HIGH result. The HIGH result from And 940 causes OR gate 936 to output a HIGH result. The HIGH result from OR gate 936 causes OR gate 952 to output a HIGH result. The HIGH result from OR gate 952 decrements BLW DAC counter 953.

Decrementing counter 953 has the effect of shifting waveform 335WL(BLW) in the direction of arrow 1750. When counter 953 is decremented enough, 1725 of 335WL (BLW) will meet LOW PEAK. Thus, the BLW DAC 417 (FIGS. 5 and 13) decreases its output such that the wide low pulse 335WL(BLW) shifts in the direction of arrow 1750, thereby compensating for the baseline wander occurrence.

Baseline wander is also compensated for in the last region. If the last 8 ns of region 1725' (i.e., region 1730') crosses the LOW PEAK signal, then the BLW DAC 417 increases its output so that the wide low pulse 335WL(BLW) is shifted in the direction of arrow 1755, towards common mode level 1000.

Referring to BLW Control Block 570 (FIG. 13), if the end of a wide low pulse occurs, then END OF WIDE LOW PULSE will be HIGH. If region 1730' crosses LOW PEAK, then LOW PEAK HIT LF will be HIGH. These HIGH results cause AND gate 950 to output a HIGH result. The HIGH result from And 950 causes OR gate 944 to output a HIGH result. The HIGH result from OR gate 944 causes OR gate 954 to output a HIGH result. The HIGH result from OR gate 954 increments BLW DAC counter 953.

Incrementing counter 953 has the effect of shifting waveform 335WL(BLW) in the direction of arrow 1755. When counter 953 is incremented enough, 1730' of 335WL(BLW) will no longer cross LOW PEAK. Thus, the BLW DAC 417 (FIGS. 5 and 13) increases its output such that the wide low pulse 335WL(BLW) shifts in the direction of arrow 1755, thereby compensating for the baseline wander occurrence.

If last region 1730' does not cross the LOW PEAK signal, then the BLW DAC 417 decreases its output so that the wide low pulse 335WL(BLW) is shifted in the direction of arrow 1750, away from common mode level 1000.

Referring to BLW Control Block 570 (FIG. 13), if the end of a wide low pulse occurs, then END OF WIDE LOW PULSE will be HIGH. If region 1730' does not cross LOW PEAK, then LOW PEAK HIT LF will be LOW. These results cause AND gate 942 to output a HIGH result. The HIGH result from And 942 causes OR gate 936 to output a HIGH result. The HIGH result from OR gate 936 causes OR gate 952 to output a HIGH result. The HIGH result from OR gate 952 decrements BLW DAC counter 953.

Decrementing counter 953 has the effect of shifting waveform 335WL(BLW) in the direction of arrow 1750. When counter 953 is decremented enough, 1730' of 335WL (BLW) will meet LOW PEAK. Thus, the BLW DAC 417 (FIGS. 5 and 13) decreases its output such that the wide low pulse 335WL(BLW) shifts in the direction of arrow 1750, thereby compensating for the baseline wander occurrence.

Figure 30C:
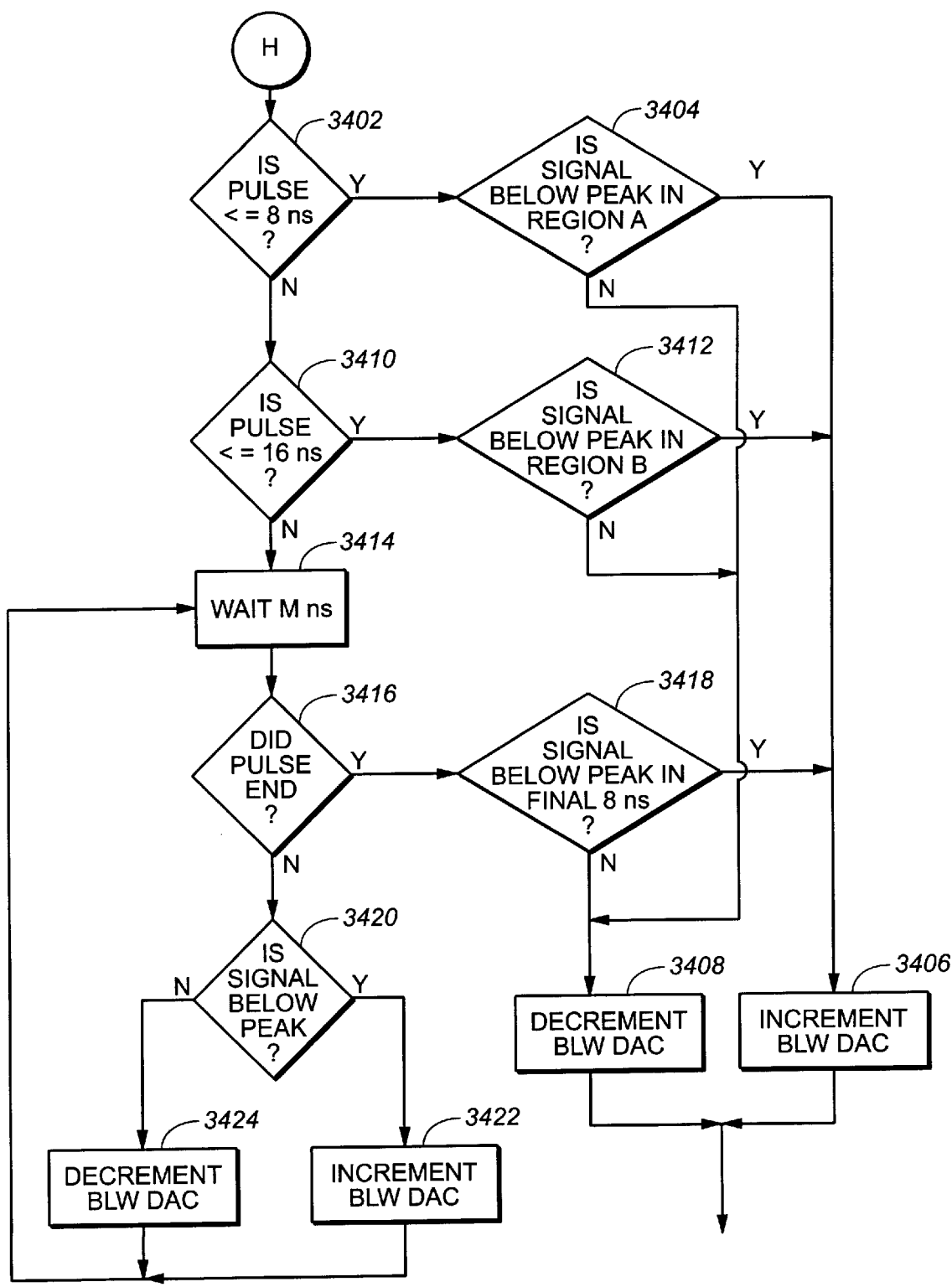
Figure 30D:
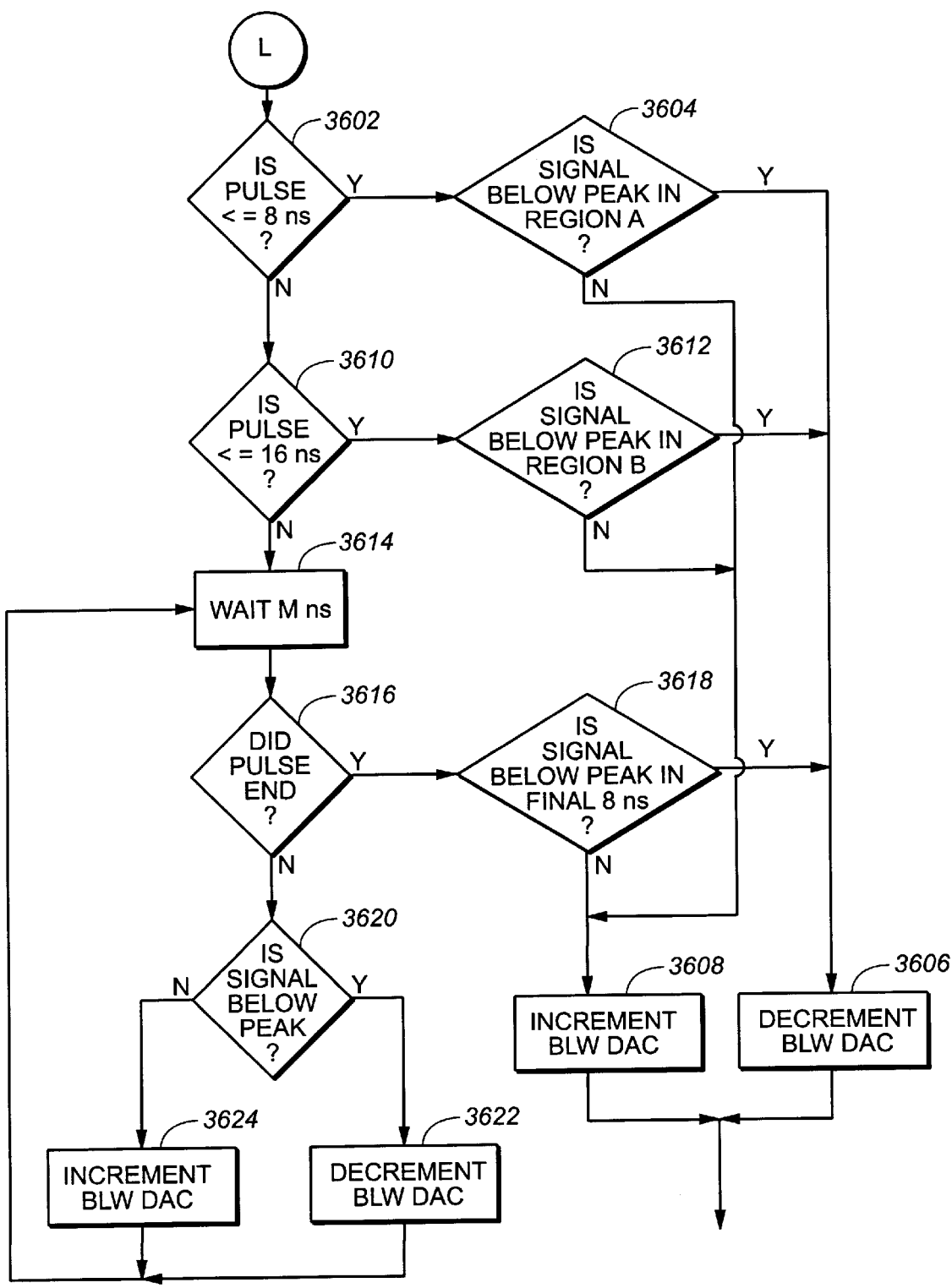

FIGS. 30A, 30B, 30C, and 30D are flowcharts illustrating steps in a method for implementing a compensation for baseline wander for output waveform 335 of the invention, according to a preferred embodiment. FIGS. 30A and 30B correspond to step 1510 in FIG. 14, identifying a baseline wander problem. FIGS. 30C and 30D correspond to step 1512 in FIG. 14 for entering Baseline Wander Mode, a mode where compensations are made to the waveform.

FIG. 30A is a flowchart showing a method for determining whether baseline wander is a problem and, if so, compensating for baseline wander. The method begins in step 3002 where BLW DAC 417 is initialized to zero. In step 3004 the method checks to see if system 300 is in training mode. If system 300 is training (i.e., Equalizer Training Mode or Peak Training Mode), then baseline wander is not checked. If system 300 is not training, then the method proceeds to step 3006 where the method waits for a high or low pulse of waveform 335.

In step 3008 the method checks to see if a long pulse is in the data stream. If the width is not greater than 20 bit times (i.e., K=20 bit times in the preferred embodiment which is 160 nanoseconds), the method waits to check the next pulse. If the width is greater than 20 bit times, the method proceeds to step 3010 where the "BLW MODE" boolean is set to TRUE (one). Additionally, peak adjustment and equalization is frozen until the method completes baseline wander compensation (see FIG. 14).

After setting the BLW MODE boolean, the method proceeds to step 3012, where a decision is made whether the pulse is high or low. If the pulse is high, the method proceeds according to FIG. 30C. FIG. 30C shows a method for compensating for baseline wander when a high pulse is present. If the pulse is low, the method proceeds according to FIG. 30D. FIG. 30D shows a method for compensating for baseline wander when a low pulse is present.

The method proceeds to step 3018 where a decision is made whether to stop compensating for baseline wander. The decision to stop compensating for baseline wander is made according to the method shown in FIG. 30B. If a decision is made to continue compensating for baseline wander, the method proceeds to step 3020. The method continues compensating for baseline wander when "STOP" is NO. In step 3020 the method waits for another high or low pulse and then goes back up to step 3012. If a decision is made to stop compensating for baseline wander BLW MODE is set to false (zero), and the method goes back up to step 3006. The method halts compensating for baseline wander when STOP is YES.

FIG. 30B is a flowchart showing a method for determining whether to stop compensating for baseline wander. In step 3202 the method begins by setting STOP to NO. In step 3204 the method checks whether BLW MODE is TRUE or FALSE, i.e., whether baseline wander compensations are being made. If BLW MODE is FALSE then the method goes back to step 3204 and checks BLW MODE again. If BLW MODE is TRUE then the method goes to step 3206 where the method waits two microseconds (i.e., J=2 microseconds in the preferred embodiment) for the method (described in FIG. 30C and 25D) to change the level of BLW DAC 417.

The method then decides in step 3208 whether the output of the BLW DAC 417 is less than 40 millivolts (i.e., L=40 millivolts in the preferred embodiment). If the output of the BLW DAC 417 is greater than or equal to 40 millivolts, baseline wander is still a problem, and the method goes back up to step 3206. Since BLW DAC 417 is still compensating for baseline wander, the purpose of going back to step 3206 is to keep STOP set to NO so that the compensation of baseline wander can continue. The method waits for two microseconds more before BLW DAC 417 is checked again. If the output of BLW DAC 417 is less than 40 millivolts, baseline wander is no longer a problem, and the method proceeds to step 3210.

In step 3210 the method waits for six microseconds (3 times J) for BLW DAC 417 to settle. The method then proceeds to step 3212 where STOP is set to YES so that the method can stop compensating for baseline wander (see FIG. 30A). The STOP variable terminates the operation of BLW Mode and resumes the operation of Adaptive Equalizer Mode (see FIG. 14).

In step 3214 the method waits for the BLW MODE boolean to be set to FALSE (see FIG. 30A). The method then proceeds back to step 3202 where STOP is reset to NO.

FIG. 30C is a flowchart showing a method for compensating for the baseline wander of a high pulse. The method begins in step 3402 where pulse width is determined. If the pulse width is less than or equal to eight nanoseconds (short high pulse), the method goes to step 3404. If the voltage of the short high pulse in REGION A is below $V_{HIGH\ PEAK}$ (see Equation 5), the method goes to step 3406, and system 300 increments BLW DAC 417 by one bit. While in BLW Mode, system 300 will no longer add 20 mV to $V_{HIGH\ PEAK}$ in REGION A to give $V_{HIGH\ PEAK}$ (REG. A) (see Equation 6). BLW DAC 417 is incremented because the baseline has drifted down, and system 300 needs to bring the baseline back up.

If the voltage of the high pulse in REGION A is above $V_{HIGH\ PEAK}$ (see Equation 5), the method goes to step 3408, and system 300 decrements BLW DAC 417 by one bit. BLW DAC 417 is decremented because the baseline has drifted up, and system 300 needs to bring the baseline back down. The method then proceeds according to FIG. 30A.

If the pulse width is greater than eight nanoseconds and less than or equal to sixteen nanoseconds (medium high pulse), the method proceeds to step 3410. If a medium high pulse is detected, the method proceeds to step 3412 where the voltage of the medium high pulse in REGION B is checked. If the medium high pulse is below $V_{HIGH\ PEAK}$ (see Equation 5), the method goes to step 3406, and system 300 increments BLW DAC 417 by one bit. If the voltage of the high pulse in REGION B is above $V_{HIGH\ PEAK}$ (see Equation 5), the method goes to step 3408, and system 300 decrements BLW DAC 417 by one bit. The method then proceeds according to FIG. 30A.

If the pulse width is greater than sixteen nanoseconds (wide high pulse), the method goes to step 3414. The method waits four clock cycles or thirty-two nanoseconds (i.e., M=32). The method then proceeds to step 3416 to determine if the wide high pulse ended. If the pulse ended during step 3416, the method proceeds to step 3418 where the voltage of the pulse in the final eight nanoseconds is checked. If the voltage of the high pulse is below $V_{HIGH\ PEAK}$ (see Equation 5), the method goes to step 3406, and system 300 increments BLW DAC 417 by one bit. If the voltage of the high pulse is above $V_{HIGH\ PEAK}$ (see Equation 5), the method goes to step 3408, and system 300 decrements BLW DAC 417 by one bit. The method then proceeds according to FIG. 30A.

If the pulse did not end during step 3416, the method proceeds to step 3420 where the voltage of the pulse is checked. If the voltage of the wide high pulse is below $V_{HIGH\ PEAK}$ (see Equation 5), the method goes to step 3422, and system 300 increments BLW DAC 417 by one bit. If the voltage of the wide high pulse is above $V_{HIGH\ PEAK}$ (see Equation 5), the method goes to step 3424, and system 300 decrements BLW DAC 417 by one bit. The method then proceeds back to step 3414 for another wait state.

FIG. 30D is a flowchart showing a method for compensating for the baseline wander of a low pulse. The method begins in step 3602 where pulse width is determined. If the pulse width is less than or equal to eight nanoseconds (short low pulse), the method goes to step 3604. If the voltage of the short low pulse in REGION A is below $V_{LOW\ PEAK}$ (see Equation 9), the method goes to step 3606, and system 300 decrements BLW DAC 417 by one bit. While in BLW Mode, system 300 will no longer add 20 mV to $V_{LOW\ PEAK}$ in REGION A to give $V_{LOW\ PEAK}$ (REG. A) (see Equation 10).

If the voltage of the short low pulse in REGION A is above $V_{LOW\ PEAK}$ (see Equation 9), the method goes to step 3608, and system 300 increments BLW DAC 417 by one bit. The method then proceeds according to FIG. 30A.

If the pulse width is greater than eight nanoseconds and less than or equal to sixteen nanoseconds (medium low pulse), the method proceeds to step 3610. If a medium low pulse is detected, the method proceeds to step 3612 where the voltage of the pulse in REGION B is checked. If the voltage of the medium low pulse in REGION B is below $V_{LOW\ PEAK}$ (see Equation 9), the method goes to step 3606, and system 300 decrements BLW DAC 417 by one bit. If the voltage of the low pulse in REGION B is above $V_{LOW\ PEAK}$ (see Equation 9), the method goes to step 3608, and system 300 increments BLW DAC 417 by one bit. The method then proceeds according to FIG. 30A.

If the pulse width is greater than sixteen nanoseconds (wide low pulse), the method goes to step 3614. The method waits four clock cycles or thirty-two nanoseconds (i.e., M=32). The method then proceeds to step 3616 to determine if the pulse ended. If the pulse ended during step 3616, the method proceeds to step 3618 where the voltage of the pulse in the final eight nanoseconds is checked. If the voltage of the low pulse is below $V_{LOW\ PEAK}$ (see Equation 5), the method goes to step 3606, and system 300 decrements BLW DAC 417 by one bit. If the voltage of the low pulse is above $V_{LOW\ PEAK}$ (see Equation 9), the method goes to step 3608, and system 300 increments BLW DAC 417 by one bit. The method then proceeds according to FIG. 30A.

If the pulse did not end during step 3616, the method proceeds to step 3620 where the voltage of the pulse is checked. If the voltage of the wide low pulse is below $V_{LOW\ PEAK}$ (see Equation 9), the method goes to step 3622, and system 300 decrements BLW DAC 417 by one bit. If the voltage of the low pulse is above $V_{LOW\ PEAK}$ (see Equation 9), the method goes to step 3624, and system 300 increments BLW DAC 417 by one bit. The method then proceeds back to step 3614 for another wait state.

The method for correcting baseline wander described above is summarized in the following four steps. Step one, if the peak voltage of a high pulse 335H is less than the voltage of the HIGH PEAK signal 335H, shift the waveform towards HIGH PEAK, away from the direction of common mode 1000. Step two, if the peak voltage of a high pulse 335H crosses the voltage of the HIGHPEAK signal, shift the waveform away from HIGH PEAK, in the direction of common mode 1000. Step three, if the peak voltage of a low pulse 335L is greater than the voltage of the LOW PEAK signal, shift the waveform towards LOW PEAK, away from the direction of common mode 1000. And, step four, if the peak voltage of a low pulse 335L crosses the voltage of the LOW PEAK signal, shift the waveform away from LOW PEAK, in the direction of common mode 1000.

Although the steps described above for correcting for baseline wander are implemented in the preferred embodiment, alternate embodiments may use subsets of the above four steps. For example, one embodiment may correct for baseline wander using steps two and four. Another embodiment may correct for baseline wander using steps one and three.

While various embodiments and applications of this invention have been shown and described, it will be apparent to those skilled in the art that modifications are possible without departing from the inventive concepts described herein. For example, all indicated programmable values may be varied for particular applications of the invention. The invention, therefore, is not to be restricted except in the spirit of the appended claims.

We claim:

1. A method for inspecting for baseline wander and compensating for baseline wander of a pulse, comprising the steps of:
   (a) after training mode has terminated, check the width of the pulse;
   (b) if the width of the pulse is greater than a predetermined value, initiate baseline wander mode and begin compensating for baseline wander;
   (c) freeze peak adjustment algorithm and equalization adjustment algorithm;
   (d) if the peak voltage of the high pulse is less than the voltage of a HIGH PEAK control signal, shift the waveform towards HIGH PEAK control signal, away from the direction of the common mode;
   (e) if the peak voltage of the high pulse crosses the voltage of a HIGH PEAK control signal, shift the waveform away from HIGH PEAK control signal, in the direction of the common mode;
   (f) if the peak voltage of the low pulse is greater than the voltage of a LOW PEAK control signal, shift the waveform towards LOW PEAK control signal, away from the direction of the common mode; and
   (g) if the peak voltage of the low pulse crosses the voltage of a LOW PEAK control signal, shift the waveform away from LOW PEAK control signal, in the direction of the common mode.

2. A method for inspecting for baseline wander and compensating for baseline wander, comprising the steps of:
   (a) after training mode has terminated, check the width of a pulse;
   (b) if the width of the pulse is greater than a predetermined value, initiate baseline wander mode and begin compensating for baseline wander;
   (c) freeze peak adjustment algorithm and equalization adjustment algorithm;
   (d) if the peak voltage of the high pulse crosses the voltage of a HIGH PEAK control signal, shift the waveform away from HIGH PEAK control, in the direction of the common mode; and
   (e) if the peak voltage of a low pulse crosses the voltage of the LOW PEAK control signal, shift the waveform away from LOW PEAK control signal, in the direction of the common mode.

3. A method for inspecting for baseline wander and compensating for baseline wander, comprising the steps of:
   (a) after training mode has terminated, check the width of a pulse;
   (b) if the width of the pulse is greater than a predetermined value, initiate baseline wander mode and begin compensating for baseline wander;
   (c) freeze peak adjustment algorithm and equalization adjustment algorithm;
   (d) if the peak voltage of the high pulse is less than the voltage of a HIGH PEAK control signal, shift the waveform towards HIGH PEAK control signal, away from the direction of the common mode; and
   (e) if the peak voltage of the low pulse is greater than the voltage of a LOW PEAK control signal, shift the waveform towards LOW PEAK control signal, away from the direction of the common mode.

\* \* \* \* \*